(12) United States Patent
Nakashima et al.

(10) Patent No.: US 8,268,519 B2
(45) Date of Patent: *Sep. 18, 2012

(54) CURABLE COMPOSITION, COLOR FILTER, AND MANUFACTURING METHOD OF THE SAME

(75) Inventors: Taeko Nakashima, Kanagawa (JP); Kazuto Shimada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 564 days.

This patent is subject to a terminal disclaimer.

(21) Appl. No.: 12/519,762

(22) PCT Filed: Dec. 27, 2007

(86) PCT No.: PCT/JP2007/075402
§ 371 (c)(1), (2), (4) Date: Jun. 18, 2009

(87) PCT Pub. No.: WO2008/081988
PCT Pub. Date: Jul. 10, 2008

(65) Prior Publication Data
US 2010/0045905 A1    Feb. 25, 2010

(30) Foreign Application Priority Data
Dec. 28, 2006 (JP) ................. 2006-356376

(51) Int. Cl.
*G02B 5/20* (2006.01)
(52) U.S. Cl. .................... 430/7; 430/287.1
(58) Field of Classification Search .......... None
See application file for complete search history.

(56) References Cited

U.S. PATENT DOCUMENTS

| 5,800,952 A | * | 9/1998 | Urano et al. | 430/7 |
| 2003/0129504 A1 | * | 7/2003 | Wakata et al. | 430/5 |
| 2008/0020300 A1 | * | 1/2008 | Lee et al. | 430/7 |

FOREIGN PATENT DOCUMENTS

| EP | 1 571 469 A1 | 9/2005 |
| JP | 02-127602 A | 5/1990 |
| JP | 09-179296 A | 7/1997 |
| JP | 2000-321763 A | 11/2000 |
| JP | 2003-029018 A | 1/2003 |
| JP | 2006-30541 A | 2/2006 |

OTHER PUBLICATIONS

Recent Technological Trend in Color Filters (pp. 85-87, published by Johokiko Co., Ltd.) with English abstract.
Advanced Process Technologies and Chemicals for Color Filters (pp. 129-150, published by CMC Publishing, Ltd.) with English abstract.

* cited by examiner

*Primary Examiner* — John A. McPherson
(74) *Attorney, Agent, or Firm* — Solaris Intellectual Property Group PLLC

(57) ABSTRACT

A curable composition including (A) a compound which has a plurality of ethylenically unsaturated double bonds and secondary hydroxyl groups, (B) a photopolymerization initiator, and (C) a coloring agent, is used to provide a curable composition which exhibits excellent storage stability such as dispersion stability even in the case where a coloring agent is included at high concentration, highly sensitive curability by exposure, high adhesiveness to the surface of a hardening material in a curing region when applied in forming patterns on the surface of the hardening material, excellent uncured region removability, and excellent pattern formability; a color filter having colored patterns, which is formed by using the curable composition and has excellent resolution and adhesiveness to the support; and a manufacturing method of the coloring filter with high productivity.

9 Claims, No Drawings

CURABLE COMPOSITION, COLOR FILTER, AND MANUFACTURING METHOD OF THE SAME

TECHNICAL FIELD

The present invention relates to a curable composition which is ideal for preparing a color filter used for liquid crystal display devices (LCD), solid-state image pickup devices (such as CCD and CMOS), and the like, a color filter formed from the curable composition, and a manufacturing method of the color filter.

BACKGROUND ART

A color filter is an essential constitution unit in liquid crystal displays and solid-state image pickup devices.

Since a liquid crystal display is more compact and exhibits equivalent or better performance as compared to CRT which is widely used as a display device, the liquid crystal display has been increasingly used in place of CRT as a display device for a TV screen, a personal computer screen, and others. Further, in recent years, the trend of development in liquid displays has moved from a use in monitor with a relatively small screen which is demanded in the past to a use in TV with a large screen and high image quality.

As for the color filter for liquid crystal displays (LCD), a substrate is increased in its size in manufacturing a large TV. For a curable composition which is used in preparing a color filter employing such the large substrate, curability at low energy has been desired for improving the productivity.

Further, for liquid crystal displays for a use in TVs, better image quality than those used for monitors in the past has been demanded. That is, the improved contrast and color purity have been demanded.

For the curable composition used in preparing a color filter, a coloring agent (organic pigment or the like) having a further finer particle size has been demanded for a use for improving the contrast (for example, see JP-A No. 2006-30541).

However, when the pigment adsorption of a dispersing agent is promoted to improve the dispersion stability upon including a pigment having a small particle size in a curable composition, the dispersing agent bridges between pigments thereby promoting a pigment aggregation, and thus the storage stability such as dispersion stability, or the developability when forming patterns with the use of the curable composition tend to deteriorate.

In addition, since making the pigment finer increases the surface area, the use of finely made pigment tends to increase the adding amount of dispersing agent for a pigment dispersion in the curable composition.

Further, when a better acid value of resin to be added at the time of dispersion is provided for attaining developability, the pigment aggregation tends to be promoted due to an interaction of a hydrogen bond between acid groups or the like.

When a resin is added to a curable composition after the pigment dispersion for attaining the developability, the resin is required to be added in a large quantity.

For a curable composition used in preparing a color filter, further higher content of a coloring agent (organic pigment) in a solid content has been demanded for improving the color purity. However, when a coloring agent is included in a curable composition at high concentration, since the content of photopolymerization initiator and photopolymerizable monomer in a curable composition is reduced, a problem arises in that the curability is hardly attained in an exposed part (even if the) while curability at low energy is desired for the curable composition.

In addition, for a curable composition which is used in preparing a color filter for solid-state image pickup devices, curing with low energy has been also desired. With respect to the color filter used for solid-state image pickup devices, a colored pattern is made finer and accordingly the pigment density in the composition is improved.

Further, in the pigment-based color filter, the content of pigment dispersing agent in a curable composition is more likely increased due to a pigment refinement for reducing the color irregularities caused by relatively coarse pigment particles. As in the curable composition used for manufacturing LCD, the increase of pigment dispersing agent content in the curable composition tends to deteriorate the storage stability such as dispersion stability, or the developability when forming patterns with the use of the curable composition, and also leads to a problem such that the curability is hardly obtained.

In order to deal with the problems such as color irregularities in colored patterns formed, a technique of using an organic solvent-soluble dye instead of pigment as the coloring agent has been proposed (for example, see JP-A No. 2-127602). However, in the dye-based color filter, problems such as polymerization inhibitory effect derived from the dye or deteriorated storage stability such as dye precipitation had become significant due to the increase in dye concentration.

As described above, various problems arise in the curable composition used for preparing a color filter that, for both the cases of use in liquid crystal displays and use in solid-state image pickup devices, the sensitivity is low and sufficient curability cannot be obtained because the concentration of coloring agent is increased while the content of the photopolymerization initiator and the photopolymerizable monomer which are the essential components for curing the curable composition are limited; adhesiveness to a substrate is insufficient; lowered development rate or residue formation in an unexposed part is observed; desired patterns are very hardly formed; dispersion stability and developability are deteriorated when the coloring agent used is a pigment; storage stability is deteriorated such as dye is precipitated, when the coloring agent used is a dye; and the like.

With respect to those problems, in the past, investigation on providing polymerizability to a resin which is introduced mainly to provide a film formability and developability thereby improving the sensitivity has been carried out (for example, see JP-A No. 2000-321763, JP-A No. 2003-029018, "Color Filter new technology Trend (Color Filter Saishin Gizyutsu Doukou)" (published by JOHOKIKO Co., Ltd.) p 85-87, and "Advanced Technologies for LCD Color Filters (Saisentan Color Filter no Process Gizyutsu to Chemicals)" (published by CMC Publishing Co., Ltd.) p 129-150). In addition, technologies disclosed in such can be also mentioned. However, there are problems such as that the synthesis method for the resins is complicated, the synthesizable structure is limited, and the like. Also, satisfied light exposure sensitivity is not yet obtained although such resins are used. Since the light exposure sensitivity is not sufficient, curing in a deep area such as around a substrate interface is insufficient thereby causing a problem such as (deteriorated) substrate adhesion is deteriorated.

The present invention is made in the light of above considerations, and the objects of which is to provide a curable composition for color filter which exhibits highly sensitive curability, excellent storage stability, and high sensitivity even in the case where a coloring agent, which absorbs active energy ray, is included at high concentration; a color filter which has less development residue on an unexposed part, excellent adhesiveness to a substrate of an exposed part, and desired pattern cross-sectional shape and highly precise colored patterns; and a manufacturing method excellent in the color filter productivity. The task is to achieve these objects.

DISCLOSURE OF THE INVENTION

A first aspect of the invention provides a curable composition for color filter including a polymerizable compound (A), a photopolymerization initiator (B), a coloring agent (C), and a binder resin having an acid group and an unsaturated double bond (D), wherein the content of the coloring agent (C) is in the range of 30 to 85 mass %, and the binder resin having an acid group and an unsaturated double bond (D) has the acid group linked on a main chain via a linking group of which the main backbone is two or more atoms and the unsaturated double bond on a side chain.

A second aspect of the invention provides a color filter having colored patterns which is formed from the curable composition according to the first aspect.

A third aspect of the invention provides a manufacturing method of a color filter which includes: forming a colored film formed from the curable composition by applying the curable composition for color filter according to the first aspect onto a support; exposing the colored film through a mask; and developing the exposed colored film to form colored patterns.

BEST MODE FOR CARRYING OUT THE INVENTION

The curable composition for color filter of the invention has extremely high sensitivity and excellent adhesiveness to a substrate. The composition also exhibits high sensitivity even in the case where a coloring material, which absorbs active energy ray, is included at high concentration. Further, the composition exhibits excellent storage stability and excellent precise dispersion stability in the case where the coloring material used is a pigment, in addition to the excellent developability for an unexposed area. Accordingly, a color filter particularly for solid-state image pickup devices or LCDs, which has excellent light exposure sensitivity, excellent adhesiveness to a substrate of an exposed part, and desired pattern cross-sectional shape and highly precise patterns can be formed. Further, a color filter with no color irregularities or a color filter with high contrast can be obtained due to excellent storage stability and precise dispersion stability in the case where the coloring material used is a pigment.

Hereinafter, a curable composition for color filter, a color filter formed from the curable composition, and a manufacturing method of the color filter, of the invention, will be explained in detail.

[Curable Composition for Color Filter]

The curable composition of the invention is characterized by including a polymerizable compound (A), a photopolymerization initiator (B), a coloring agent (C), and a binder resin having an acid group and an unsaturated double bond (D), where the binder resin (D) has a specific structure.

Hereinbelow, each component included in the curable composition of the invention will be explained one by one.

<Binder Resin Having an Acid Group and an Unsaturated Double Bond (D), which has the Acid Group Linked on a Main Chain Via a Linking Group of which the Main Backbone is Two or More Atoms and the Unsaturated Double Bond on a Side Chain>

The curable composition of the invention includes a binder resin having an unsaturated double bond and an acid group (hereinafter, simply referred to as specific polymerizable binder).

Such specific polymerizable binder is preferably a copolymer which includes a structural unit having an acid group (D-1) and a structural unit having a double bond (D-2).

First, the structural unit having an acid group (D-1) will be explained.

The 'acid group' in the invention may be specifically mentioned by —COOH, —SO$_3$H, —PO$_3$H$_2$, —OSO$_3$H, —OPO$_2$H$_2$, or the like. Among these, —COOH, —SO$_3$H, and —PO$_3$H$_2$ are preferable, and —COOH is most preferable.

In the invention, the acid group is essentially linked to a main chain via a linking group of which the main backbone is two or more atoms.

Herein, the 'main backbone of linking group' in the invention refers to atoms or atomic groups used only for linking the main backbone with the acid group, and especially when there are many linking pathways, it refers to atoms or atomic groups constituting a pathway in which the number of atoms to be used is minimum.

Hereinbelow, the number of atoms constituting the main backbone of the linking group in the invention and a calculation method thereof will be described. As shown in the formula below, numerical values accompanied to atoms constituting the linking group refer to the number of atoms constituting the linking group.

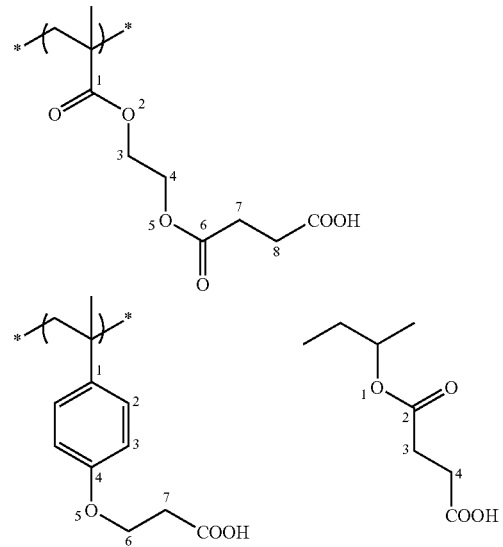

The linking group which links the main chain with the acid group is an organic group of n valence, where n represents a number of acid groups to be shifted to pendant.

The linking group which links the main chain with the acid group is not particularly limited as long as it is an organic group of n valence, but is preferably an aryl group or an alkyl group having 2 to 60 carbon atoms which optionally has, in the structure thereof, a partial structure selected from the group consisting of an oxygen atom, a nitrogen atom, a sulfur atom, a hydrocarbon ring structure having 3 to 20 carbon atoms, a hetero ring, an ester bond, a sulfonate ester bond, a phosphate ester bond, a urethane bond, a thiourethane bond, an amide bond, a urine bond, and a thiourine bond; more preferably a linear or branched alkyl group having 1 to 40 carbon atom(s) which optionally has, in the structure thereof, a partial structure selected from the group consisting of an oxygen atom, a nitrogen atom, a sulfur atom, a hydrocarbon ring structure having 3 to 20 carbon atoms, an ester bond, a urethane bond, a thiourethane bond, an amide bond, a urine bond, and a thiourine bond; and further preferably a linear or branched alkyl group having 1 to 40 carbon atom(s) which optionally has, in the structure thereof, a partial structure selected from the group consisting of an oxygen atom, a nitrogen atom, a hydrocarbon ring structure having 3 to 12 carbon atoms, an ester bond, a urethane bond, and an amide bond.

The linking group may further have a substituent if possible. As the introducible substituent, there are a linear, branched, or cyclic alkyl group having 1 to 20 carbon atom(s), a chained, branched, or cyclic alkenyl group having 2 to 20 carbon atoms, an alkynyl group having 2 to 20 carbon atoms, an aryl group having 6 to 20 carbon atoms, an acyloxy group having 1 to 20 carbon atom(s), an alkoxycarbonyloxy group having 2 to 20 carbon atoms, an aryloxycarbonyloxy group having 7 to 20 carbon atoms, a carbamoyloxy group having 1 to 20 carbon atom(s), a carbonamide group having 1 to 20 carbon atom(s), a sulfonamide group having 1 to 20 carbon atom(s), a carbamoyl group having 1 to 20 carbon atoms(s), a sulfamoyl group having 0 to 20 carbon atom(s), an alkoxy group having 1 to 20 carbon atom(s), an aryloxy group having 6 to 20 carbon atoms, an aryloxycarbonyl group having 7 to 20 carbon atoms, an alkoxycarbonyl group having 2 to 20 carbon atoms, an N-acylsulfamoyl group having 1 to 20 carbon atom(s), an N-sulfamoylcarbamoyl group having 1 to 20 carbon atom(s), an alkylsulfonyl group having 1 to 20 carbon atom(s), an arylsulfonyl group having 6 to 20 carbon atoms, an alkoxycarbonylamino group having 2 to 20 carbon atoms, an aryloxycarbonylamino group having 7 to 20 carbon atoms, an amino group having 0 to 20 carbon atom(s), an imino group having 1 to 20 carbon atom(s), an ammonio group having 3 to 20 carbon atoms, a hydroxy group, a mercapto group, an alkylsulfinyl group having 1 to 20 carbon atom(s), an arylsulfinyl group having 6 to 20 carbon atoms, an alkylthio group having 1 to 20 carbon atom(s), an arylthio group having 6 to 20 carbon atoms, a ureido group having 1 to 20 carbon atom(s), a heterocyclic group having 2 to 20 carbon atoms, an acyl group having 1 to 20 carbon atom(s), a sulfamoylamino group having 0 to 2 carbon atom(s), a silyl group having 2 to 20 carbon atoms, an isocyanate group, an isocyanide group, a halogen atom (for example, a fluorine atom, a chlorine atom, a bromine atom, etc.), a cyano group, a nitro group, an onium group, a group having an ethylenically unsaturated double bond, and the like. Among these groups, preferred is a chained, branched, or cyclic alkyl group having 1 to 10 carbon atom(s) from the viewpoint of easy material availability. In addition, preferred are a hydroxy group, a mercapto group, and a group having an ethylenically unsaturated double bond from the viewpoints of sensitivity and developability. Most preferred is a hydroxy group from the viewpoint of balance in sensitivity and developability.

In the linking group of n valence, n is preferably from 1 to 5, but n is preferably 1 from the viewpoint of strength of coated film to be formed.

Specific examples of the repeating units including acid groups which are included in the specific polymerizable binder of the invention will be represented, but the invention is not limited to those. Hereinbelow, those having —COOH as the acid group will be only exemplified, but —COOH included as the acid group may be replaced by other acid group such as —SO$_3$H, —PO$_3$H$_2$, —OSO$_3$H, —OPO$_2$H$_2$, or the like. The acid group is preferably —COOH, —SO$_3$H, or —PO$_3$H$_2$, and most preferably —COOH.

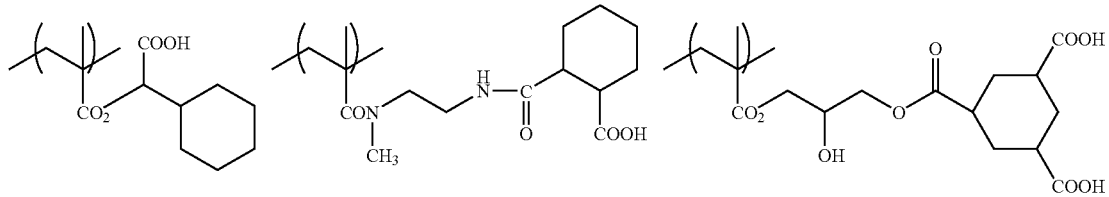

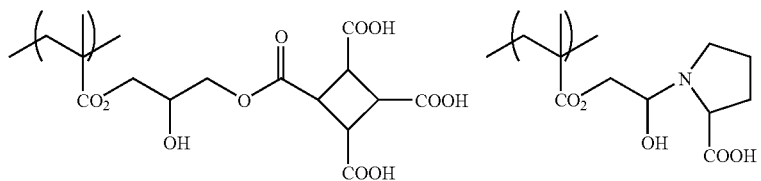

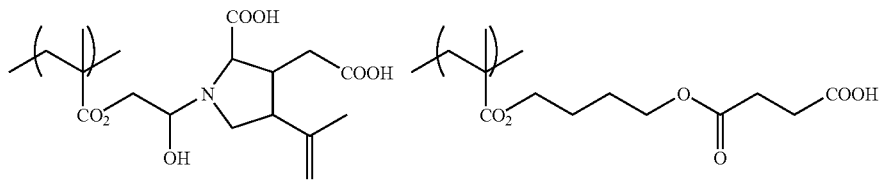

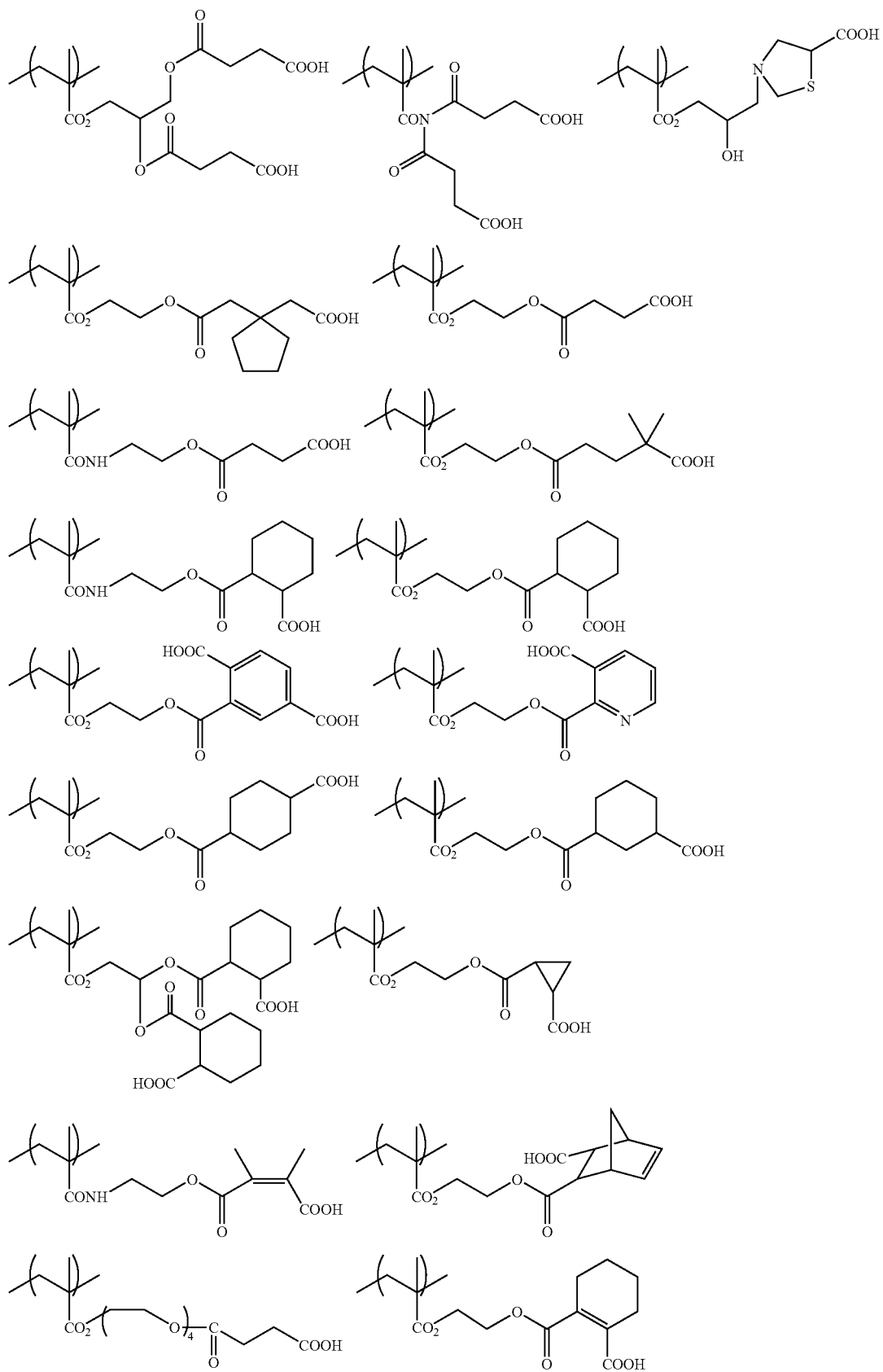

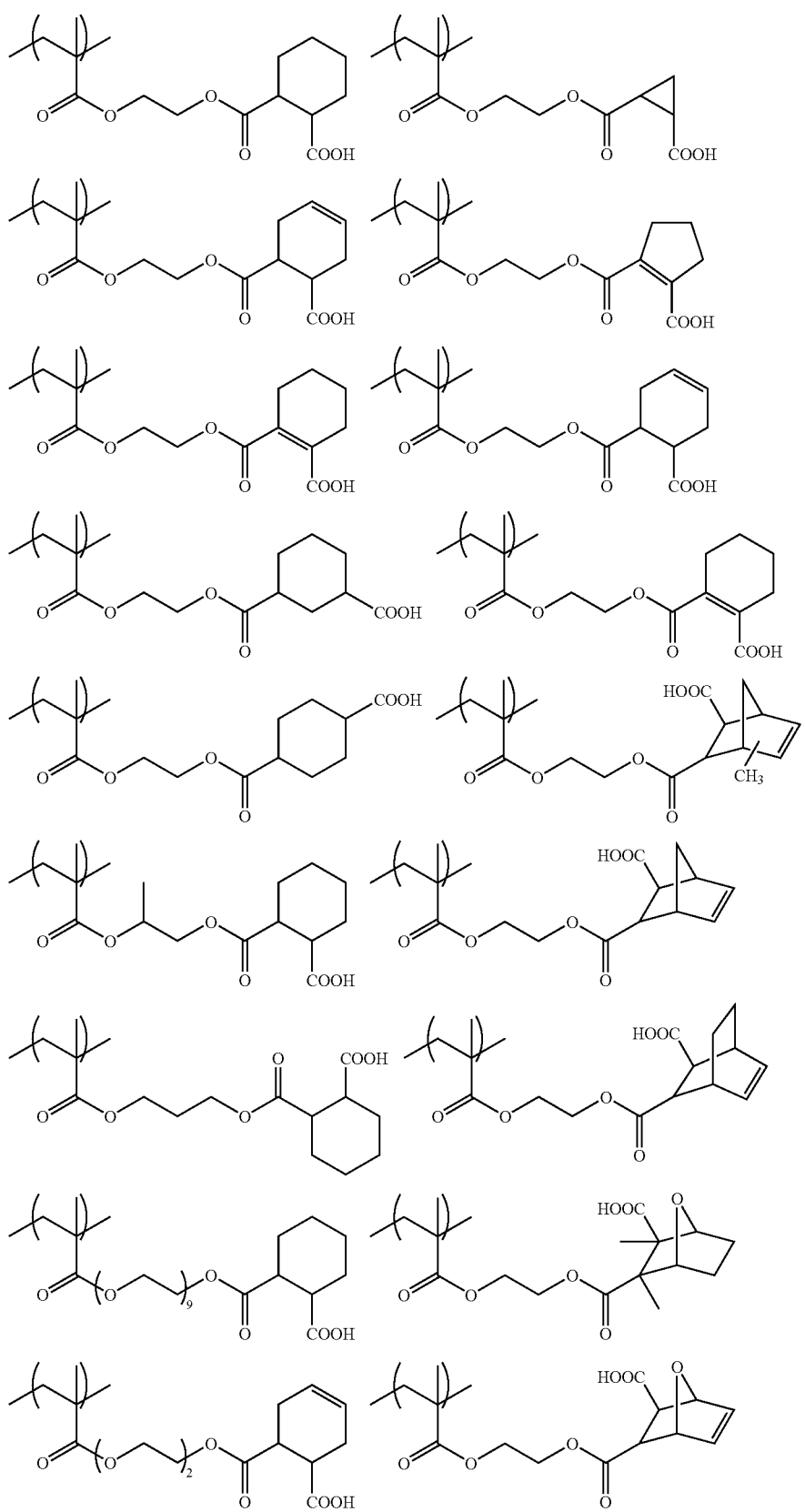

-continued
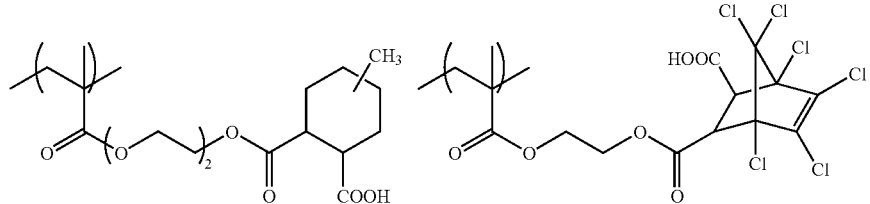
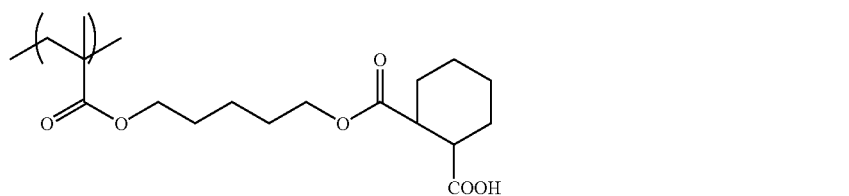
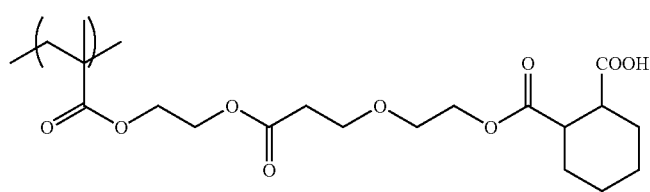
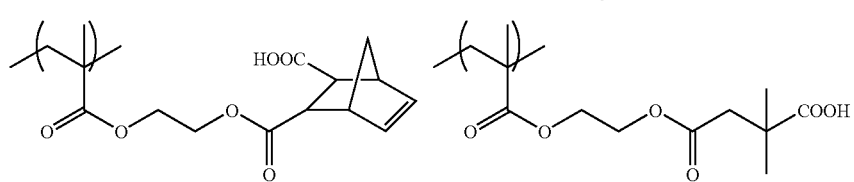
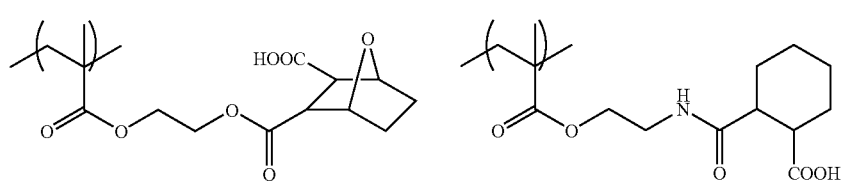
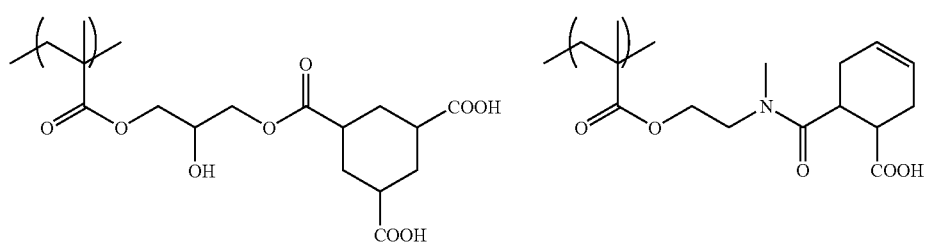
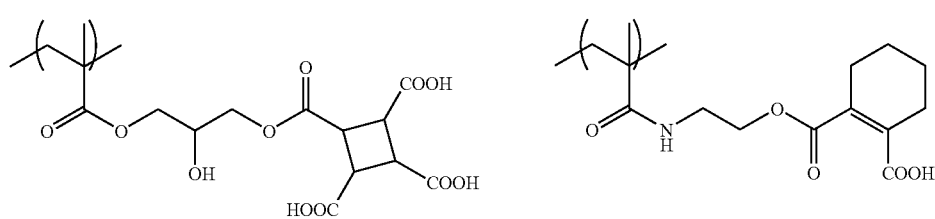
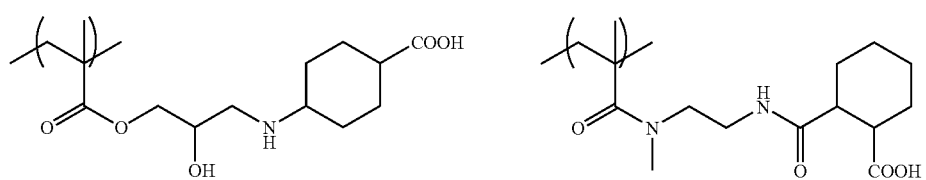

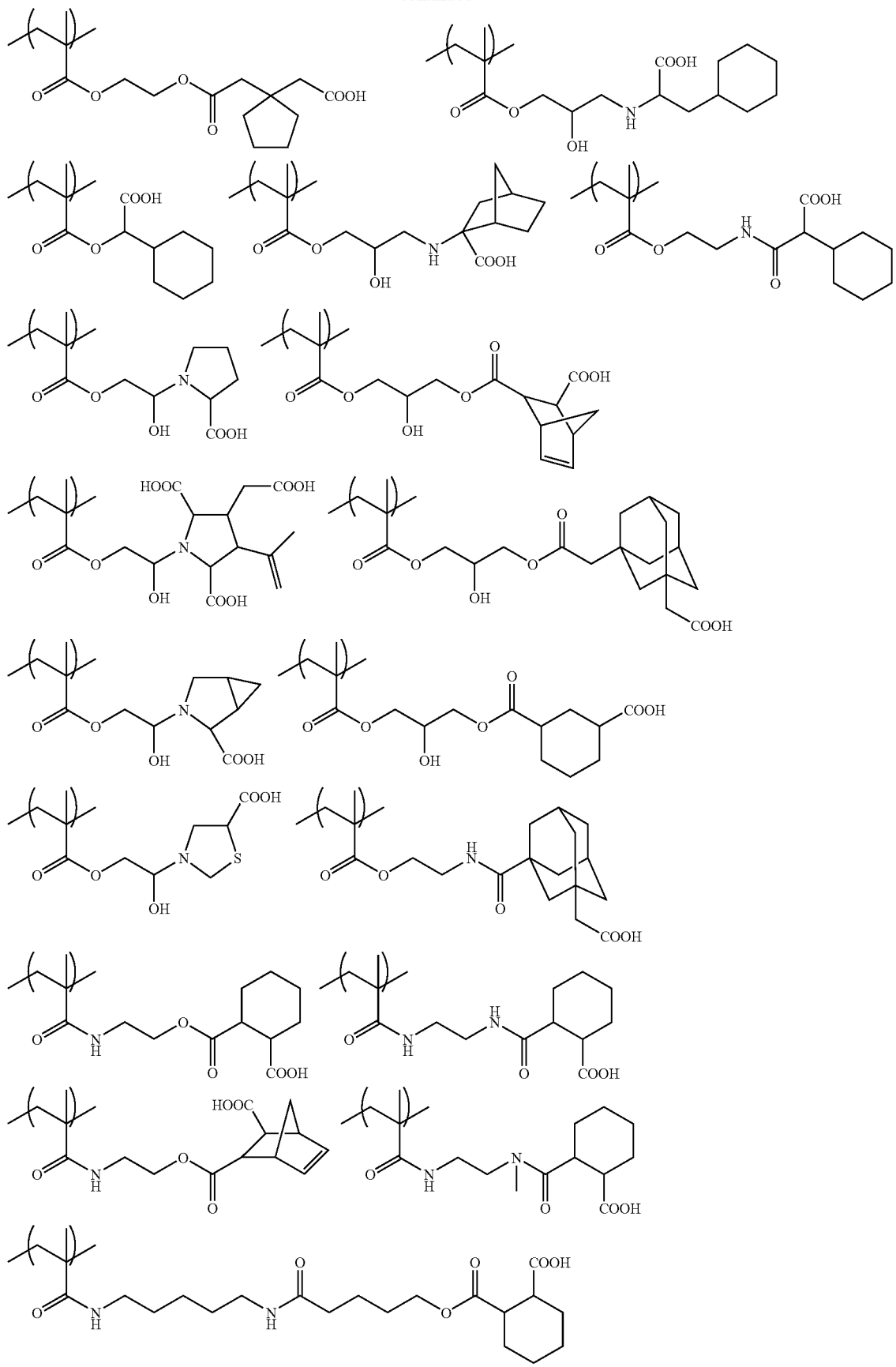

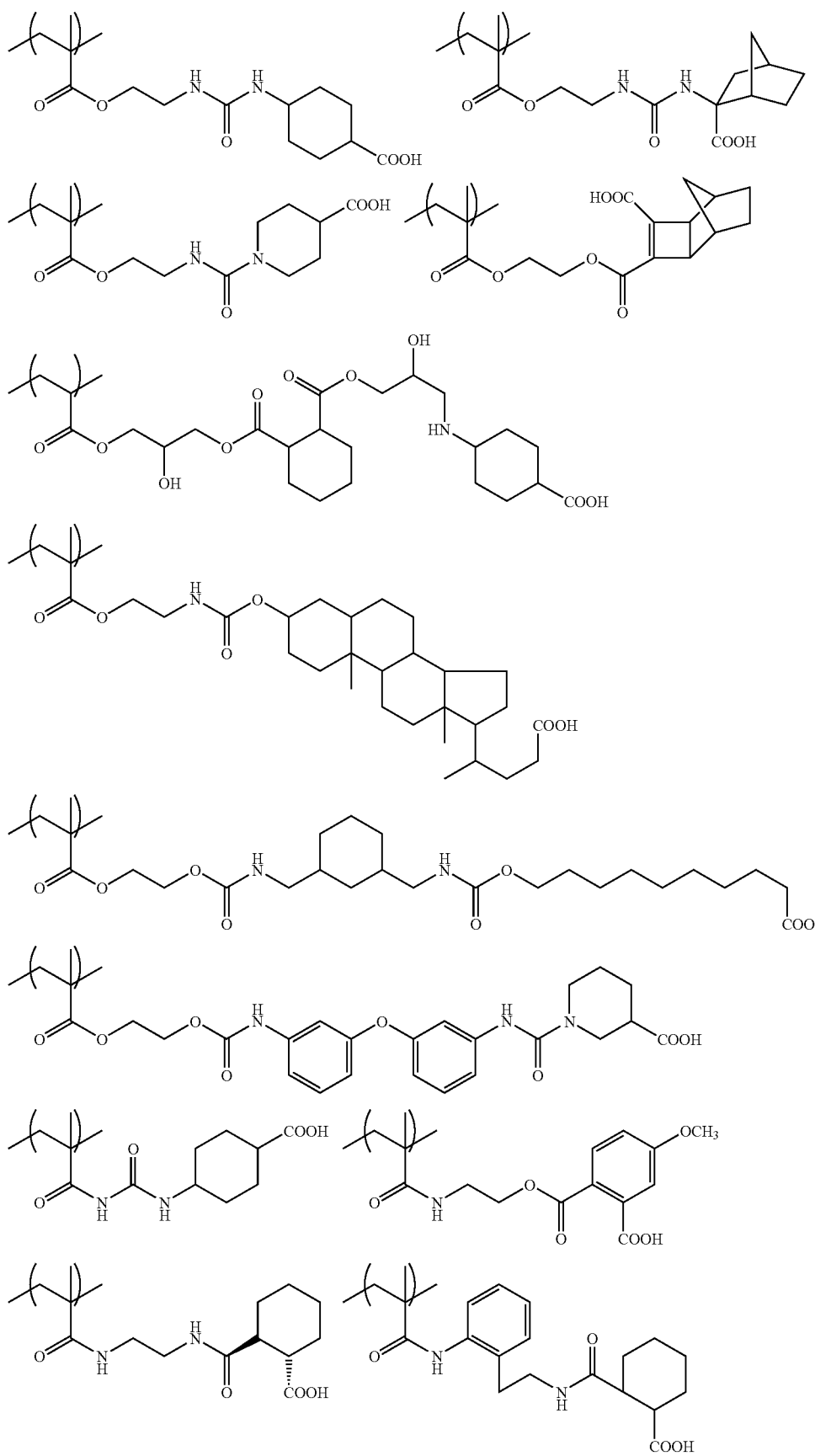

-continued
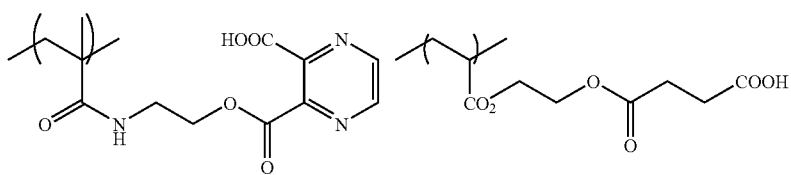
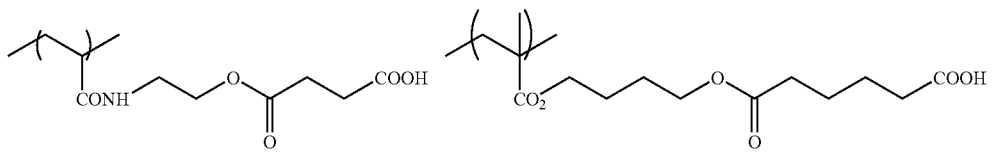
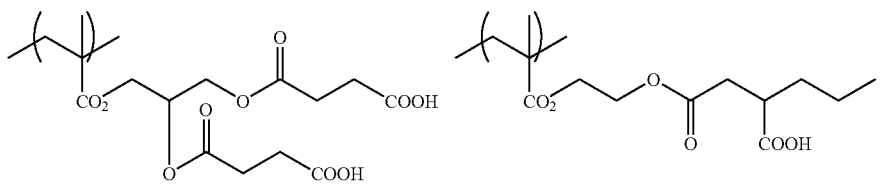
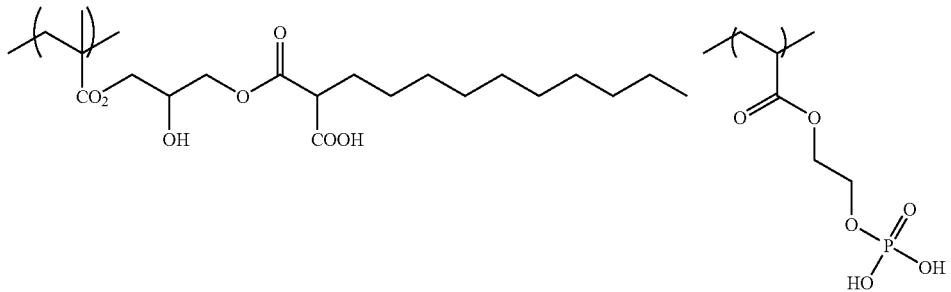
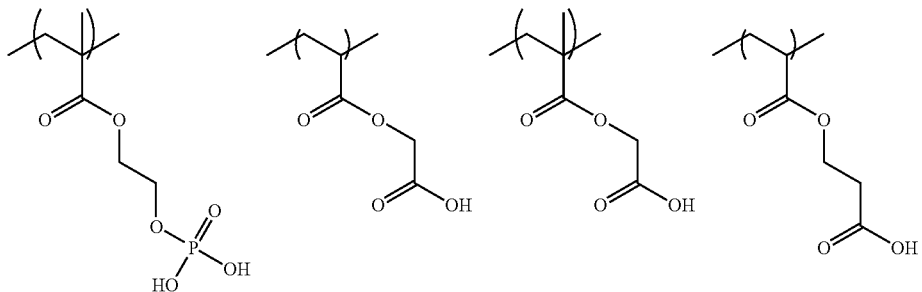
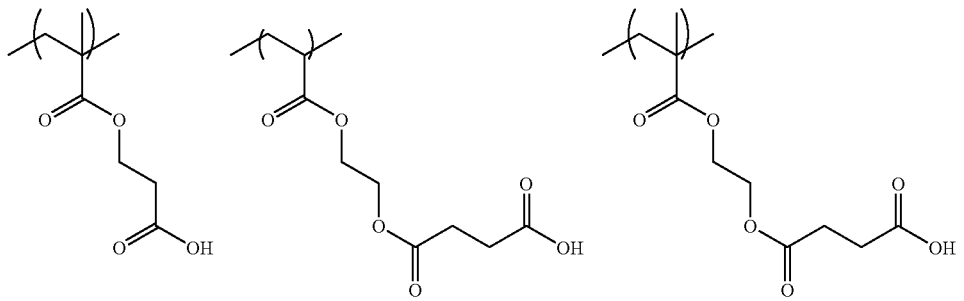

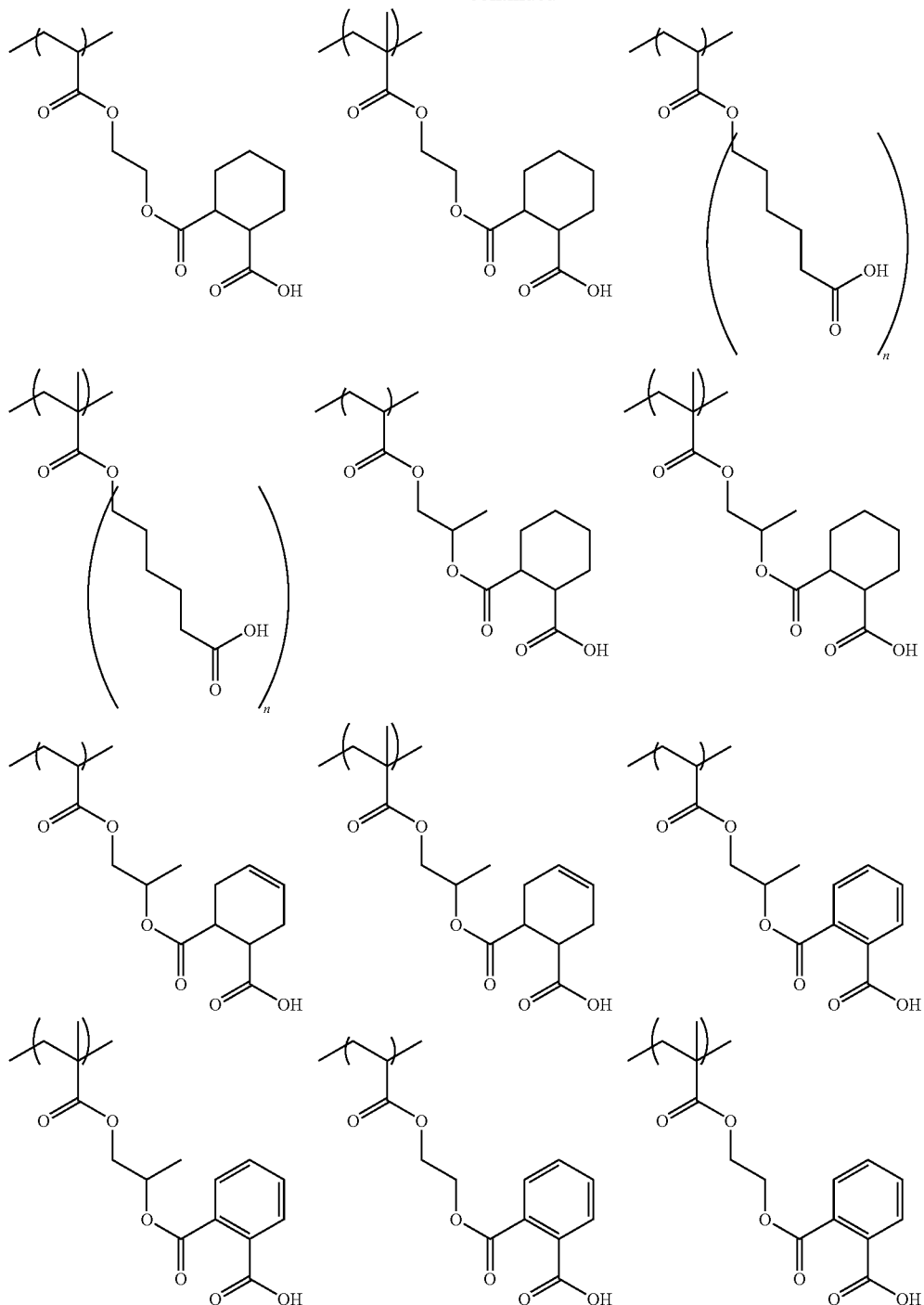

The repeating unit including acid group (D-1) may be included either singly or in combination of two or more kinds in the specific polymerizable binder (D). The specific polymerizable binder for the invention is a copolymer which includes at least the repeating unit including acid groups and a structural unit having an unsaturated double bond which will be described later. The total amount of the repeating unit including acid groups is appropriately determined in accordance with the structure thereof, design of colored film formed from the curable composition, or the like, but it is in the range of preferably 1 to 80 mol %, more preferably 5 to 60 mol %, and further preferably 10 to 40 mol %, relative to a total molar amount of polymer components.

The specific polymerizable binder (D) of the invention essentially has an unsaturated double bond on the side chain. Here, the unsaturated double bond can be exemplified by ethylenically unsaturated double bonds introduced by amidation reaction or esterification reaction by an unsaturated carboxylic acid (for example, acrylic acid, methacrylic acid, itaconic acid, crotonic acid, isocrotonic acid, maleic acid, etc.).

The ethylenically unsaturated double bonds, introduced by a product of dehydration/condensation reaction of monofunctional or polyfunctional carboxylic acid, or addition reaction of monofunctional or polyfunctional isocyanates or epoxys, with amides or unsaturated carboxylate ester having a nucleophilic substituent such as a hydroxyl group, an amino group, or a mercapto group, may also be exemplified. In addition, the ethylenically unsaturated double bonds, introduced by a product of addition reaction of amides or unsaturated carboxylate ester having an electrophilic substituent such as isocyanate group or an epoxy group with monofunctional or polyfunctional alcohols, amines, or thiols, and further substitution reaction of amides or unsaturated carboxylate esters having releasing group as a substituent such as a halogen group or a tosyloxy group with monofunctional or polyfunctional alcohols, amines, or thiols, may also be exemplified. In addition, the above unsaturated carboxylic acid can be replaced by unsaturated phosphonic acid, styrene, vinyl ether, or the like. The ethylenically unsaturated double bond is preferably exemplified by ethylenically unsaturated double bond introduced by (meth)acryl group or a vinyl ether group, from the viewpoints of sensitivity and ease of synthesis.

As described above, such unsaturated double bond is preferably included as the structural unit having an unsaturated double bond on a side chain (D-2).

The resin including such unsaturated double bond is more preferably a resin obtained by a reaction between a resin containing a carboxyl group as an acid group, and a glycidyl group-containing unsaturated compound such as glycidyl (meth)acrylate or allyl glycidyl ether; a resin obtained by a reaction between a resin in which a hydroxyl group-containing, (meth)acrylate ester-based compound is polymerized, and (meth)acrylate ester having a free isocyanate group such as ethyl (meth)acrylic acid-2-isocyanate; a resin including structural unit(s) represented by any of Formula (1) to (3) which will be described below; a resin obtained by synthesizing a resin having a specific functional group which provides an unsaturated group according to a releasing reaction by a base treatment and thereafter producing an unsaturated group by subjecting the resin to a base treatment; or the like.

The specific polymerizable binder in the invention preferably has at least one structural unit selected from the structural units represented by the following Formulas (1) to (3) as the unsaturated double bond moiety (D-2).

Formula (1)
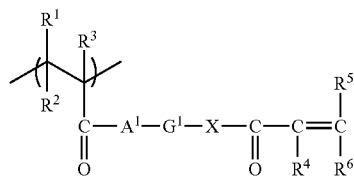

Formula (2)
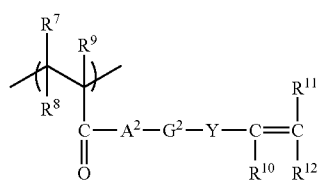

Formula (3)
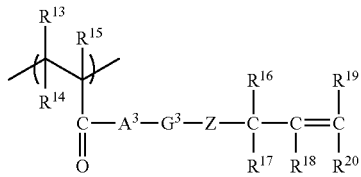

In the Formulas (1) to (3), $A^1$, $A^2$, and $A^3$ are each independently an oxygen atom, a sulfur atom, or —N($R^{21}$)— while $R^{21}$ is an optionally substituted alkyl group; $G^1$, $G^2$, and $G^3$ are each independently a divalent organic group; X and Z are each independently an oxygen atom, a sulfur atom, or —N($R^{22}$)— while $R^{22}$ is an optionally substituted alkyl group; Y is an oxygen atom, a sulfur atom, an optionally substituted phenylene group, or —N($R^{23}$)— while $R^{23}$ is an optionally substituted alkyl group; and $R^1$ to $R^{20}$ are each independently a monovalent organic group.

The structural unit having an unsaturated double bond (D-2) is described in detail, for example, in JP-A No. 2003-262958, JP-A No. 2003-335814, etc., as the structural component of a binder used for negative working image forming materials, and this structural unit can be also applied to the invention.

The macromolecule employing the structural unit used in synthesizing the specific polymerizable binder (D) of the invention can be produced by the synthesis method (a) represented below.

Synthesis Method (a):
a method which includes copolymerizing at least one radically polymerizable compound represented by the following Formula (4-1) with at least one other radically polymerizable compound by a usual radical polymerization process to synthesize a desired polymer precursor, and then removing a proton using a base treatment thereby eliminating L, so as to obtain a desired polymer having the structure represented by the Formula (1).

Hereat, for the production of the polymer precursor, a commonly used method such as suspension polymerization process or solution polymerization process can be applied. The constitution of the copolymer thereof may be any of a block copolymer, a random copolymer, a graft copolymer, and the like.

Formula (4-1)
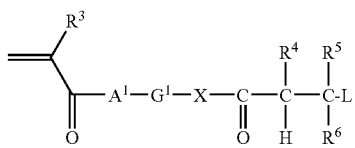

In the Formula (4-1), L is an anionic releasing group, preferably is a halogen atom, a sulfonate ester, or the like; and for $R^3$ to $R^6$, $A^1$, $G^1$, and X, same examples as mentioned in the Formula (1) can be employed.

The base group used to cause a releasing reaction may be any of an inorganic compound and an organic compound. The inorganic compound base may be preferably exemplified by sodium hydroxide, potassium hydroxide, sodium carbonate, sodium hydrocarbonate, potassium carbonate, potassium hydrogencarbonate, or the like, and the organic compound base may be preferably exemplified by metal alkoxide such as sodium methoxide, sodium ethoxide, or potassium-t-butoxide, organic amine compound such as triethylamine, pyridine, diisopropylethylamine, or the like.

The radically polymerizable compound represented by the Formula (4-1) can be exemplified by the following compounds (M-1) to (M-12), but it is not limited to these.

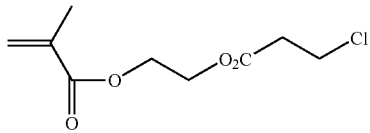
(M-1)

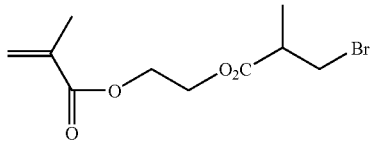
(M-2)

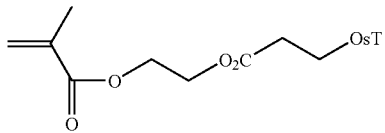
(M-3)

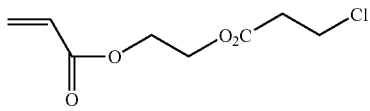
(M-4)

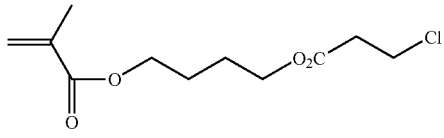
(M-5)

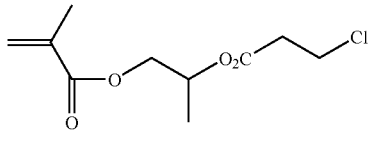
(M-6)

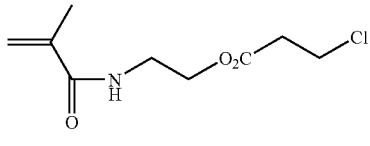
(M-7)

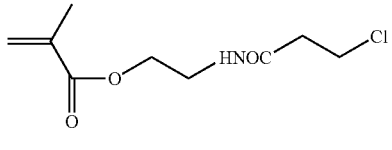
(M-8)

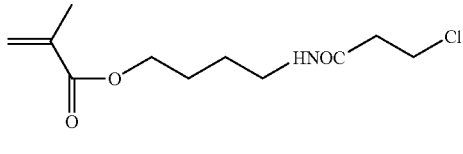
(M-9)

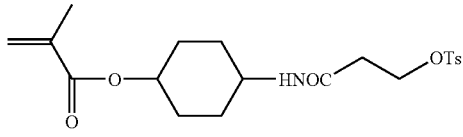
(M-10)

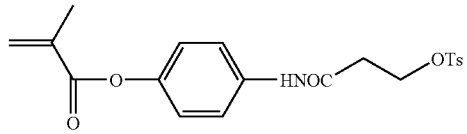
(M-11)

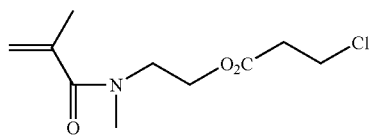
(M-12)

These radically polymerizable compounds are easily available on the market or by the synthesis method disclosed in the specification of JP-A No. 2002-062648.

As the other synthesis method to obtain a structural unit having an unsaturated double bond constituting the specific polymerizable binder related to the invention, (b) a method which includes allowing a releasing reaction in a specific functional group subjecting a polymer including a compound represented by the following Formula (4-2) as the copolymer component to a base treatment for a releasing reaction to take place in a specific functional group, removing $X^1$ and $Z^1$ in the formula, and forming a radically reactable group, so as to obtain a polymer having the structure represented by the Formula (1), can be mentioned.

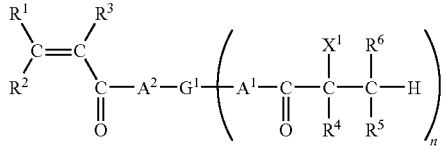
Formula (4-2)

In the Formula (4-2), R', $R^2$, and $R^3$ are each independently hydrogen or a monovalent organic group; $A^2$ is an oxygen atom, a sulfur atom, or $-NR^8-$; $R^8$ is hydrogen or a monovalent organic group; n is an integer of 1 to 10; $R^4$ to $R^6$, $A^1$, and $G^1$ have the same meanings as defined in the Formula (1); and $X^1$ is a releasing group which can be removed by the releasing reaction.

Herein, $X^1$ is a releasing group which can be removed by the releasing reaction, and $X^1$ is preferably the group anionically charged for removal (which can be removed anionically).

Specific examples of $X^1$ include a halogen atom, a sulfonic acid group, a sulfinic acid group, a carboxylic acid group, a cyano group, an ammonium group, an azido group, a sulfonium group, a nitro group, a hydroxyl group, an alkoxy group, a phenoxy group, a thioalkoxy group, and an oxonium group, and preferably include a halogen atom, a sulfonic acid group, an ammonium group, and a sulfonium group. Among these, particularly preferred are a chlorine atom, a bromine atom, an iodine atom, an alkylsulfonic acid group, and an arylsulfonic acid group. Preferred examples of the alkylsulfonic acid group include a methanesulfonic acid group, an ethanesulfonic acid group, a 1-propanesulfonic acid group, an isopropylsulfonic acid group, an 1-butanesulfonic acid group, an 1-octylsulfonic acid group, an 1-hexadecanesulfonic acid group, a trifluoromethanesulfonic acid group, a trichloromethanesulfonic acid group, a 2-chloro-1-ethanesulfonic acid group, a 2,2,2-trifluoroethanesulfonic acid group, 3-chloropropanesulfonic acid group, perfluoro-1-butane-sulfonic acid group, perfluoro-1-octanesulfonic acid group, a 10-camphorsulfonic acid group, and a benzylsulfonic acid group. Preferred examples of the arylsulfonic acid group include a benzenesulfonic acid group, a trans-beta-styrene-sulfonic acid group, a 2-nitrobenzenesulfonic acid group, a 2-acetylbenzenesulfonic acid group, a 3-(trifluoromethyl)benzenesulfonic acid group, a 3-nitrobenzenesulfonic acid group, a 4-nitrobenzenesulfonic acid group, a p-toluenesulfonic acid group, a 4-tert-butylbenzenesulfonic acid group, a 4-fluorobenzenesulfonic acid group, a 4-chlorobenzenesulfonic acid group, 4-bromobenzenesulfonic acid group, a 4-iodobenzenesulfonic acid group, a 4-methoxybenzenesulfonic acid group, a 4-(trifluoromethoxy)benzenesulfonic acid group, a 2,5-dichlorobenzenesulfonic acid group, a 2-nitro-4-(trifluoromethyl)-benzenesulfonic acid group, a 4-chloro-3-nitrobenzenesulfonic acid group, a 2,4-dinitrobenzenesulfonic acid group, a 2-mesitylenesulfonic acid group, a 2,4,6-triisopropylbenzenesulfonic acid group, a pentafluorobenzenesulfonic acid group, a 1-naphthalenesulfonic acid group, and a 2-naphthalenesulfonic acid group.

The specific examples of the compound represented by the above Formula (4-2) can be preferably mentioned by the compounds (i-1 to i-52) shown below.

i-1
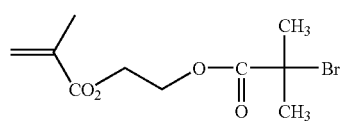

i-2
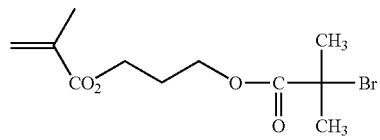

i-3
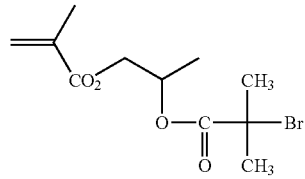

i-4
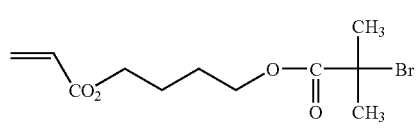

i-5
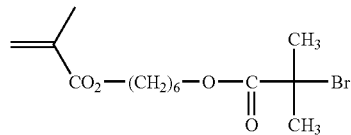

i-6
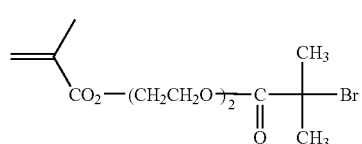

i-7
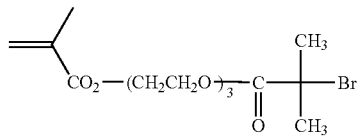

i-8
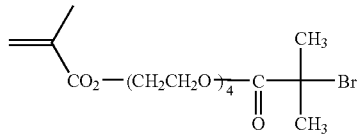

i-9
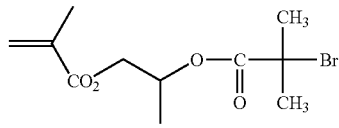

i-10
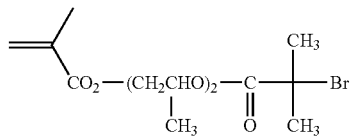

i-11
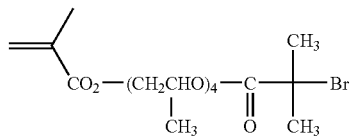

i-12
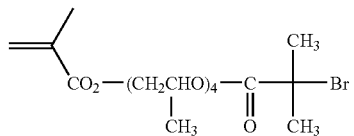

i-13
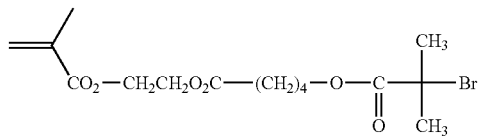

i-14
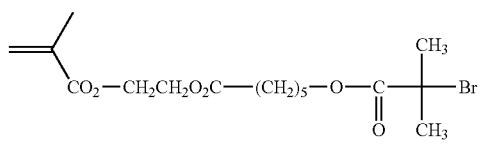

i-15
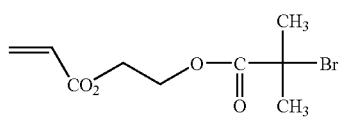

i-16
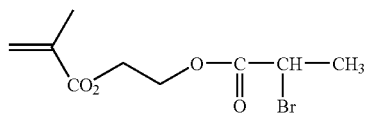

i-17
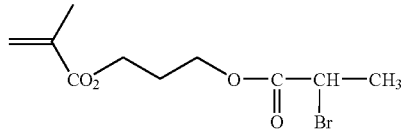

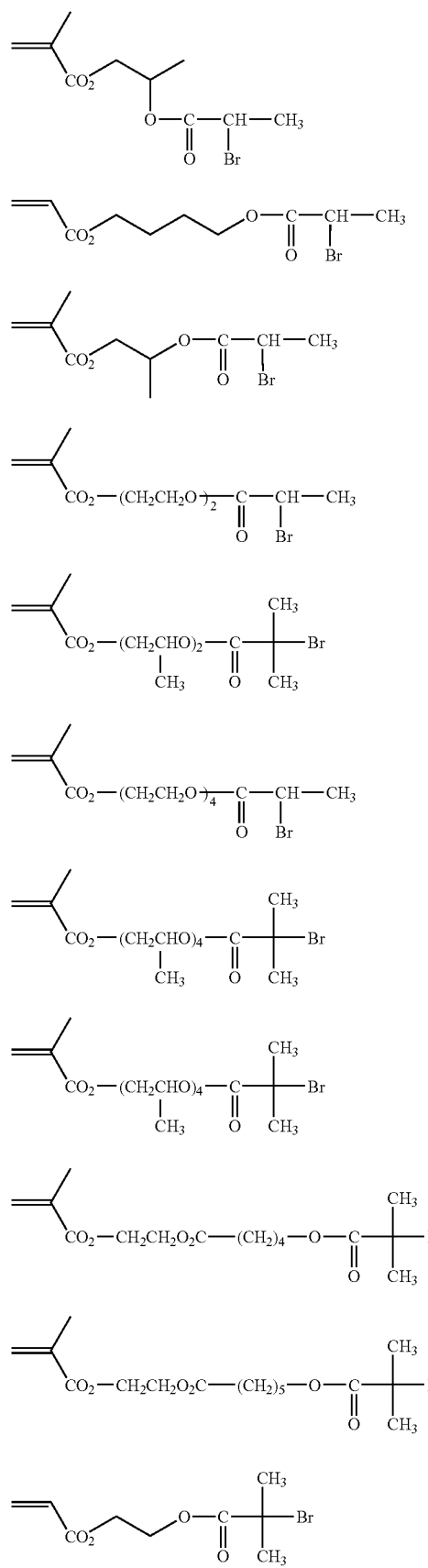
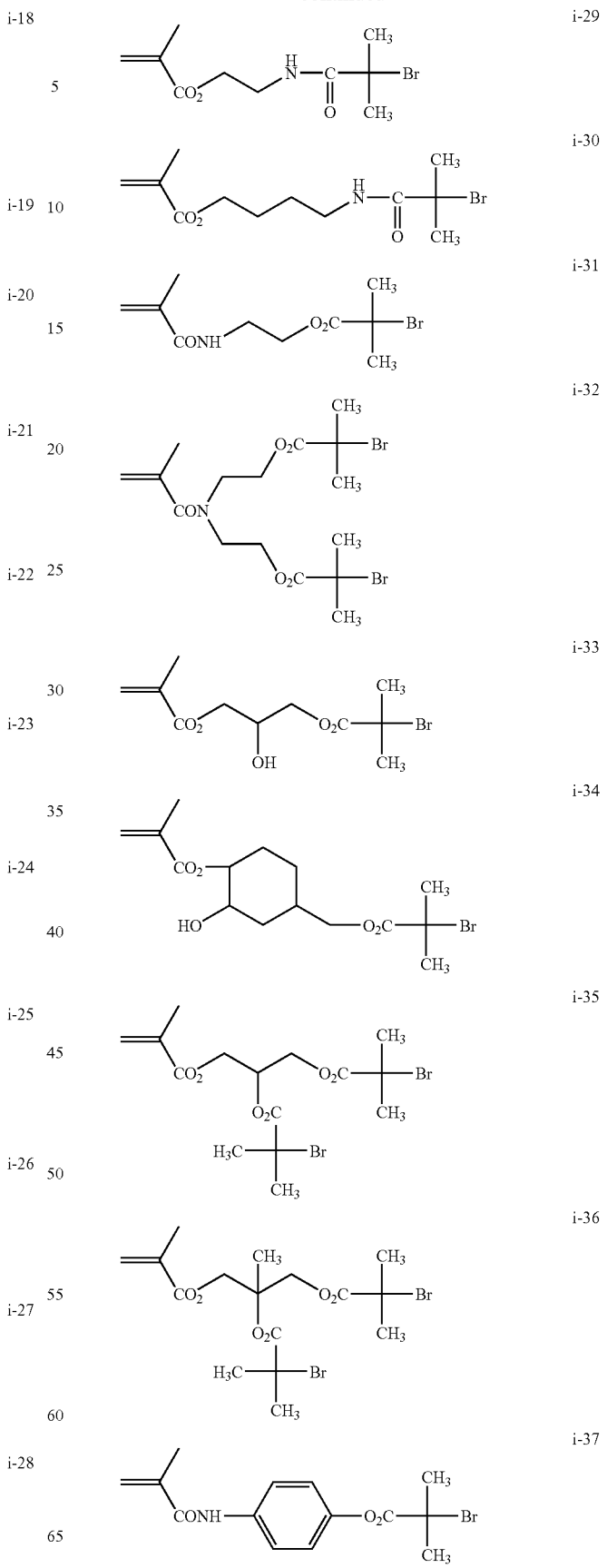

-continued i-38
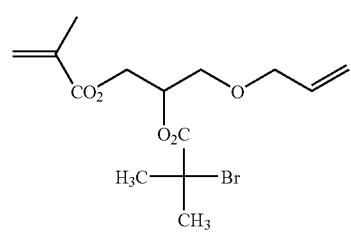

i-39
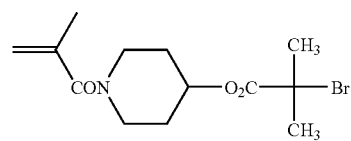

i-40
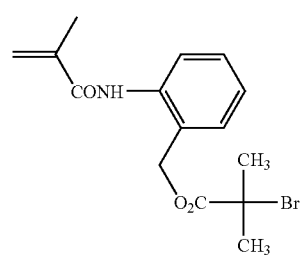

i-41
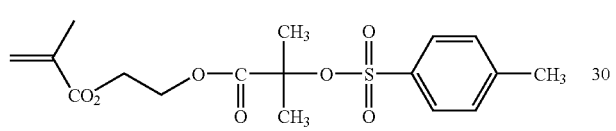

i-42
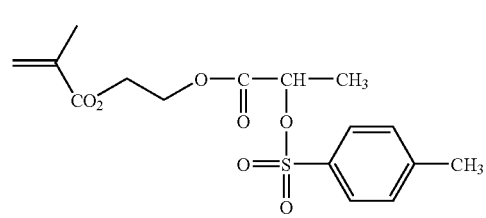

i-43
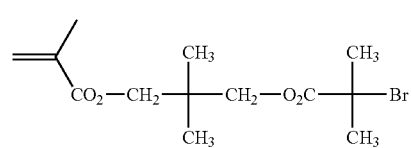

i-44
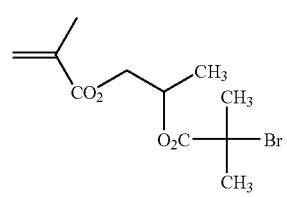

i-45
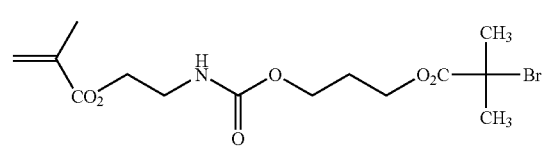

i-46
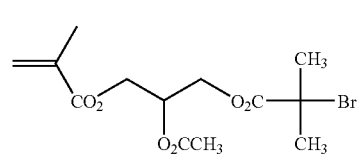

-continued i-47
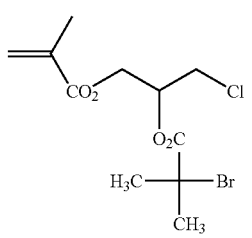

i-49
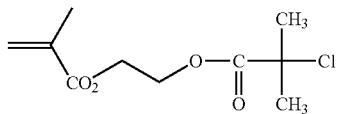

i-49
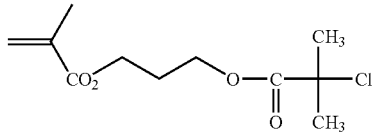

i-50
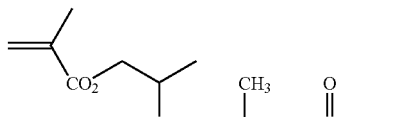

i-51
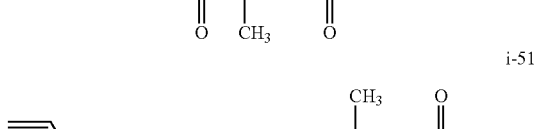

i-52
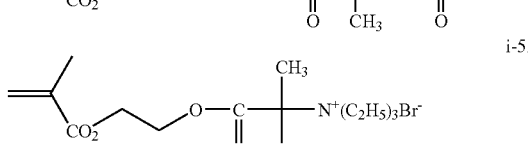

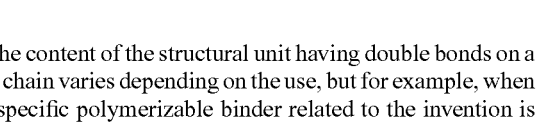

The content of the structural unit having double bonds on a side chain varies depending on the use, but for example, when the specific polymerizable binder related to the invention is used for forming colored patterns of a color filter containing a coloring agent at high concentration, the content is at least preferably 5 mol % or greater, and more preferably from 30 to 80 mol %.

In the case of synthesizing the specific polymerizable binder of the invention by the aforementioned synthesis method (a) or (b), the structural unit having an acid group and the structural unit having a double bond may be copolymerized with other common radically polymerizable compound, which is also a preferred embodiment.

The common radically polymerizable compound to be copolymerized can be exemplified by the compounds (1) to (12) shown below.

(1) acrylic acid esters and methacrylic acid esters having aliphatic hydroxyl group, such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate, and 4-hydroxybutyl methacrylate.

(2) alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4- epoxycyclohexyl methylacrylate, vinyl acrylate, 2-phenylvinyl acrylate, 1-propenyl acrylate, allyl acrylate, 2-allyloxyethyl acrylate, and propargyl acrylate.

(3) alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycylohexyl methylmethacrylate, vinyl methacrylate, 2-phenylvinyl methacrylate, 1-propenyl methacrylate, allyl methacrylate, 2-allyloxyethyl methacrylate, and propargyl methacrylate.

(4) acrylamides or methacrylamides, such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, vinylacrylamide, vinylmethacrylamide, N,N-diallylacrylamide, N,N-diallylmethacrylamide, allylacrylamide, and allylmethacrylamide.

(5) vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(6) vinyl esters such as vinyl acetate, vinyl chloroacetate, vinyl butyrate, and vinyl benzoate.

(7) styrenes such as styrene, α-methylstyrene, methylstyrene, chloromethylstyrene, and p-acetoxystyrene.

(8) vinyl ketones such as methyl vinyl ketone, ethyl vinyl ketone, propyl vinyl ketone, and phenyl vinyl ketone.

(9) olefins such as ethylene, propylene, isobutylene, butadiene, and isoprene.

(10) N-vinylpyrrolidone, acrylonitrile, methacrylonitrile, and the like.

(11) Unsaturated imides such as maleimide, N-acryloylacrylamide, N-acetylmethacrylamide, N-propionylmethacrylamide, and N-(p-chlorobenzoyl)methacrylamide.

(12) methacrylate-based monomer in which a hetero atom is bonded to α-position thereof. For example, compounds described in JP-A No. 2002-309057, JP-A No. 2002-311569, and the like.

As the preferred specific polymerizable binder for the invention, specifically, polymers obtained by copolymerizing 1 to 70 mol % of at least one structural unit selected from the structural units shown below as the structural unit having an acid group (D-1), 5 to 80 mol % of the exemplified structural unit (M-1) or (1-1) shown above as the structural unit having an unsaturated double bond on a side chain (D-2), and 1 to 60 mol % of methyl (meth)acrylic acid, benzyl (meth)acrylic acid, or styrene as the other radically polymerizable group used in combination if necessary, can be mentioned.

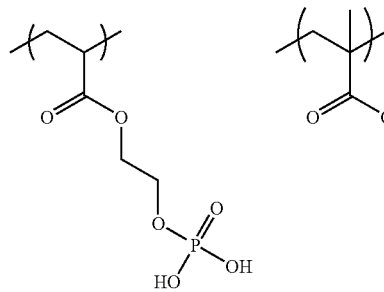

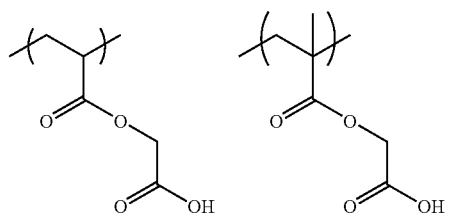

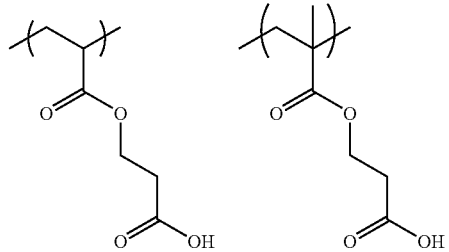

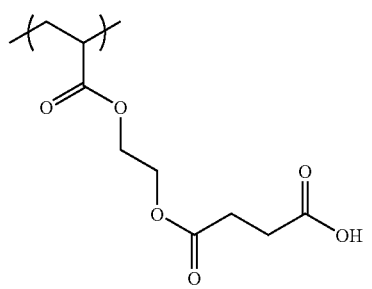

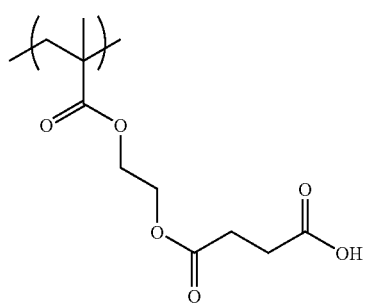

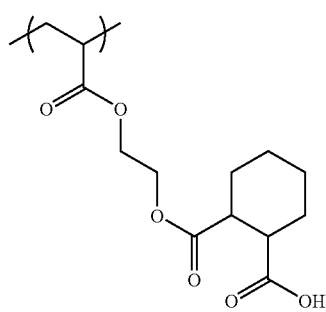

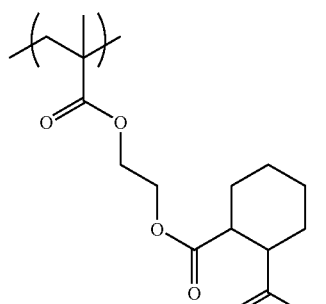

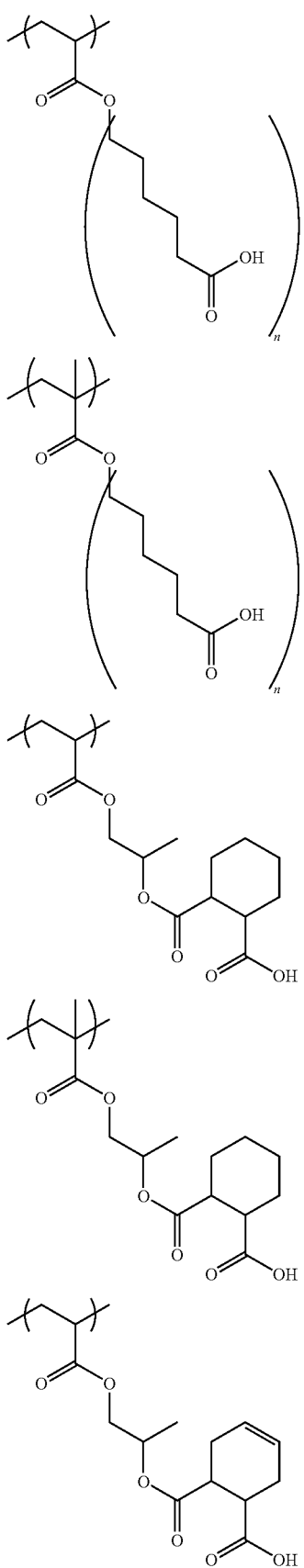
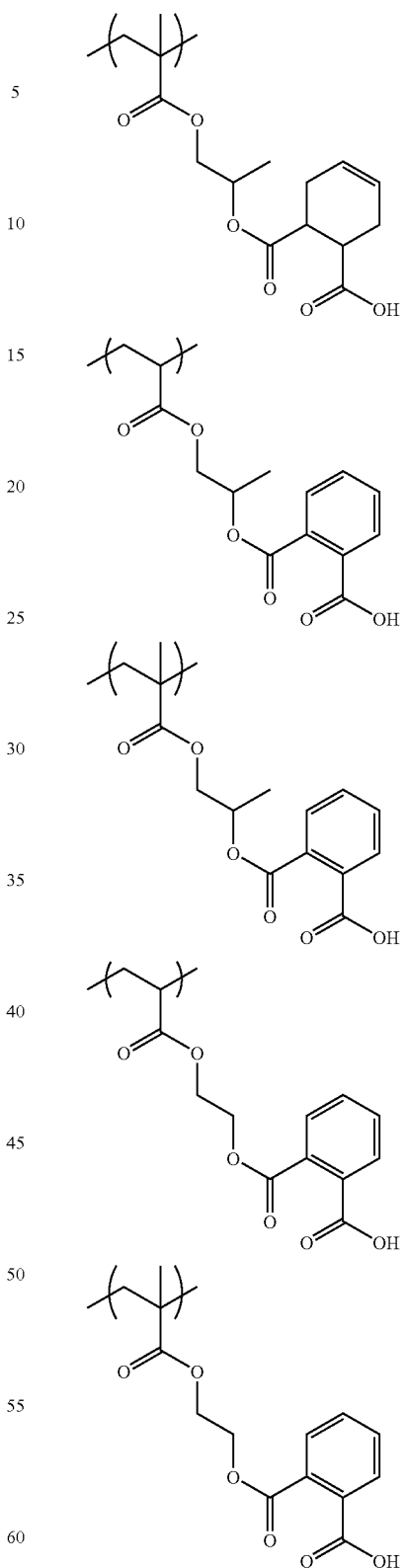
The molecular weight of the specific polymerizable binder related to the invention is in the range of preferably from 1,000 to 200,000, more preferably from 2,000 to 100,000, even more preferably from 3,000 to 50,000, and most preferably from 5,000 to 30,000, in weight-average molecular weight. Herein, for the weight-average molecular weight for the invention, values measured by Gel Permeation Chromatography (GPC) using polystyrene as the standard are employed.

Specific examples of the specific polymerizable binder of the invention including the structural unit having an acid group (D-1) and the structural unit having a double bond (D-2) are represented below as [Exemplified Compounds (1) to (17)] each with weight-average molecular weight (Mw) thereof, but the invention is not limited to these.

(1)
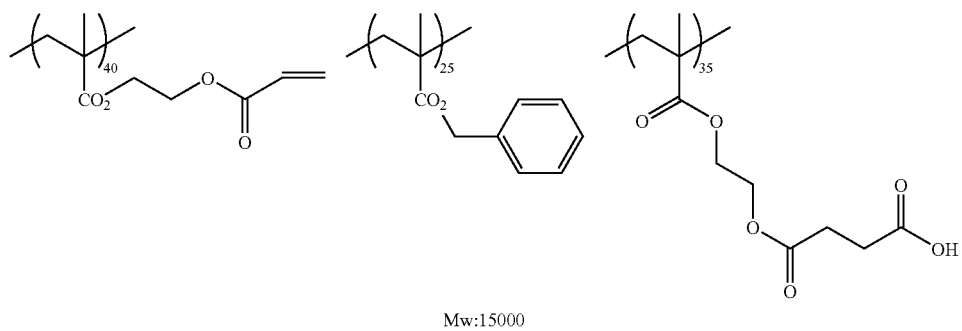
Mw:15000

(2)
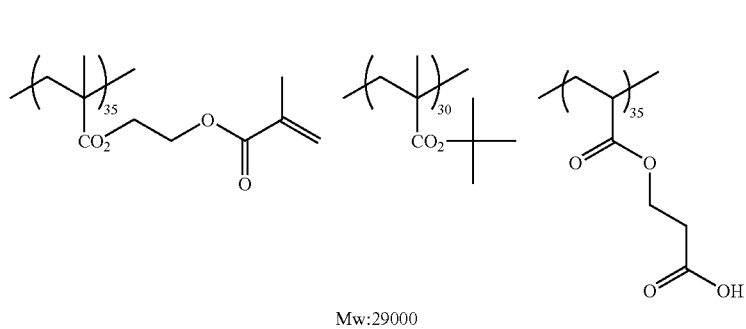
Mw:29000

(3)
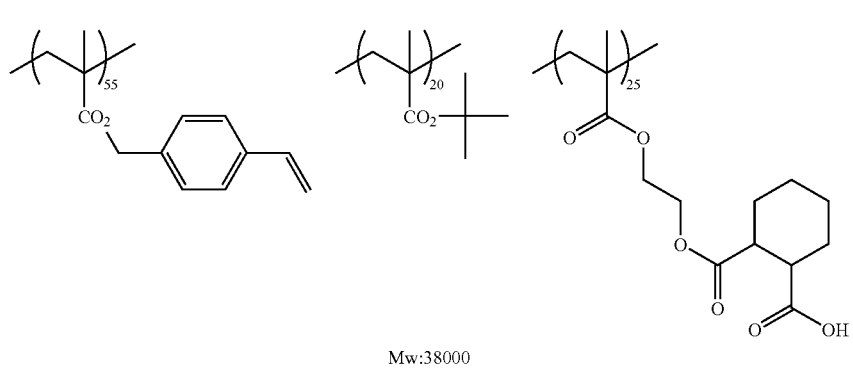
Mw:38000

(4)
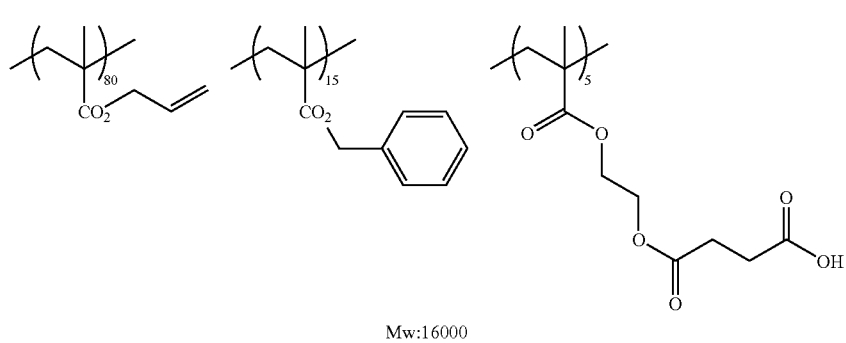
Mw:16000

-continued
(5)
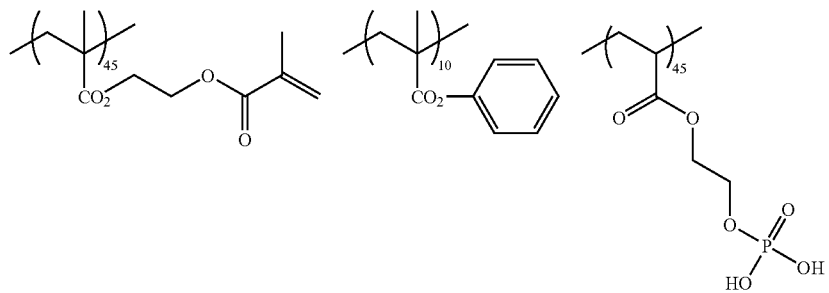
Mw:8700
(6)
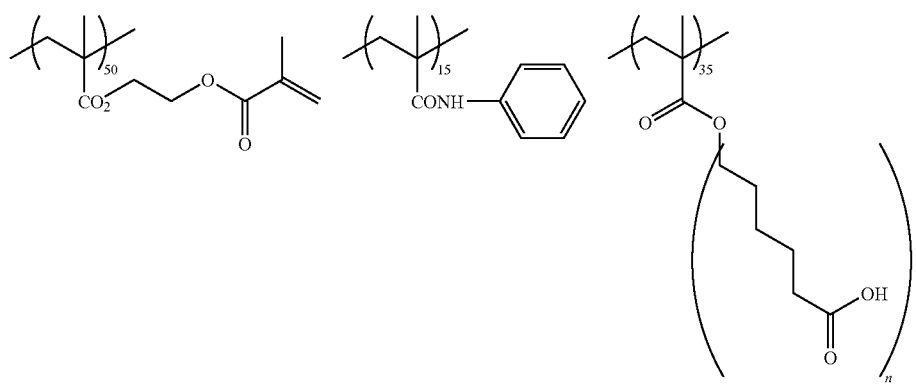
Mw:7200
(7)
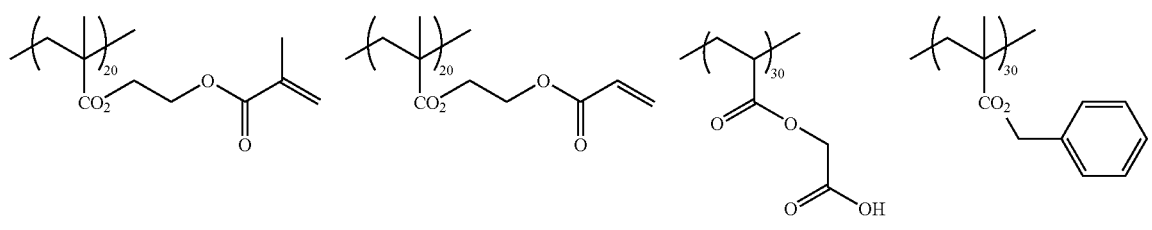
Mw:4600
(8)
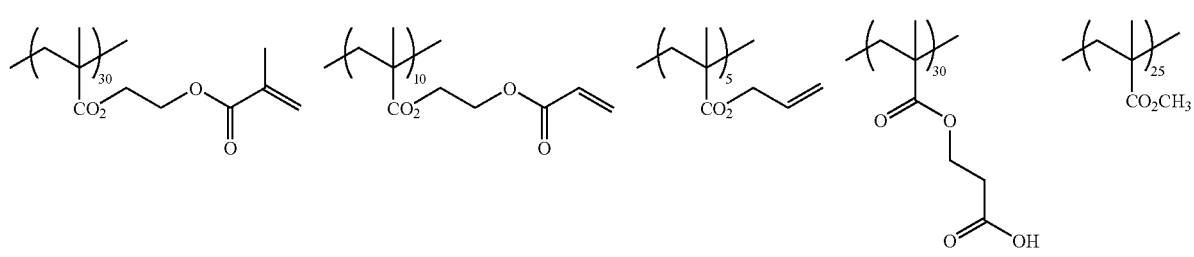
Mw:9700
(9)
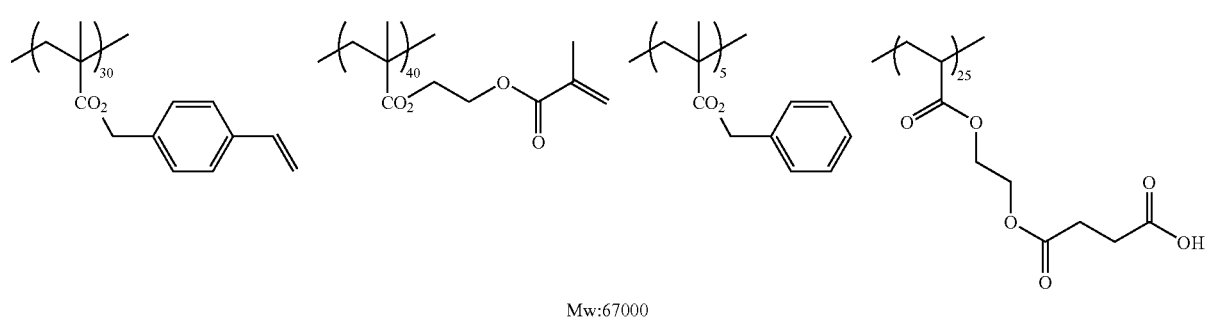
Mw:67000

-continued
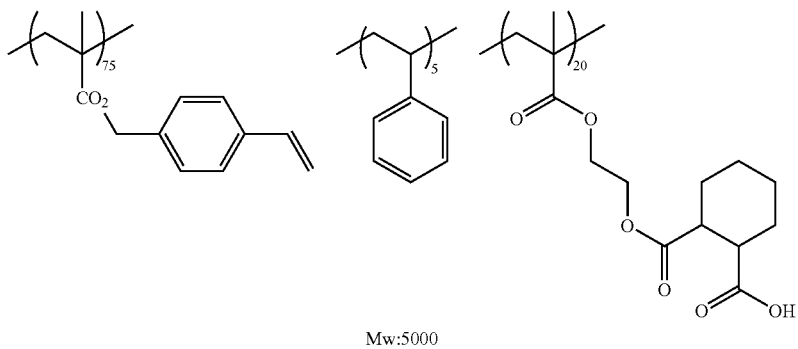
(10)
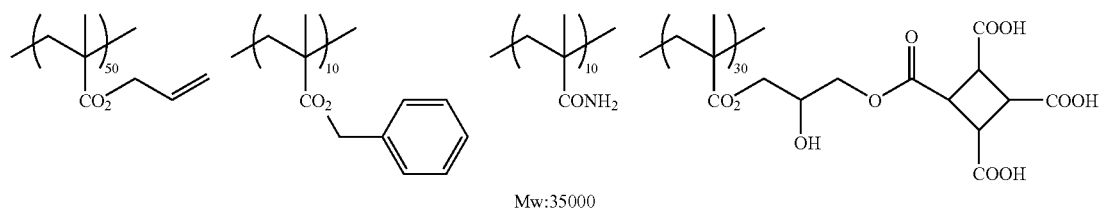
(11)
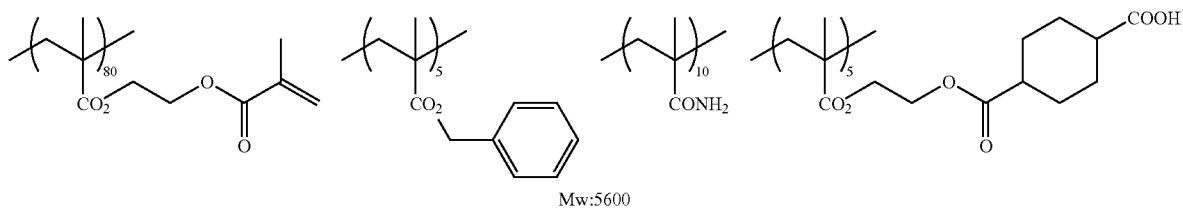
(12)
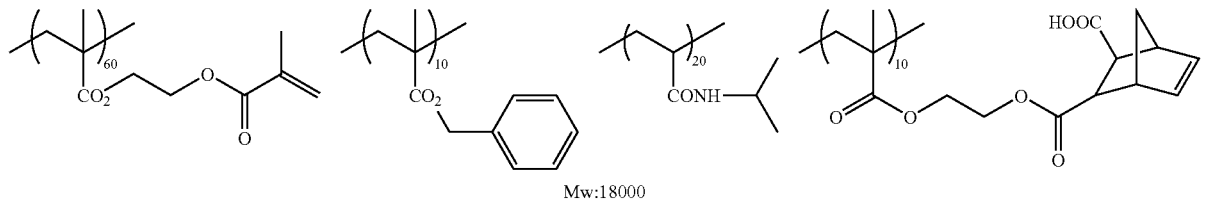
(13)
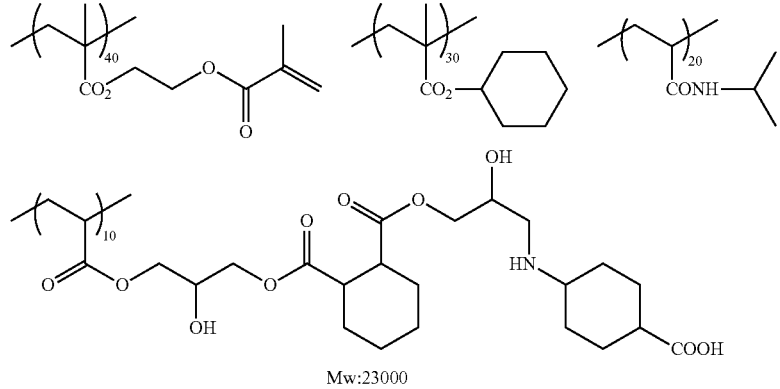
(14)
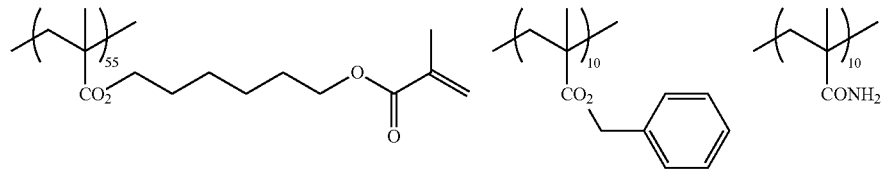
(15)

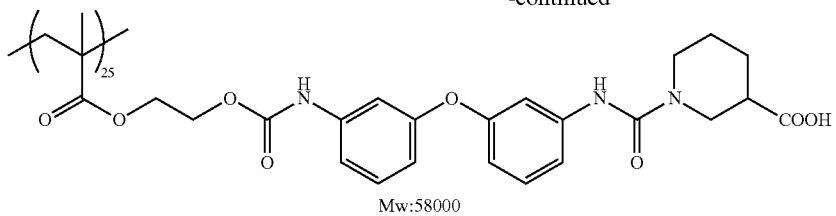

(16)

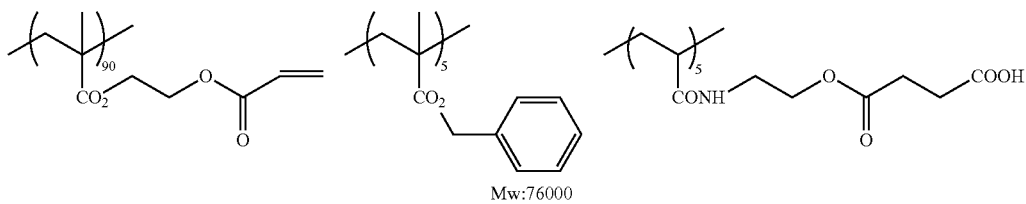

(17)

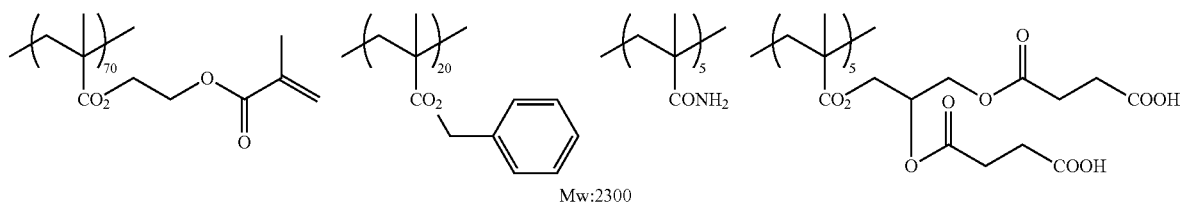

The content of the specific polymerizable binder is in the range of preferably to 80 mass %, more preferably 0.05 to 60 mass %, even more preferably 0.1 to 40 mass %, and most preferably 0.3 to 20 mass %, relative to a total solid content in the curable composition for color filter of the invention.

<Polymerizable Compound (A)>

For the curable composition of the invention, since the specific polymerizable binder (D) is included, this may be served as a polymerizable compound to serve the curability. However, from the viewpoint of improving the film property for cured coated film or forming the composition without a solvent, it is preferable that the polymerizable compound (A) including an ethylenically unsaturated double bond is also included in addition to the specific polymerizable binder.

The polymerizable compound which can be employed in the invention is an addition polymerizable compound having at least one ethylenically unsaturated double bond, which can be selected from compounds having at least one terminal ethylenically-unsaturated double bond, preferably compounds having two or more terminal ethylenically-unsaturated double bonds. Such compounds are widely known in the field of industry, and these may be employed in the invention without particular limitation. These compounds have chemical form of, for example, monomer, prepolymer, that is dimer, trimer, and oligomer, or a mixture thereof, a copolymer thereof, or the like. Examples of the monomer and the copolymer thereof include unsaturated carboxylic acid (for example, acrylic acid, methacrylic acid, itaconic acid, crotonic acid, isocrotonic acid, maleic acid, etc.), esters thereof, and amides thereof, and preferably include ester of unsaturated carboxylic acid and polyvalent aliphatic alcohol compound, and amides of unsaturated carboxylic acid and polyvalent aliphatic amine compound. In addition, products of addition reaction of monofunctional or polyfunctional isocyanates or epoxys, or dehydration/condensation reaction of monofunctional or polyfunctional carboxylic acid, with amides or unsaturated carboxylate ester having a nucleophilic substituent such as a hydroxyl group, an amino group, or a mercapto group, may also be preferably used. Further, products of addition reaction of amides or unsaturated carboxylate ester having an electrophilic substituent such as isocyanate group or an epoxy group with monofunctional or polyfunctional alcohols, amines, or thiols, and further substitution reaction of amides or unsaturated carboxylate esters having releasing group as a substituent such as a halogen group or a tosyloxy group with monofunctional or polyfunctional alcohols, amines, or thiols, are also preferable. In addition to the exemplified compounds, compounds having unsaturated phosphonic acid, styrene, vinyl ether, or the like, instead of unsaturated carboxylic acid as in the above examples can also be used.

As a specific example of a monomer of an ester of an aliphatic polyhydric alcohol compound and unsaturated carboxylic acid, there are acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, and isocyanuric acid EO-modified triacrylate.

There are methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy) phenyl]dimethylmethane, and bis-[p-(methacryloxyethoxy) phenyl]dimethylmethane.

As the itaconic acid ester, there are ethyleneglycol diitaconate, propyleneglycol diitaconate, 1,3-butanediol diitaconate, 1,4-butanediol diitaconate, tetramethyleneglycol diitaconate, pentaerythritol diitaconate, sorbitol tetraitaconate, and the like. As the crotonic acid ester, there are ethyleneglycol dicrotonate, tetramethyleneglycol dicrotonate, pentaerythritol dicrotonate, sorbitol tetradicrotonate, and the like. As the isocrotonic acid ester, there are ethyleneglycol diisocrotonate, pentaerythritol diisocrotonate, sorbitol tetraisocrotonate, and the like. As the maleic acid ester, there are ethyleneglycol dimalate, triethyleneglycol dimalate, pentaerythritol dimalate, sorbitol tetramalate, and the like.

As an example of other ester, for example, aliphatic alcohol-based esters described in JP-B No. 51-47334, and JP-A No. 57-196231, esters having an aromatic skeleton described in JP-A No. 59-5240, JP-A No. 59-5241, and JP-A No. 2-226149, and esters containing an amino group described in JP-A No. 1-165613 are also preferably used. Further, the aforementioned ester monomers may be also used as a mixture.

In addition, as a specific example of a monomer of amide of an aliphatic polyhydric amine compound and unsaturated carboxylic acid, there are methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, and xylylenebismethacrylamide. Examples of other preferable amide-based monomer include monomers having a cyclohexylene structure described in JP-B No. 54-21726.

In addition, urethane-based addition polymerizable compounds which can be produced by the addition reaction of isocyanate and a hydroxyl group are also preferable, and specific examples thereof include a vinyl urethane compound having two or more polymerizable vinyl groups per molecule, which is obtained by addition of vinyl monomer having a hydroxyl group in the compound represented by the following Formula (A) to a polyisocyanate compound having two or more isocyanate groups per molecule, which is disclosed in JP-B No. 48-41708, and the like.

$$CH_2=C(R^{10})COOCH_2CH(R^{11})OH \quad \text{Formula (A)}$$

(provided that, $R^{10}$ and $R^{11}$ are each H or $CH_3$)

In addition, urethane acrylates described in JP-A No. 51-37193, JP-B No. 2-32293, and JP-B No. 2-16765, and urethane compounds having an ethylene oxide-based skeleton described in JP-B No. 58-49860, JP-B No. 56-17654, JP-B No. 62-39417, and JP-B No. 62-39418 are also preferable. Furthermore, by using addition-polymerization compounds having an amino structure or a sulfide structure in a molecule, described in JP-A No. 63-277653, JP-A No. 63-260909, and JP-A No. 1-105238, a photopolymerizable composition, which is very excellent in a photosensitive speed, can be obtained.

Other examples include polyfunctional acrylates and methacrylates such as polyester acrylates, and epoxy acrylates obtained by reaction of an epoxy resin and (meth)acrylic acid, described in each gazette of JP-A No. 48-64183, JP-B No. 49-43191, and JP-B No. 52-30490. In addition, examples include specified unsaturated compounds described in JP-B No. 46-43946, JP-B No. 1-40337, and JP-B No. 1-40336, and vinylphosphonic acid-based compounds described in JP-A No. 2-25493. In some cases, a structure containing a perfluoroalkyl group described in JP-A No. 61-22048 is preferably used. Furthermore, compounds which are introduced as a photocurable monomer and oligomer in Journal of Adhesion Society of Japan, vol. 20, No. 7, p. 300-308 (1984) can be also used.

In regard to these addition polymerizable compounds, detailed description on the way of use such as a structure thereof, whether it is used alone or in combination, or added amount, can be arbitrarily set considering the design for performance of the curable composition. For example, following viewpoints may be considered.

From the sensitivity point of view, a structure including a large content of unsaturated group per molecular is preferable, in many cases, those having two or more functional groups are preferable. In order to improve the strength of image area, that is cured film, those having three or more functional groups are preferable, and a method of adjusting both the sensitivity and the strength by employing different number of functional group • different polymerizable group (for example, acrylate ester, methacrylate ester, styrene-based compound, vinyl ether-based compound) in combination is also effective. From the viewpoint of curing sensitivity, a compound having two or more (meth)acrylate ester constitutions is preferably employed, a compound having three or more (meth)acrylate ester constitutions is more preferably employed, and a compound having four or more (meth)acrylate ester constitutions is most preferably employed. From the viewpoints of curing sensitivity and developability of unexposed area, it is preferable to include an EO-modified substance. In addition, from the viewpoints of curing sensitivity and strength of exposed part, it is preferable to include a urethane bond.

The selection and method of use of the addition polymerizable compound are also very important factors for compatibility with and dispersibility in other components (for example, resin, photopolymerization initiator, pigment) in the curable composition, and for example, the compatibility may be improved by a use of low purity compound or a combination use of two or more kinds. Also, in order to improve the adhesiveness to a substrate or the like, a specific structure may be selected.

From the above points of view, bisphenol A diacrylate, EO-modified bisphenol A diacrylate, trimethylolpropane triacrylate, trimethylolpropane tri(acryloyloxypropyl)ether, trimethylolethane triacrylate, tetraethyleneglycol diacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, EO-modified pentaerythritol tetraacrylate, EO-modified dipentaerythritol hexaacrylate, and the like, are preferable, and commercially available products such as Urethane Oligomers UAS-10, UAB-140 (manufactured by Sanyo-Kokusaku Pulp), DPHA-40H (manufactured by Nippon Kayaku Co., Ltd.), UA-306H, UA-306T, UA-306I, AH-600, T-600, AI-600 (manufactured by Kyoeisha Chemical CO., Ltd.), and UA-7200 (manufactured by Shin-Nakamura Chemical Co., Ltd.) are preferable.

Among these, EO-modified bisphenol A diacrylate, pentaerythritol triacrylate, pentaerythritol tetraacrylate, dipentaerythritol pentaacrylate, dipentaerythritol hexaacrylate, tri(acryloyloxyethyl)isocyanurate, EO-modified pentaerythritol tetraacrylate, and EO-modified dipentaerythritol hexaacrylate are more preferable. As a commercially available product, DPHA-40H (manufactured by Nippon Kayaku Co., Ltd.), UA-306H, UA-306T, UA-306I, AH-600, T-600, and AI-600 (manufactured by Kyoeisha Chemical CO., Ltd.) are more preferable.

The content of the polymerizable compound (A) in the solid content of the curable composition for color filter of the invention is in the range of preferably 1 to 50 mass %, more preferably 5 to 40 mass %, and even more preferably 10 to 35 mass %.

The content ratio (mass ratio) of the specific polymerizable binder (D) to the polymerizable compound (A), represented by (D)/(A), is in the range of preferably 0.001 to 100, more preferably 0.005 to 50, and even more preferably 0.01 to 10, from the viewpoints of sensitivity and removability (developability) of an unexposed area.

<Photopolymerization Initiator (B)>

The curable composition of the invention includes the photopolymerization initiator (B).

The photopolymerization initiator in the invention is a compound which decomposed upon light addition, and initiates and promotes the polymerization of the component (A) and the component (D) for the invention which will be described later. The photopolymerization initiator is preferably the one having an absorption band in the region of 300 to 500 nm. The photopolymerization initiator may be used alone or in combination of two or more kinds.

Examples of the photopolymerization initiator include an organohalogenated compound, an oxydiazole compound, a carbonyl compound, a ketal compound, a benzoin compound, an acridine compound, an organoperoxide compound, an azo compound, a coumarin compound, an azide compound, a metallocene compound, a hexaaryl-biimidazole compound, an organoboron compound, a disulfonate compound, an oximeester compound, an onium salt compound, an acylphosphine(oxide) compound, an alkylamino compound, and the like.

Hereinbelow, these compounds will be described in detail.

Specific examples of the organohalogenated compound include compounds described in Wakabayashi et al., "Bull Chem. Soc Japan", 42, 2924 (1969), specification of U.S. Pat. No. 3,905,815, JP-B No. 46-4605, JP-A No. 48-36281, JP-A No. 55-32070, JP-A No. 60-239736, JP-A No. 61-169835, JP-A No. 61-169837, JP-A No. 62-58241, JP-A No. 62-212401, JP-A No. 63-70243, JP-A No. 63-298339, and M. P. Hutt "Journal of Heterocyclic Chemistry" 1 (No 3), (1970)", and particularly include trihalomethyl-substituted oxazole compounds and s-triazine compounds.

As the s-triazine compound, there are more preferably an s-triazine derivative in which at least one mono-, di-, or tri-halogen-substituted methyl group is bonded to an s-triazine ring, specifically for example, 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-nathoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, and the like.

As the oxydiazole compound, there are 2-trichloromethyl-5-styryl-1,3,4-oxodiazole, 2-trichloromethyl-5-(cyanostyryl)-1,3,4-oxodiazole, 2-trichloromethyl-5-(naphth-1-yl)-1,3,4-oxodiazole, 2-trichloromethyl-5-(4-styryl)styryl-1,3,4-oxodiazole, and the like.

As the carbonyl compound, there are benzophenone derivatives such as benzophenone, Michler's ketone, 2-methylbenzophenone, 3-methylbenzophenone, 4-methylbenzophenone, 2-chlorobenzophenone, 4-bromobenzophenone, and 2-carboxybenzophenone; acetophenone derivatives such as 2,2-dimethoxy-2-phenylacetophenone, 2,2-diethoxyacetophenone, 1-hydroxycyclohexylphenylketone, α-hydtoxy-2-methylphenylpropanone, 1-hydroxy-1-methylethyl-(p-isopropylphenyl)ketone, 1-hydroxy-1-(p-dodecylphenyl) ketone, 2-methyl-(4'-(methylthio)phenyl)-2-morpholino-1-propanone, 1,1,1-trichloromethyl-(p-butylphenyl)ketone, and 2-benzyl-2-dimethylamino-4-morpholinobutyrophenone; thioxanthone derivatives such as thioxanthone, 2-ethylthioxanthone, 2-isopropylthioxanthone, 2-chlorothioxanthone, 2,4-dimethylthioxanthone, 2,4-diethylthioxanthone, and 2,4-diisopropylthioxanthone; benzoate ester derivatives such as ethyl p-dimethylaminobenzoate, and ethyl p-diethylaminobenzoate; and the like.

As the ketal compound, there are benzyl methyl ketal, benzyl-β-methoxyethyl ethyl acetal, and the like.

As the benzoin compound, there are m benzoin isopropyl ether, benzoin isobutyl ether, benzoin methyl ether, methyl o-benzoyl benzoate, and the like.

As the acridine compound, there are 9-phenylacridine, 1,7-bis(9-acridinyl)heptane, and the like.

As the organoperoxide compound, there are, for example, trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butylhydroperoxide, cumenehydroperoxide, diisopropylbenzene hydroperoxide, 2,5-dimethylhexane-2,5-dihydroperoxide, 1,1,3,3-tetramethylbutylhydroperoxide, tert-butylcumylperoxide, dicumylperoxide, 2,5-dimethyl-2,5-di(tert-butylperoxy)hexane, 2,5-oxanoylperoxide, succinic peroxide, benzoyl peroxide, 2,4-dichlorobenzoylperoxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl)peroxydicarbonate, tert-butylperoxyacetate, tert-butylperoxypivalate, tert-butylperoxyneodecanoate, tert-butylperoxyoctanoate, tert-butylperoxylaurate, tercylcarbonate, 3,3'4,4'-tetra-(t-butylperoxycarbonyl) benzophenone, 3,3',4,4'-tetra-(t-hexylperoxycarbonyl) benzophenone, 3,3'4,4'-tetra-(p-isopropylcumylperoxycarbonyl)benzophenone, carbonyl di(t-butylperoxydihydrogendiphthalate), carbonyl di(t-hexylperoxydihydrogendiphthalate), and the like.

As the azo compound, there are, for example, azo compounds described in JP-A No. 8-108621, and the like.

As the coumarin compound, there are, for example, 3-methyl-5-amino-((s-triazin-2-yl)amino)-3-phenylcoumarin, 3-chloro-5-diethylamino-((s-triazin-2-yl)amino)-3-phenylcoumarin, 3-butyl-5-dimethylamino-((s-triazin-2-yl)amino)-3-phenylcoumarin, and the like.

As the azide compound, there are organic azide compounds described in specifications of U.S. Pat. Nos. 2,848,328, 2,852,379, and 2,940,853, 2,6-bis(4-azidebenzylidene)-4-ethylcyclohexanone (BAC-E), and the like.

As the metallocene compound, there are various titanocene compounds described in JP-A No. 59-152396, JP-A No. 61-151197, JP-A No. 63-41484, JP-A No. 2-249, JP-A No. 2-4705, and JP-A No. 5-83588, for example, di-cyclopentadienyl-Ti-bis-phenyl, di-cyclopentadienyl-Ti-bis-2,6-difluorophen-1-yl, di-cyclopentadienyl-Ti-bis-2,4-di-fluorophen-1-yl, di-cyclopentadienyl-Ti-bis-2,4,6-trifluorophen-1-yl, di-cyclopentadienyl-Ti-bis-2,3,5,6-tetrafluorophen-1-yl, di-cyclopentadienyl-Ti-bis-2,3,4,5,6-pentafluorophen-1-yl, di-methylcyclopentadienyl-Ti-bis-2,6-difluorophen-1-yl, di-methylcyclopentadienyl-Ti-bis-2,4,6-trifluorophen-1-yl, di-methylcyclopentadienyl-Ti-bis-2,3,5,6-tetrafluorophen-1-yl, di-methylcyclopentadienyl-Ti-bis-2,3,4,5,6-pentafluorophen-1-yl, iron-arene complexes described in JP-A No. 1-304453 and JP-A No. 1-152109, and the like.

As the hexaarylbiimidazole compound, there are, for example, various compounds described in specifications of JP-B-6-29285, U.S. Pat. Nos. 3,479,185, 4,311,783, 4,622,286 and the like, specifically, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, 2,2'-bis(o-trifluorophenyl)-4,4',5,5'-tetraphenylbiimidazole, and the like.

As the organoboron compound, specifically there are, for example, organoborates described in JP-A No. 62-143044, JP-A No. 62-150242, JP-A No. 9-188685, JP-A No. 9-188686, JP-A No. 9-188710, JP-A No. 2000-131837, JP-A No. 2002-107916, JP No. 2764769, JP-A No. 2002-116539, and the like, and Kunz, Martin, "Rad Tech '98. Proceeding Apr. 19-22, 1998, Chicago", an organoboron sulfonium complex or organoboron oxosulfonium complex described in JP-A No. 6-157623, JP-A No. 6-175564 and JP-A No. 6-175561, an organoboron iodonium complex described in JP-A No. 6-175554 and JP-A No. 6-175553, an organoboron phosphonium complex described in JP-A No. 9-188710, an organoboron transition metal coordination complex described in JP-A No. 6-348011, JP-A No. 7-128785, JP-A No. 7-140589, JP-A No. 7-306527, and JP-A No. 7-292014, and the like.

As the disulfone compound, there are compounds described in the specifications of JP-A No. 61-166544 and JP-A No. 2002-328465, and the like.

As the oximeester compound, there are compounds described in J. C. S. Perkin II (1979) 1653-1660, J. C. S. Perkin II (1979) 156-162, Journal of Photopolymer Science and Technology (1995) 202-232, JP-A No. 2000-66385, JP-A No. 2000-80068, PCT publication No. 2004-534797, and the like.

As the onium salt compound, for example, there are diazonium salts described in S. I. Schlesinger, Photogr. Sci. Eng., 18, 387 (1974), and T. S. Bal et al, Polymer, 21, 423 (1980); ammonium salts described in the specification of U.S. Pat. No. 4,069,055, and JP-A No. 4-365049; phosphoniums salts described in specifications of U.S. Pat. Nos. 4,069,055 and 4,069,056; iodonium salts described in specifications of E.P. No. 104,143 and U.S. Pat. Nos. 339,049, and 410,201, JP-A No. 2-150848, and JP-A No. 2-296514; and the like.

The iodonium salt which can be preferably used in the invention is a diaryliodonium salt, which is preferably substituted with two or more electron-donating groups such as an alkyl group, an alkoxy group, and an aryloxy group from the viewpoint of stability. In addition, an iodonium salt having a triarylsulfonium salt one of which the substituent has a coumalin, anthraquinone structure, as the preferred form of sulfonium salt, and having absorption band in the region of 300 nm or higher, is preferable.

As the sulfonium salt which can be preferably used, there are sulfoniums salts described in specifications of E.P. Nos. 370,693, 390,214, 233,567, 297,443, and 297,442, U.S. Pat. Nos. 4,933,377, 161,811, 410,201, 339,049, 4,760,013, 4,734,444, and 2,833,827, and Germany Patent Nos. 2,904,626, 3,604,580, and 3,604,581, which may be preferably substituted with an electron-withdrawing group from the viewpoint of sensitivity to the stability. The electron-withdrawing group preferably has the Hammett value greater than 0. The electron-withdrawing group is preferably a halogen atom, a carboxylic acid, or the like.

As the preferable sulfonium salt in addition to those above, there are sulfonium salts having a triarylsulfonium salt one of which the substituent has a coumalin, anthraquinone structure and having an absorption band in the region of 300 nm or higher. As another preferable sulfonium salt, there are sulfonium salts whose triarylsulfonium salt has an allyloxy group or arylthio group as its substitutent and having an absorption band in the region of 300 nm or higher.

Further, as the onium salt compound, there are selenonium salts described in J. V. Crivello et al, Macromolecules, 10 (6), 1307 (1977), and J. V. Crivello et al, J. Polymer Sci., Polymer Chem. Ed., 17, 1047 (1979); arsonium salts described in C. S. Wen et al, Teh, Proc. Conf. Rad. Curing ASIA, p 478 Tokyo, October (1988); and the like.

As the acylphosphine(oxide) compound, there are Irgacure 819, Darocure 4265, and Darocure TPO, manufactured by CIBA Speciality Chemicals, and the like.

As the alkylamino compound, for example, there are compounds having a dialkylaminophenyl group and alkylamine compounds, described in paragraph number [0047] of JP-A No. 9-281698, JP-A No. 6-19240, and JP-A No. 6-19249, and the like. In specific, as the compound having a dialkylaminophenyl group, there are compounds such as ethyl p-dimethylaminobenzoate, and dialkylamino phenylcarbaldehyde such as p-diethylamino benzcalbaldehyde and 9-julolidyl carbaldehyde; and as the alkylamine compounds, there are triethanolamine, diethanolamine, triethylamine, and the like.

The photopolymerization initiator (B) used in the invention is a compound selected from the group consisting of a triazine-based compound, an alkylamino compound, a benzyldimethylketal compound, an α-hydroxyketone compound, an α-aminoketone compound, an acylphosphine-based compound, a phosphineoxide-based compound, a metallocene compound, an oxime-based compound, a biimidazole-based compound, an onium-based compound, a benzothiazole-based compound, a benzophenone-based compound, an acetophenone-based compound, derivatives thereof, a cyclopentadiene-benzene-iron complex and a salt thereof, a halomethyloxadiazole compound, and a 3-aryl-substituted-coumarine compound, from the viewpoint of exposure sensitivity.

The initiator (B) is more preferably a compound selected from the group consisting of a triazine-based compound, an alkylamino compound, an α-aminoketone compound, an acylphosphine-based compound, a phosphineoxide-based compound, an oxime-based compound, a biimidazole-based compound, an onium-based compound, a benzophenone-based compound, and an acetophenone-based compound, and even more preferably at least one compound selected from the group consisting of a triazine-based compound, an alkylamino compound, an oxime-based compound, and a biimidazole-based compound.

The content of the photopolymerization initiator (B) is in the range of preferably 0.1 to 50 mass %, more preferably 0.5 to 30 mass %, and particularly preferably 1 to 20 mass %, relative to a total solid content of the curable composition of the invention. Within this range, excellent sensitivity and pattern formability can be obtained.

<Coloring Agent (C)>

The curable composition of the invention includes the coloring agent (C).

The coloring agent to be included in the curable composition of the invention is not particularly limited, and traditionally well-known various kinds of dyes and pigments can be used alone or in combination of two or more kinds. The coloring agent is preferably a pigment from the viewpoints of heat resistance, light stability, and durability.

As the pigment to be included in the curable composition of the invention, any of traditionally well-known various inorganic pigments and organic pigments can be used, which is preferable to have high transmittance.

As the inorganic pigment, there are metallic compounds such as metallic oxides, metallic complex salts, or the like, and specific examples include metallic oxides such as iron, cobalt, aluminium, cadmium, lead, copper, titanium, magnesium, chrom, zinc, and antimony, and composite oxides of the metals mentioned.

Examples of the organic pigment include:
C.I. pigment yellow 11, 24, 31, 53, 83, 93, 99, 108, 109, 110, 138, 139, 147, 150, 151, 154, 155, 167, 180, 185, 199;
C.I. pigment orange 36, 38, 43, 71;
C.I. pigment red 81, 105, 122, 149, 150, 155, 171, 175, 176, 177, 209, 220, 224, 242, 254, 255, 264, 270;
C.I. pigment violet 19, 23, 32, 39;
C.I. pigment blue 1, 2, 15, 15:1, 15:3, 15:6, 16, 22, 60, 66;
C.I. pigment green 7, 36, 37;
C.I. pigment brown 25, 28;
C.I. pigment black 1, 7;
carbon black; and the like.

For the invention, particularly the pigment having a basic N atom in a structural formula thereof is preferably used. The pigment having a basic N atom exhibits an excellent dispersibility in the composition of the invention. The reason for this is not yet fully clarified, but it is assumed to be influenced by a good compatibility between the photosensitive polymerization component and the pigment.

As the pigment which can be preferably used in the invention, the following pigments can be mentioned, but the invention is not limited to those:
C.I. pigment yellow 11, 24, 108, 109, 110, 138, 139, 150, 151, 154, 167, 180, 185;
C.I. pigment orange 36, 71;
C.I. pigment red 122, 150, 171, 175, 177, 209, 224, 242, 254, 255, 264;
C.I. pigment violet 19, 23, 32;
C.I. pigment blue 15: 1, 15:3, 15:6, 16, 22, 60, 66; and
C.I. pigment black 1.

These organic pigments can be used alone, or by variously combining them in order to enhance a color purity. Examples of the combination are shown below. For example, an anthraquinone-based pigment, a perylene-based pigment, or a diketopyrrolopyrrole-based pigment alone as a red pigment, or a mixture of at least one kind of them, and a disazo-based yellow pigment, an isoindoline-based yellow pigment, a quinophthalone-based yellow pigment or a perylene-based red pigment can be used. For example, the anthraquinone-based pigment includes C.I. Pigment Red 177, the perylene-based pigment includes C.I. Pigment Red 155, and C.I. Pigment Red 224, and the diketopyrrolopyrrole-based pigment includes C.I. Pigment Red 254. From a color reproductivity, a mixture with C.I. Pigment Yellow 139 is preferable. A mass ratio between the red pigment and the yellow pigment is preferably 100:5 to 100:50. When the ratio is 100:4 or less, it is difficult to suppress light transmittance of 400 nm to 500 nm, and a color purity cannot be enhanced in some cases. In addition, when the ratio is 100:51 or more, a main wavelength becomes towards a short wavelength, and a deviation from a NTSC goal hue becomes great in some cases. Particularly, the mass ratio is optimally in a range of 100:10 to 100:30. In the case of a combination of red pigments, the ratio can be adjusted in conformity with a chromaticity.

As a green pigment, a halogenated phthalocyanine-based pigment may be used alone or in combination with a disazo-based yellow pigment, a quinophthalone-based yellow pigment, an azomethine-based yellow pigment, or an isoindoline-based yellow pigment. Examples thereof may preferably include C.I. pigment green 7, 36, 37, and mixtures with C.I. pigment yellow 83, C.I. pigment yellow 138, C.I. pigment yellow 139, C.I. pigment yellow 150, C.I. pigment yellow 180, or C.I. pigment yellow 185. The mass ratio between the green pigment and the yellow pigment is preferably 100:5 to 100:150. Particularly, the mass ratio is optimally in the range of 100:30 to 100:120.

As the blue pigment, a phthalocyanine-based pigment can be used alone, or a mixture of this with a dioxazine-based purple pigment can be used. For example, a mixture of C.I. Pigment Blue 15:6 and C.I. Pigment Violet 23 is preferable. A mass ratio of the blue pigment and the purple pigment is preferably 100:0 to 100:30, more preferably 100:10 or less.

In addition, as a pigment for a black matrix, carbon, titanium carbon, iron oxide, and titanium oxide are used alone, or a mixture thereof is used. A combination of carbon and titanium carbon is preferable. A mass ratio of carbon and titanium carbon is preferably in a range of 100:0 to 100:60.

In the case of use for a color filter, the primary particle diameter of the pigment is preferably 100 nm or smaller from the viewpoints of color irregularity and contrast, and is preferably 5 nm or more from the viewpoint of dispersion stability. The primary particle diameter of the pigment is more preferably from 5 to 75 nm, even more preferably from 5 to 55 nm, and particularly preferably from 5 to 35 nm.

The primary particle diameter of the pigment can be determined by a well-known method such as an electron microscope.

Among these, as the preferable pigment, pigments of an anthraquinone series, an azomethine series, a benzylidene series, a cyanine series, a diketopyrrolo pyrrole series, and a phthalocyanine series can be used.

The invention is related to the curable composition for a color filter, but it is preferable to include a dye which can be uniformly dissolved in the composition as the coloring agent (C) from the viewpoint of improving color irregularities and contrast in the colored patterns.

The dye which can be used as the coloring agent included in the curable composition of the invention is not particularly limited, and well-known dyes used for color filters in the past can be used. For example, dyes disclosed in JP-A No. 64-90403, JP-A No. 64-91102, JP-A No. 1-94301, JP-A No. 6-11614, JP No. 2,592,207, specification of U.S. Pat. No. 4,808,501, specification of U.S. Pat. No. 5,667,920, specification of U.S. Pat. No. 5,059,500, JP-A No. 5-333207, JP-A No. 6-35183, JP-A No. 6-51115, JP-A No. 6-194828, JP-A No. 8-211599, JP-A No. 4-249549, JP-A No. 10-123316, JP-A No. 11-302283, JP-A No. 7-286107, JP-A No. 2001-4823, JP-A No. 8-15522, JP-A No. 8-29771, JP-A No. 8-146215, JP-A No. 11-343437, JP-A No. 8-62416, JP-A No. 2002-14220, JP-A No. 2002-14221, JP-A No. 2002-14222, JP-A No. 2002-14223, JP-A No. 8-302224, JP-A No. 8-73758, JP-A No. 8-179120, JP-A No. 8-151531, and the like, can be used.

As a chemical structure, dyes of a pyrazoleazo series, an anilinoazo series, a triphenylmethane series, an anthraquinone series, an anthrapyridone series, a benzylidene series, an oxonol series, a pyrazolotriazol series, a pyridoneazo series, a cyanine series, a phenothiazine series, a pyrrolopyrazoleazomethine series, a xanthene series, a phthalocyanine series, a benzopyran series, and an indigo series can be used.

In addition, when after pattern light exposure of the curable composition and curing of an exposed part, an unexposed part is removed with water or alkali development to form a pattern, for example, when a colored pattern of a resist or a color filter is formed, an acid dye and/or a derivative thereof can be suitably used in some cases, from a viewpoint of that a binder and a dye at a light-unirradiated part resulting from development are completely removed.

In addition, a direct dye, a basic dye, a mordant dye, an acid mordant dye, an azoic dye, a disperse dye, an oil soluble dye, a food dye and/or a derivative thereof can be also used usefully.

The acidic dye is not particularly limited as long as it is a dye having an acidic group such as sulfonic acid or carboxylic acid, but it is selected considering all the characteristics required such as the solubility to an organic solvent or developer, ability to form a salt with a basic compound, absorbance, coaction with other component in the composition, light stability, and heat resistance.

The following are examples of the acid dye, however the invention is not restricted to them. Examples include:
acid alizarin violet N;
acid black 1, 2, 24, 48;
acid blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335, 340;
acid chrome violet K;
acid Fuchsin;
acid green 1, 3, 5, 9, 16, 25, 27, 50, 58, 63, 65, 80, 104, 105, 106, 109;
acid orange 6, 7, 8, 10, 12, 26, 50, 51, 52, 56, 62, 63, 64, 74, 75, 94, 95, 107, 108, 169, 173;
acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 280, 281, 195, 308, 312, 315, 316, 339, 341, 345, 346, 349, 382, 383, 394, 401, 412, 417, 418, 422, 426;
acid violet 6B, 7, 9, 17, 19;
acid yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243, 251;
Direct Yellow 2, 33, 34, 35, 38, 39, 43, 47, 50, 54, 58, 68, 69, 70, 71, 86, 93, 94, 95, 98, 102, 108, 109, 129, 136, 138, 141;
Direct Orange 34, 39, 41, 46, 50, 52, 56, 57, 61, 64, 65, 68, 70, 96, 97, 106, 107;
Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246, 250;
Direct Violet 47, 52, 54, 59, 60, 65, 66, 79, 80, 81, 82, 84, 89, 90, 93, 95, 96, 103, 104;
Direct Blue 57, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275, 293;
Direct Green 25, 27, 31, 32, 34, 37, 63, 65, 66, 67, 68, 69, 72, 77, 79, 82;
Mordant Yellow 5, 8, 10, 16, 20, 26, 30, 31, 33, 42, 43, 45, 56, 50, 61, 62, 65;
Mordant Orange 3, 4, 5, 8, 12, 13, 14, 20, 21, 23, 24, 28, 29, 32, 34, 35, 36, 37, 42, 43, 47, 48;
Mordant Red 1, 2, 3, 4, 9, 11, 12, 14, 17, 18, 19, 22, 23, 24, 25, 26, 30, 32, 33, 36, 37, 38, 39, 41, 43, 45, 46, 48, 53, 56, 63, 71, 74, 85, 86, 88, 90, 94, 95;
Mordant Violet 2, 4, 5, 7, 14, 22, 24, 30, 31, 32, 37, 40, 41, 44, 45, 47, 48, 53, 58;
Mordant Blue 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83, 84;
Mordant Green 1, 3, 4, 5, 10, 15, 19, 26, 29, 33, 34, 35, 41, 43, 53;
Food Yellow 3; and
derivatives of these dyes.

Among the above acid dyes, dyes such as acid black 24;
acid blue 23, 25, 29, 62, 80, 86, 87, 92, 138, 158, 182, 243, 324:1;
acid orange 8, 51, 56, 74, 63;
acid red 1, 4, 8, 34, 37, 42, 52, 57, 80, 97, 114, 143, 145, 151, 183, 217, 249;
acid violet 7;
acid yellow 17, 25, 29, 34, 42, 72, 76, 99, 111, 112, 114, 116, 134, 155, 169, 172, 184, 220, 228, 230, 232, 243;
Acid Green 25 and derivatives of these dyes are preferable.

In addition to the above dyes, acid dyes of an azo series, a xanthene series, and a phthalocyanine series are also preferable, and acid dyes such as C.I. Solvent Blue 44, 38; C.I. Solvent Orange 45; Rhodamine B, and Rhodamine 110, and derivatives of these dyes are also preferably used.

Among these, the coloring agent (C) is preferably a coloring agent selected from a triallylmethane series, an anthraquinone series, an azomethine series, a benzylidene series, an oxonol series, a cyanine series, a phenothiazine series, a pyrrolopyrazoleazomethine series, a xanthene series, a phthalocyanine series, a benzopyran series, an indigo series, a pyrazoloazo series, an anilinoazo series, a pyrazolotriazolazo series, a pyridoneazo series, and an anthrapyridone series.

The content of the coloring agent in the curable composition of the invention is in the range of preferably 30 to 85 mass %, more preferably 40 to 80 mass %, and most preferably 50 to 75 mass %, when it is considered to be used for forming colored patterns of a color filter.

<Other Component>
[Other Binder Resin]

The curable composition of the invention may include other binder resin having no polymerizability (hereinbelow, simply referred to as 'binder polymer') in addition to the specific polymerizable binder (D) for the purpose of improving the coated film characteristics.

As the well-known binder polymer other than (D), linear organic polymer can be preferably used. The well-known 'linear organic polymer' can be arbitrarily used. Preferably, a linear organic polymer which is soluble or swellable in water or weak alkaline water can be selected to allow the water development or weak alkaline water development. The linear organic polymer is selected and used in accordance with its use as a coated-film forming agent, as well as an agent allowing development with water, weak alkaline water, or an organic solvent. For example, when the water-soluble organic polymer is used, water development can be carried out. Examples of such linear organic polymer include radical polymers each having a carboxylic acid group on a side chain, such as a resin obtained by homopolymerizing or copolymerizing monomers having a carboxyl group; a resin obtained by homopolymerizing or copolymerizing monomers having acid anhydride and then hydrolyzing or half esterifying or half amidating the acid anhydride unit; and epoxyacrylate obtained by modifying an epoxy resin with unsaturated monocarboxylic acid and acid anhydride, as described in JP-A No. 59-44615, JP-B No. 54-34327, JP-B No. 58-12577, JP-B No. 54-25957, JP-A No. 54-92723, JP-A No. 59-53836, and JP-A No. 59-71048. As the monomer having a carboxyl group, there are acrylic acid, methacrylic acid, itaconic acid, crotonic acid, maleic acid, fumaric acid, 4-carboxylstyrene, and the like. As the monomer having acid anhydride, there is maleic anhydride or the like.

Further, there is an acidic cellulose derivative having a carboxylic acid group on a side chain. In addition to these, adducts obtained by addition of a cyclic acid anhydride to a polymer having a hydroxyl group are also useful.

In the case of using the alkali-soluble resin as the copolymer, a compound to be copolymerized may be any monomer other than those mentioned above. Examples of other monomer include the following compounds (1) to (12).

(1) Acrylic acid esters, and methacrylic acid esters having an aliphatic hydroxyl group, such as 2-hydroxyethyl acrylate, 2-hydroxypropyl acrylate, 3-hydroxypropyl acrylate, 4-hydroxybutylacrylate, 2-hydroxyethyl methacrylate, 2-hydroxypropyl methacrylate, 3-hydroxypropyl methacrylate, and 4-hydroxybutyl methacrylate.

(2) Alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate, and propargyl acrylate.

(3) Alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate, and propargyl mathacrylate.

(4) Acrylamides or methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, vinylacrylamide, vinylmethacrylamide, N,N-diallylacrylamide, N,N-diallylmethacrylamide, allylacrylamide, and allylmethacrylamide.

(5) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(6) Vinyl esters such as vinyl acetate, vinyl chloroacetate, vinyl butyrate, and vinyl benzoate.

(7) Styrenes such as styrene, α-methylstyrene, methylstyrene, chloromethylstyrene, and p-acetoxystyrene.

(8) Vinyl ketones such as methyl vinyl ketone, ethyl vinyl ketone, propyl vinyl ketone, and phenyl vinyl ketone.

(9) Olefins such as ethylene, propylene, isobutylene, butadiene, and isoprene.

(10) N-vinylpyrrolidone, acrylonitrile, methacrylonitrile, and the like.

(11) Unsaturated imides such as maleimide, N-acryloylacrylamide, N-acetylmethacrylamide, N-propionylmethacrylamide, and N-(p-chlorobenzoyl)methacrylamide.

(12) Methacrylate-based monomer in which a hetero atom is bonded to α-position thereof. For example, compounds described in specification of JP-A No. 2002-309057, specification of JP-A No. 2002-311569.

Among these, (meth)acryl resins having an allyl group or a vinyl ester group and a carboxyl group on the side chain, alkali-soluble resins having a double bond on the side chain described in JP-A No. 2000-187322 and JP-A No. 2002-62698, and alkali-soluble resins having an amide group on the side chain described in JP-A No. 2001-242612, have excellent balance in film strength, sensitivity, and developability, thus are preferable.

In addition, urethane-based binder polymers having an acid group described in JP-B No. 7-12004, JP-B No. 7-120041, JP-B No. 7-120042, JP-B No. 8-12424, JP-A No. 63-287944, JP-A No. 63-287947, JP-A No. 1-271741, and Japanese Patent Application No. 10-116232, and urethane-based binder polymers having an acid group and a double bond on a side chain described in JP-A No. 2002-107918 are very excellent in a strength and, therefore, are advantageous in low light exposure suitability.

Acetal-modified polyvinyl alcohol-based binder polymers having an acid group described in EP No. 993966, EP No. 1204000, and JP-A No. 2001-318463 are excellent in a balance between a film strength and developability, being suitable.

Furthermore, as a water-soluble linear organic polymer, polyvinylpyrrolidone and polyethylene oxide are useful. In addition, in order to enhance a strength of a cured film, alcohol-soluble nylon, and polyether of 2,2-bis-(4-hydroxyphenyl)-propane and epichlorohydrin are also useful.

The weight-average molecular weight of other binder polymer is preferably 5,000 or greater, and more preferably in the range of 10,000 to 300,000, and the number-average molecular weight is preferably 1,000 or greater, and more preferably in the range of 2,000 to 250,000. The polydispersity (weight-average molecular weight/number-average molecular weight) is preferably 1 or greater, and more preferably in the range of 1.1 to 10.

These resins may be any of random polymer, block polymer, and graft polymer.

The binder polymer can be synthesized according to the traditionally well-known method. The solvent to be used upon the synthesis can be exemplified by tetrahydrofuran, ethylene dichloride, cyclohexanone, methyl ethyl ketone, acetone, methanol, ethanol, ethylene glycol monomethyl ether, ethylene glycol monoethyl ether, 2-methoxy ethyl acetate, diethylene glycol dimethyl ether, 1-methoxy-2-propanol, 1-methoxy-2-propylacetate, N,N-dimethylformamide, N,N-dimethylacetamide, toluene, ethyl acetate, methyl lactate, ethyl lactate, dimethyl sulfoxide, water, or the like. These solvents may be used alone or in combination of two or more kinds.

The radical polymerization initiator to be used upon the synthesis of the binder polymer according to the invention can be exemplified by well-known compounds such as azo-based initiator or peroxide initiator.

The content of the other binder polymer is in the range of preferably 5 to 60 mass %, more preferably 7 to 50 mass %, and most preferably 10 to 40 mass %, relative to a total solid content of the curable composition of the invention, from the viewpoint of balance in pigment dispersion stability over the time and developability.

The curable composition of the invention may further include optional components described below, if necessary.

[Dispersing Agent]

In the case of including the pigment in the curable composition of the invention as the coloring agent (C), a dispersing agent is preferably added from the viewpoint of improving the dispersibility of the pigment.

As the dispersing agent (pigment dispersing agent) useful in the invention, there are macromolecular dispersing agents [for example, polyamideamine and a salt thereof, polycarboxylic acid and a salt thereof, high molecular weight unsaturated acid ester, modified polyurethane, modified polyester, modified poly(meth)acrylate, (meth)acryl-based copolymer, and naphthalenesulfonic acid-formalin condensation product], polyoxyethylene alkyl phosphate ester, polyoxyethylene alkylamine, alkanolamine, pigment derivatives, and the like.

The macromolecular dispersing agent can be further classified into a linear polymer, a terminal-modified polymer, a graft-type polymer, and a block-type polymer, from the structure thereof.

The macromolecular dispersing agent adsorbs on a surface of the pigment and acts to prevent a reaggregation. Thus, those having an anchor site for a surface of the pigment, such as a terminal-modified polymer, a graft-type polymer, and a block-type polymer can be exemplified as the one having a preferable structure. The pigment derivative modifies the pigment surface, thereby being effective in enhancing the adsorption of the macromolecular dispersing agent.

Specific examples of the pigment dispersing agent useful in the invention include 'Disperbyk-101 (polyamidoamine phosphate), 107 (carboxylic ester), 110 (copolymerization product containing acid groups), 130 (polyamide), 161, 162, 163, 164, 165, 166, 170 (high molecular copolymerization products)' and 'BYK-P104, P105 (high molecular weight unsaturated polycarboxylic acid)' manufactured by BYK Chemie; 'EFKA4047, 4050, 4010, 4165 (polyurethane system), EFKA4330 and 4340 (block copolymer), 4400, 4402 (modified polyacrylate), 5010 (polyesteramide), 5765 (high molecular weight polycarboxylic acid), 6220 (aliphatic polyester), 6745 (phthalocyanine derivative), and 6750 (azo pigment derivative)' manufactured by EFKA; 'AJISPER PB-821 and PB-822' manufactured by Ajinomoto-Fine-Techno Co., Inc.; 'FLOWLEN TG-710 (urethaneoligomer)' and 'POLYFLOW No. 50E, No. 300 (acrylic-type copolymer)' manufactured by KYOEISHA CHEMICAL Co., LTD.; 'DISPARLON KS-860, 873SN, 874, #2150 (aliphatic polycarboxylic acid), #7004 (polyether ester), DA-703-50, DA-705, DA-725' manufactured by Kusumoto Chemicals, Ltd.; 'DEMOL RN, N (naphthalenesulfonate formaldehyde polycondensation), MS, C and SN-B (aromatic sulfonate formaldehyde polycondensation)', 'HOMOGENOL L-18 (polymer polycarboxylic acid)', 'EMULGEN 920, 930, 935 and 985 (polyoxyethylene nonylphenyl ether)', and 'ACETAMIN 86 (stearylamine acetate)' manufactured by Kao Corporation; 'Solsperse 5000 (phthalocyanine derivative), 22000 (azo pigment derivative), 13240 (polyester amine), 3000, 17000, 27000 (polymer having a functional part at the end), 24000, 28000, 32000 and 38500 (graft-type polymer)' manufactured by The Lubrizol Corporation; 'NIKKOL T106 (polyoxyethylene sorbitan monooleate), MYS-IEX (polyoxyethylene monostearate)' manufactured by Nikko Chemicals; and the like.

These dispersing agents may be used alone or in combination of two or more kinds. In the invention, it is particularly preferable to use the pigment derivative and the macromolecular dispersing agent in combination.

The content of the dispersing agent in the invention is in the range of preferably 1 to 100 mass %, more preferably 3 to 100 mass %, and even more preferably 5 to 80 mass %, relative to the pigment.

In specific, in the case of using the macromolecular dispersing agent, its amount to be used is in the range of preferably 5 to 100 mass % and more preferably 10 to 80 mass %, relative to the pigment. Meanwhile, in the case of using the pigment derivative, its amount to be used is in the range of preferably 1 to 30 mass %, more preferably 3 to 20 mass %, and particularly preferably 5 to 15 mass %, relative to the pigment.

In the invention, in the case of using the pigment and the dispersing agent, the total content of the pigment and the dispersing agent is in the range of preferably 35 to 90 mass %, more preferably 45 to 85 mass %, and even more preferably 50 to 80 mass %, relative to a total solid content constituting the curable composition, from the viewpoints of curing sensitivity and color density.

[Sensitizer]

The curable composition for color filter of the invention preferably includes a sensitizer for the purposes of improving the radical generation efficiency of the polymerization initiator (B) and widening the exposure wavelength. The sensitizer useful in the invention is preferably a sensitizer sensitizing the photopolymerization initiator by an electron-transfer mechanism or an energy-transfer mechanism.

The sensitizer useful in the invention can be mentioned by those belonging to the following exemplified compounds and having an absorption band in the region of 300 to 450 nm.

Preferable examples of the sensitizer include those belonging to the following compounds and having an absorption band in the region of 330 to 450 nm.

Examples include polynuclear aromatic groups (for example, phenanthrene, anthracene, pyrene, perylene, triphenylene, 9,10-dialkoxyanthracene), xanthenes (for example, fluorescein, eosin, erythrosine, Rhodamine B, rose bengal), thioxanthones (isopropyl thioxanthone, diethyl thioxanthone, chlorothioxanthone), cyanines (for example, thiacarboxyanine, oxacarboxyanine), melocyanines (for example, melocyanine, carbomelocyanine), phthalocyanines, thiazines (for example, thionine, methylene blue, toluidine blue), acridines (for example, acridine orange, chloroflavin, acriflavin), anthraquinones (for example, anthraquinone), squaliums (for example, squalium), acridine orange, coumalins (for example, 7-diethylamino-4-methylcoumarin), ketocoumalin, phenothiazines, phenazines, styrylbenzenes, azo compounds, diphenylmethane, triphenylmethane, distyrylbenzenes, carbazoles, porphyrin, spiro compounds, quinacridon, indigo, styryl, pyrylium compounds, pyrromethene compounds, pyrazolotriazole compound, benzothiazole compound, barbituric acid derivatives, thiobarbituric acid derivatives, aromatic ketone compounds such as acetophenone, benzophenone, thioxanthone, and Michler's ketone, heterocyclic compounds such as N-aryloxazolidinone, and the like. Examples further include compounds described in a specification of E.P No. 568,993, specifications of U.S. Pat. Nos. 4,508,811 and 5,227,227, JP-A No. 2001-125255, JP-A No. 11-271969, and the like.

As the more preferable example of the sensitizer, the compounds represented by the following Formulas (i) to (iv) can be mentioned.

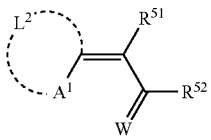
(i)

In the Formula (i), $A^1$ is a sulfur atom or $NR^{50}$, while $R^{50}$ is an alkyl group or an aryl group; $L^2$ is a non-metallic atomic group which joins to adjacent $A^1$ and adjacent carbon atom to form a basic nucleus of the dye; $R^{51}$ and $R^{52}$ are each independently a hydrogen atom or a monovalent non-metallic atomic group, where $R^{51}$ and $R^{52}$ may be bonded to each other to form an acidic nucleus of the dye; and W is an oxygen atom or a sulfur atom.

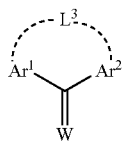
(ii)

In the Formula (ii), $Ar^1$ and $Ar^2$ are each independently an aryl group, which are linked via a bond from -$L^3$-, where $L^3$ is —O— or —S—; and W has the same meaning as that in the Formula (i).

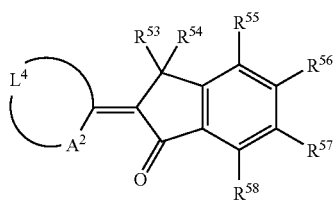
(iii)

In the Formula (iii), $A^2$ is a sulfur atom or $NR^{59}$; $L^4$ is a non-metallic atomic group which joins to adjacent A and carbon atom to form a basic nucleus of the dye; and $R^{53}$, $R^{54}$, $R^{55}$, $R^{56}$, $R^{57}$, and $R^{58}$ are each independently a group of monovalent atomic group; where $R^{59}$ is an alkyl group or an aryl group.

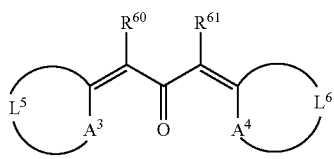
(iv)

In the Formula (iv), $A^3$ and $A^4$ are each independently —S—, —$NR^{62}$—, or $NR^{63}$—, while $R^{62}$ and $R^{63}$ are each independently a substituted or non-substituted alkyl group or a substituted or non-substituted aryl group; $L^5$ and $L^6$ are each independently a non-metallic atomic group which joins to adjacent $A^3$ and $A^4$, respectively and adjacent carbon atom, to form a basic nucleus of the dye; $R^{60}$ and $R^{61}$ are each independently a monovalent non-metallic atomic group or they may be bonded to each other to form an aliphatic or aromatic ring.

Moreover, as the sensitizer preferably included in the curable composition of the invention, at least one compound selected from the compounds represented by the following Formulas (IV) to (VI) can be mentioned in addition to those mentioned above. These may be used alone or in combination of two or more kinds.

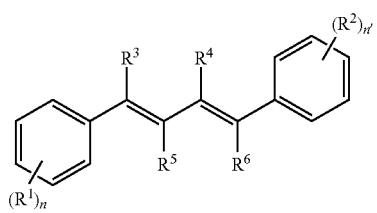
(IV)

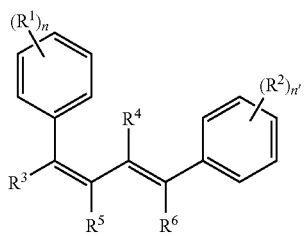
(V)

In the Formulas (IV) and (V), $R^1$ and $R^2$ are each independently a monovalent substituent; $R^3$, $R^4$, $R^5$, and $R^6$ are each independently a hydrogen atom or a monovalent substituent; and n is an integer of 0 to 5, and n' is an integer of 0 to 5, where n and n' are not 0 at the same time. When n is 2 or greater, a plurality of $R^1$s may be the same with or different from each other, and when n' is 2 or greater, a plurality of $R^2$s may be the same with or different from each other.

The compound represented by the Formula (IV) is preferably a compound represented by the following Formula (IV-1) from the viewpoints of sensitivity, and colorability in the case of including the pigment.

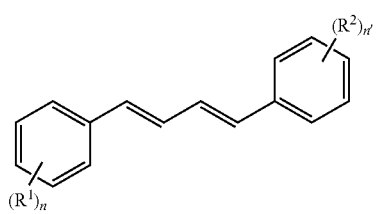
(IV-1)

In the Formula (IV-1), $R^1$ and $R^2$ are each independently a monovalent substituent; and n is an integer of 0 to 5, and n' is an integer of 1 to 5. When n is 2 or greater, a plurality of $R^1$s may be the same with or different from each other, and when n' is 2 or greater, a plurality of $R^2$s may be the same with or different from each other.

In the Formula (IV-1), the monovalent substituent represented by $R^1$ and $R^2$ has the same meaning as the monovalent substituent in the Formula (IV), and the preferable range is also the same.

For the compounds represented by the Formulas (IV) and (V), the molar extinction coefficient ε at wavelength 365 nm is preferably 500 $mol^{-1} \cdot L \cdot cm^{-1}$ or greater, more preferably 3,000 $mol^{-1} \cdot L \cdot cm^{-1}$ or greater, and most preferably 20,000 $mol^{-1} \cdot L \cdot cm^{-1}$ or greater. When the molar extinction coefficient ε at each wavelength is in the above range, sensitivity improves highly effectively from the viewpoint of light absorbance efficiency, thus is preferable.

Herein, the molar extinction coefficient ε is obtained by preparing a dye solution prepared at a 0.01 g/l concentration in a 1-metoxy-2-propanol to be used as a sample, measuring the transmission spectrum of the sample at 365 nm, and then determining the absorbance from the UV-visible absorption spectrum of the sample. The measurement device used is Cary 5G UV-Vis-MR Spectrophotometer spectroscopy altimeter, manufactured by Varian Corp.

Specific examples of the preferable compound represented by the Formula (IV) or (V) will be shown below, but the invention is not limited to these.

In the present specification, there may be a case where the chemical formula is shown as a simplified structural formula, and particularly the solid line or the like with no element or substituent indicates a hydrocarbon group. In the following specific examples, Me represents a methyl group, Et represents an ethyl group, Bu represents a butyl group, n-Bu represents an n-butyl group, and Ph represents a phenyl group.

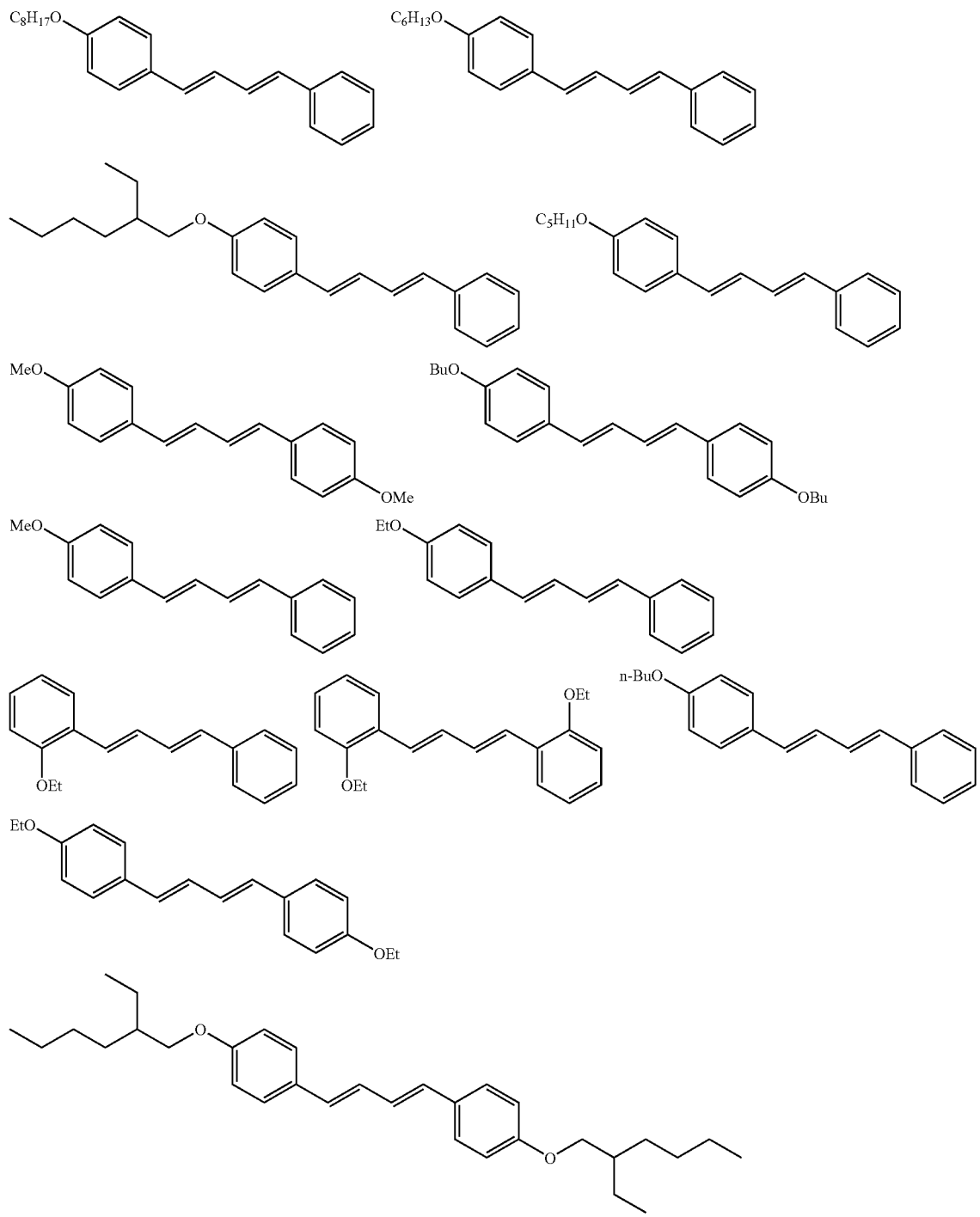

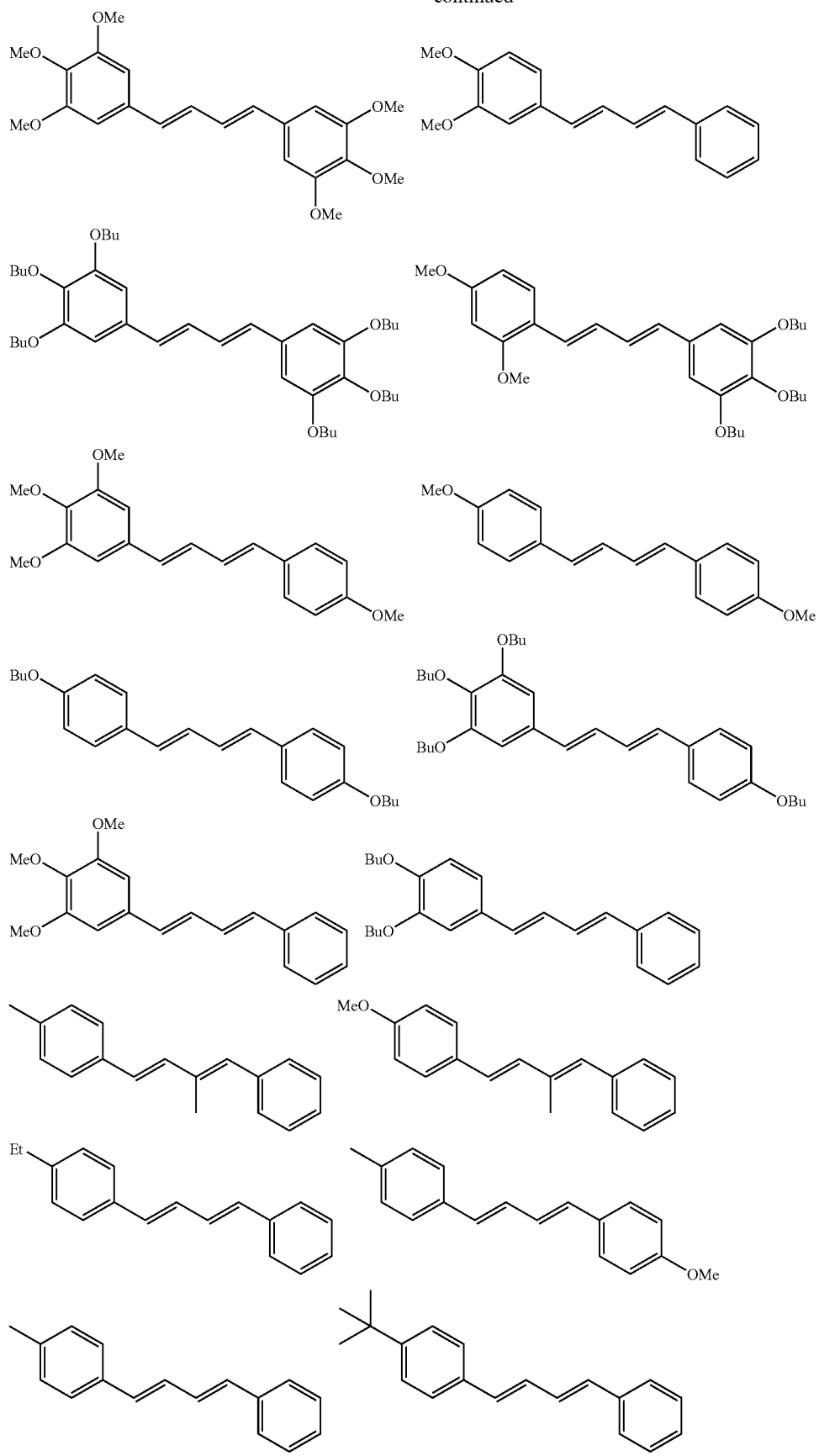

-continued
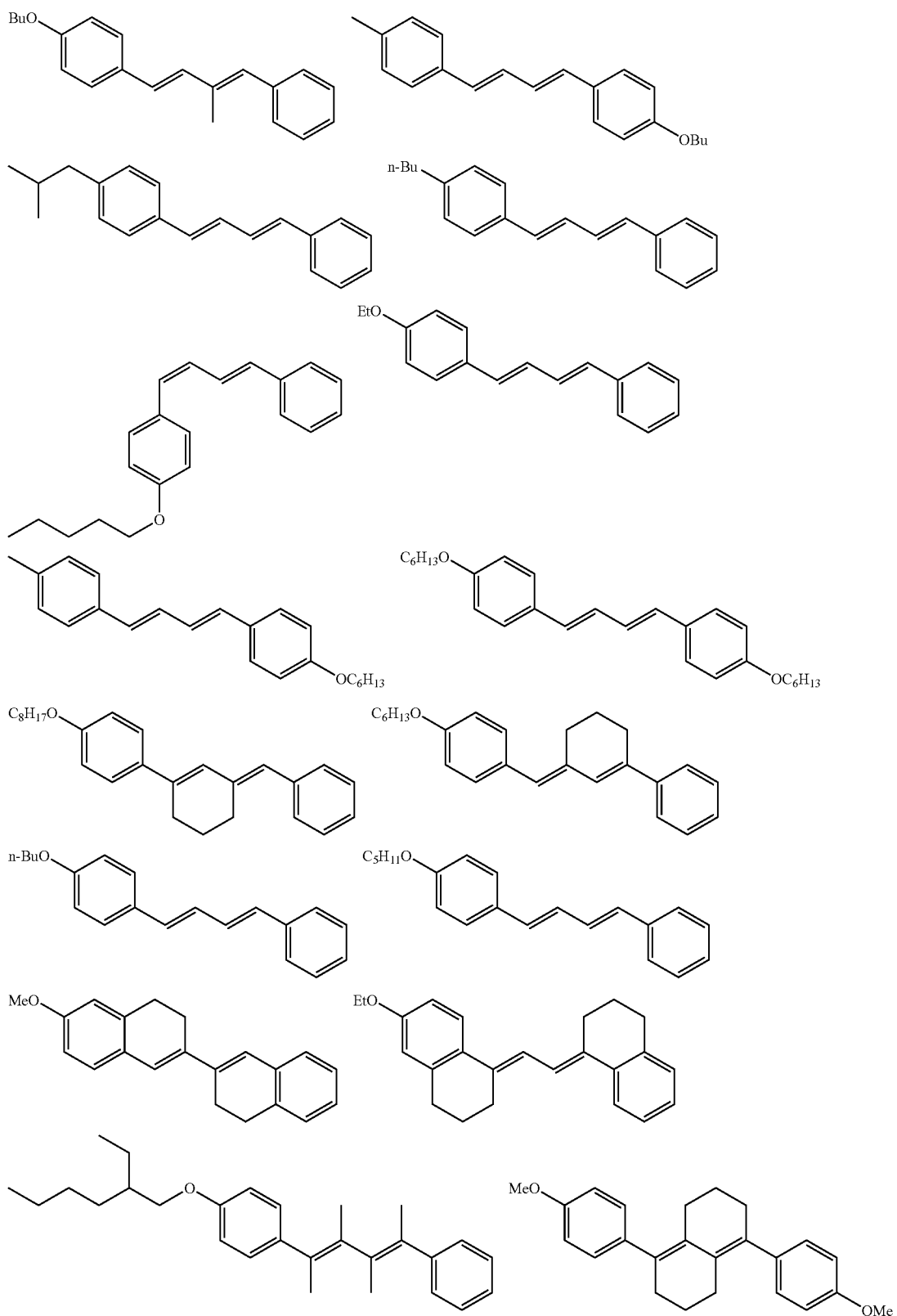

-continued
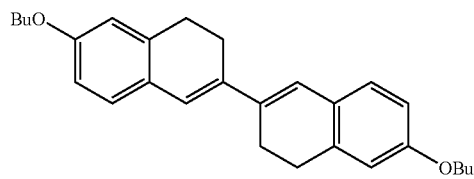
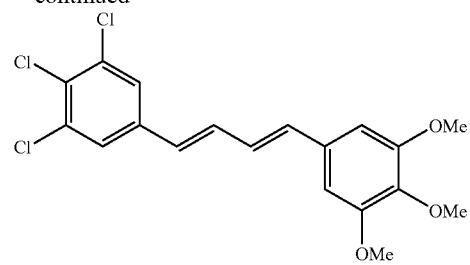
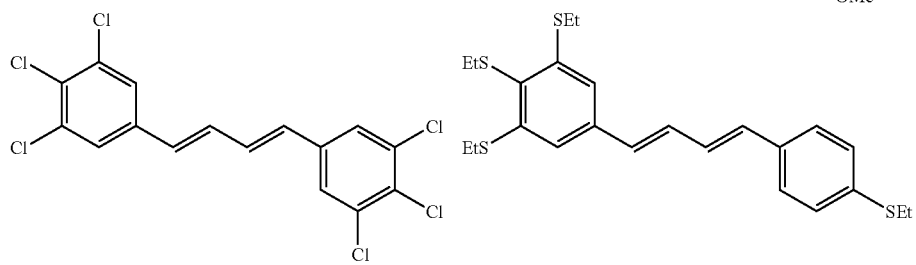
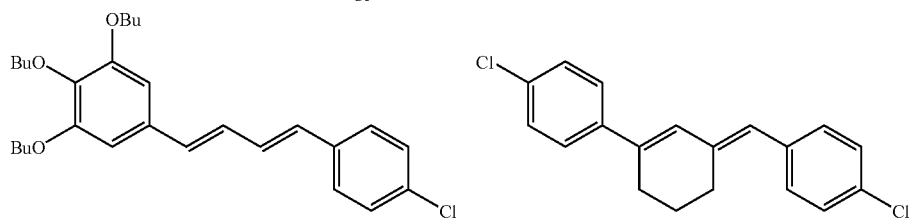
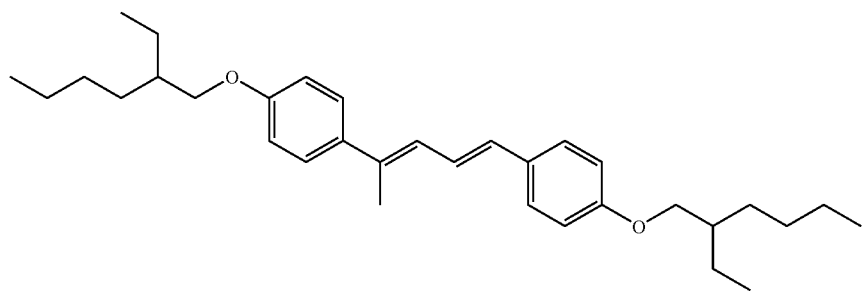
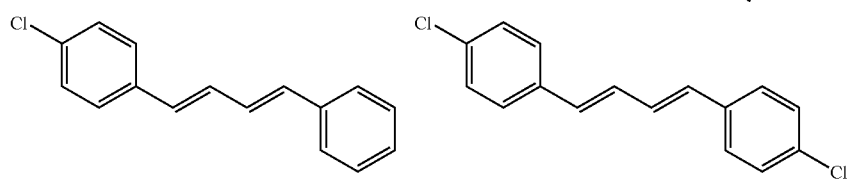
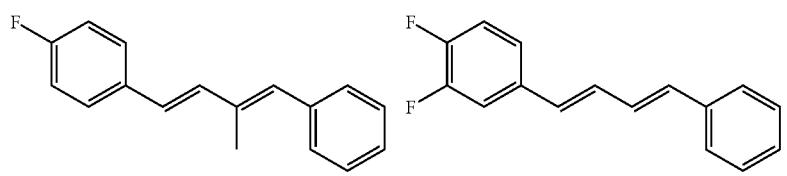
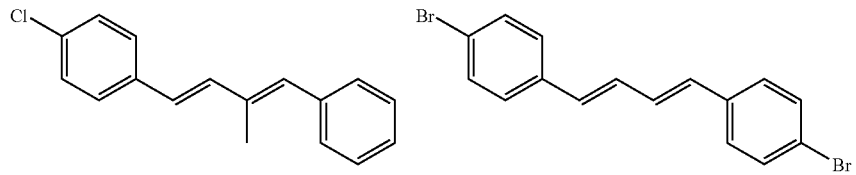
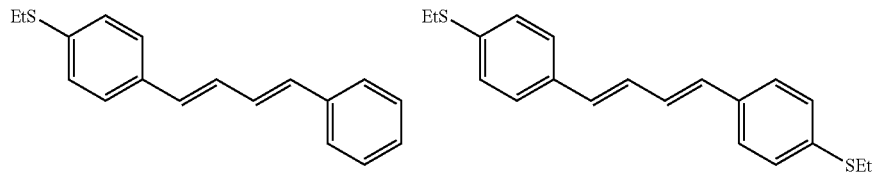

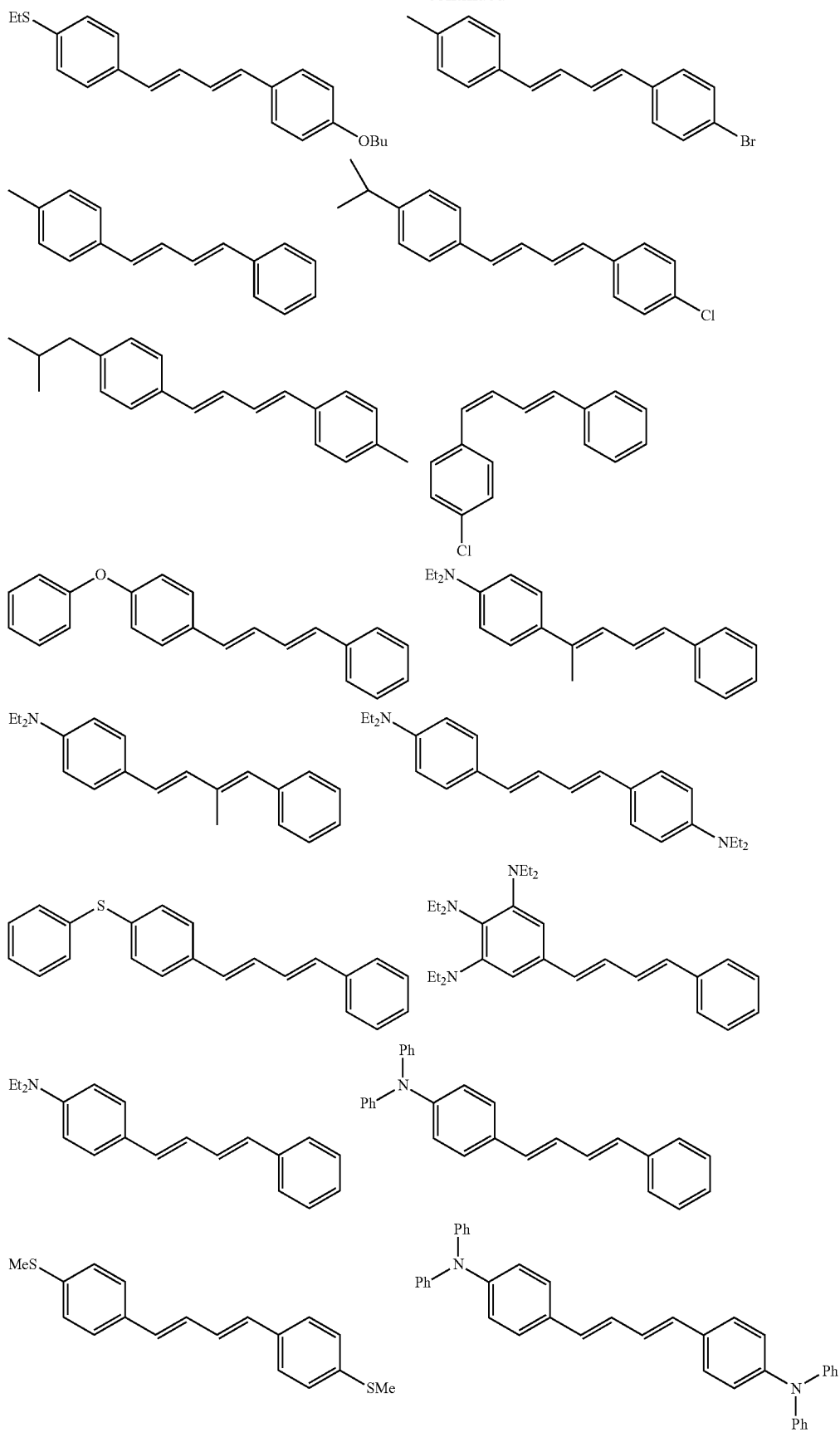

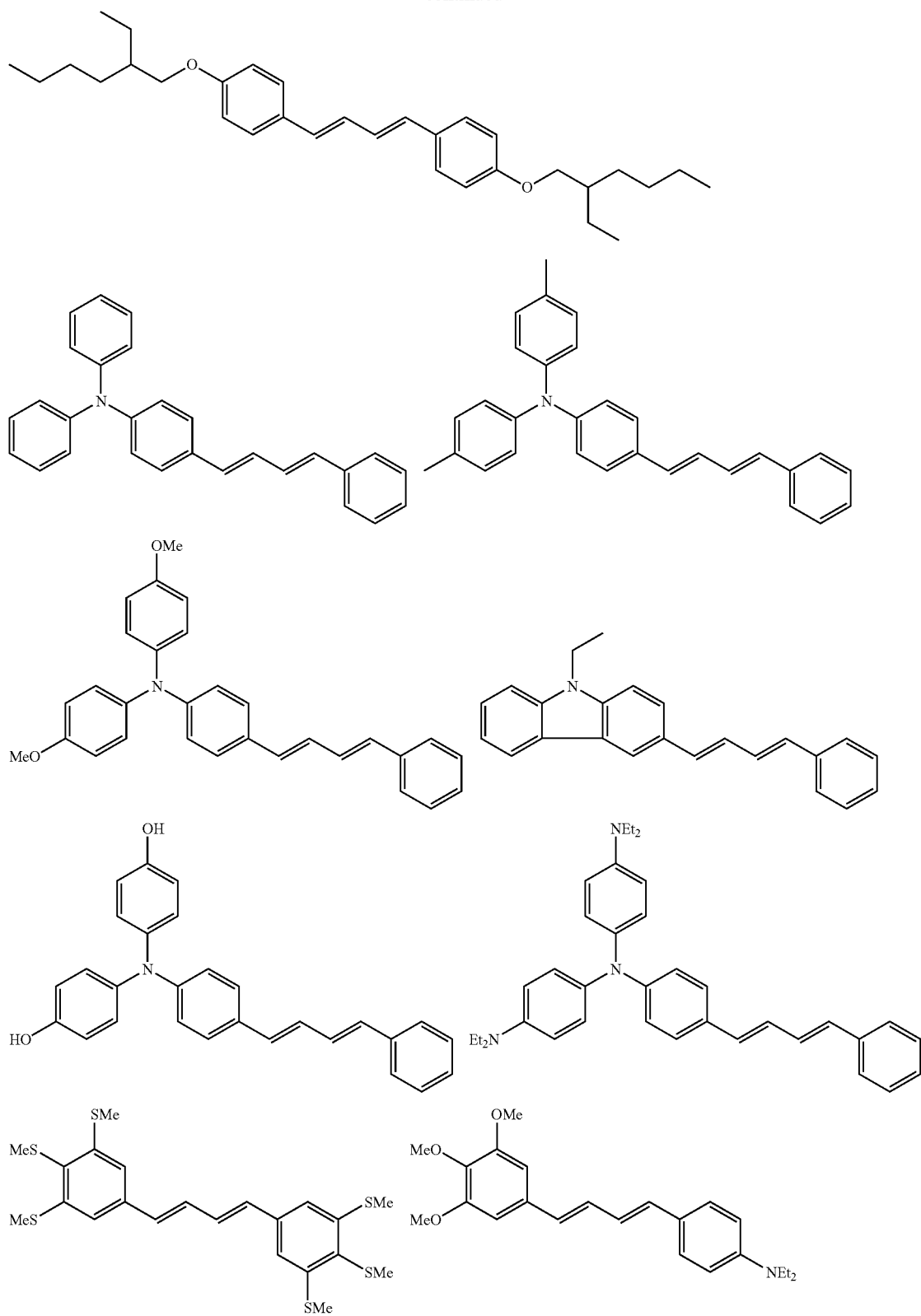

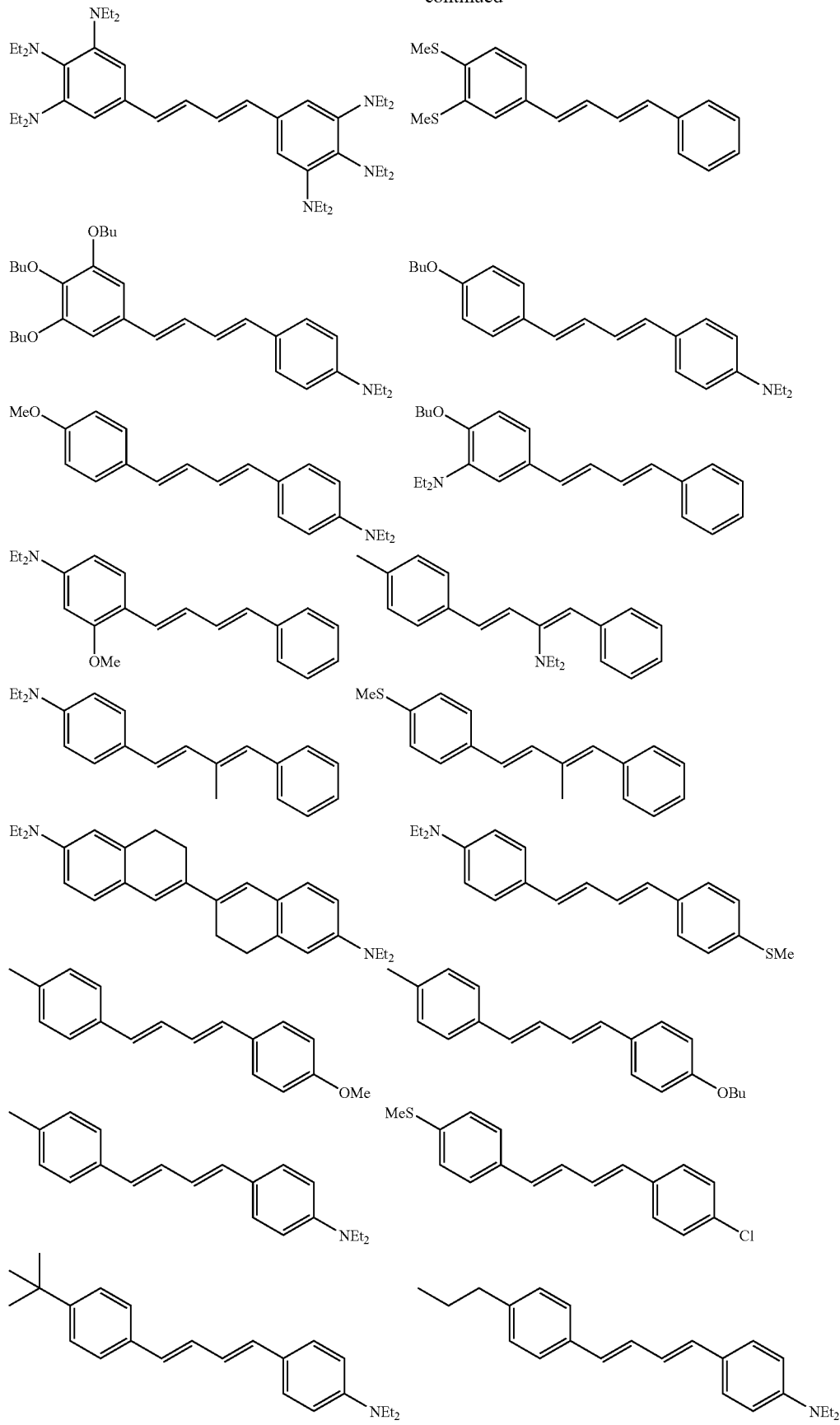

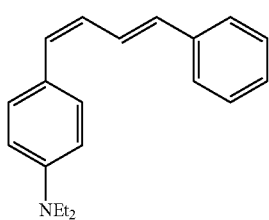
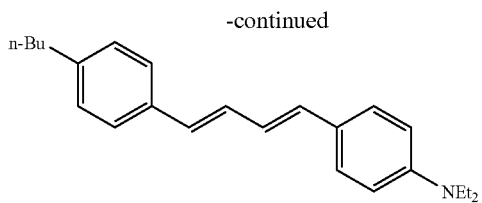

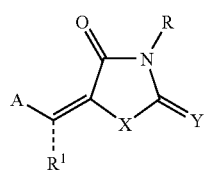
(VI)

In the Formula (VI), A is an optionally substituted aromatic ring or hetero ring; X is an oxygen atom, a sulfur atom, or —N(R³)—; Y is an oxygen atom, a sulfur atom, or —N(R³)—; and R¹, R², and R³ are each independently a hydrogen atom or a monovalent non-metallic atomic group, while A, R¹, R², and R³ may be bonded to each other to form an aliphatic or aromatic ring.

In the Formula (VI), R¹, R², and R³ are each independently a hydrogen atom or a monovalent non-metallic atomic group. When R¹, R², and R³ are each a monomavelent non-metallic atom, they are preferably a substituted or non-substituted alkyl group, a substituted or non-substituted aryl group, a substituted or non-substituted alkenyl group, a substituted or non-substituted aromatic hetrocyclic residue, a substituted or non-substituted alkoxy group, a substituted or non-substituted alkylthio group, a hydroxyl group, or a halogen atom.

In the compound represented by the Formula (VI), Y is preferably an oxygen atom or —N(R³)— from the viewpoint of improving the resolution efficiency of the photopolymerization initiator. R³ is a hydrogen atom or a monovalent non-metallic atomic group. Further Y is most preferably —N(R³)—.

Hereinbelow, specific examples (VI1) to (VI124) of the preferable compound represented by the Formula (VI) will be shown, but the invention is not limited to these. The isomer due to a double bond linking the acidic nucleus and the basic nucleus is not clarified, and the invention is not limited to any isomer.

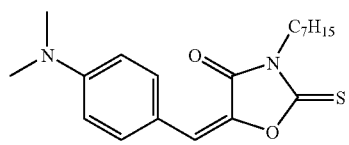
(VI1)

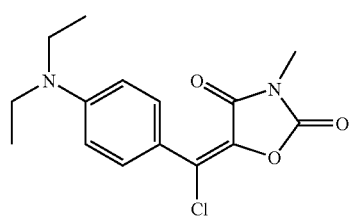
(VI2)

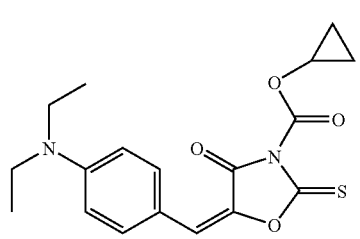
(VI3)

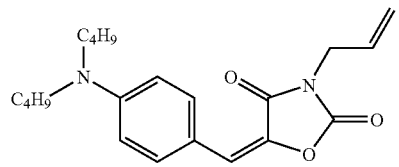
(VI4)

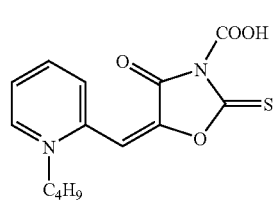
(VI5)

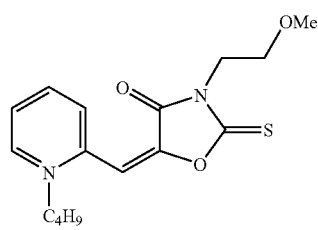
(VI6)

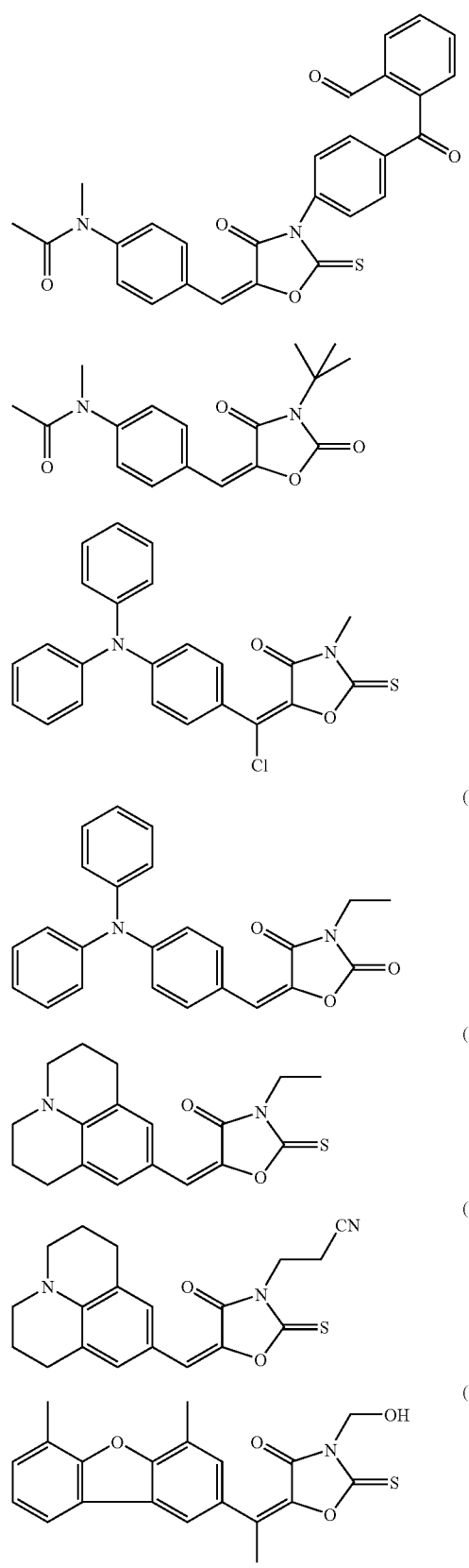
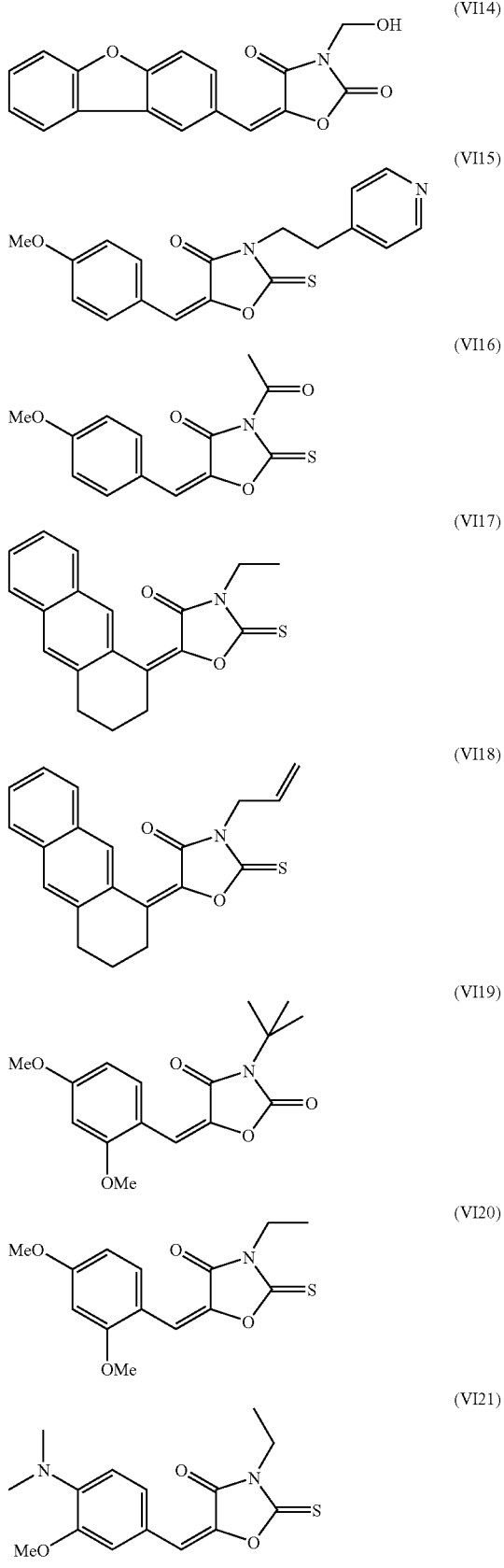

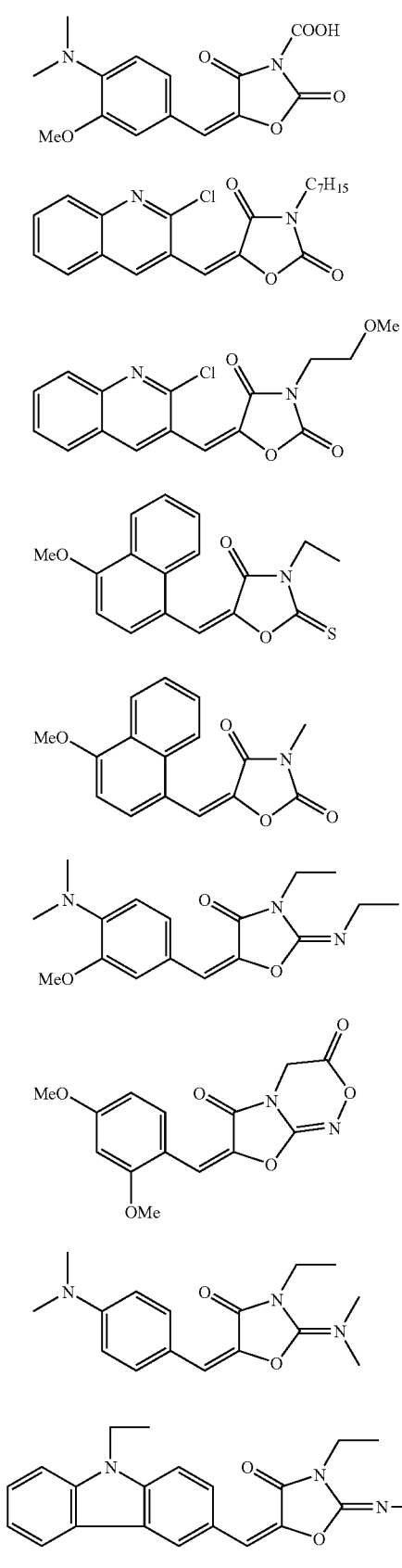
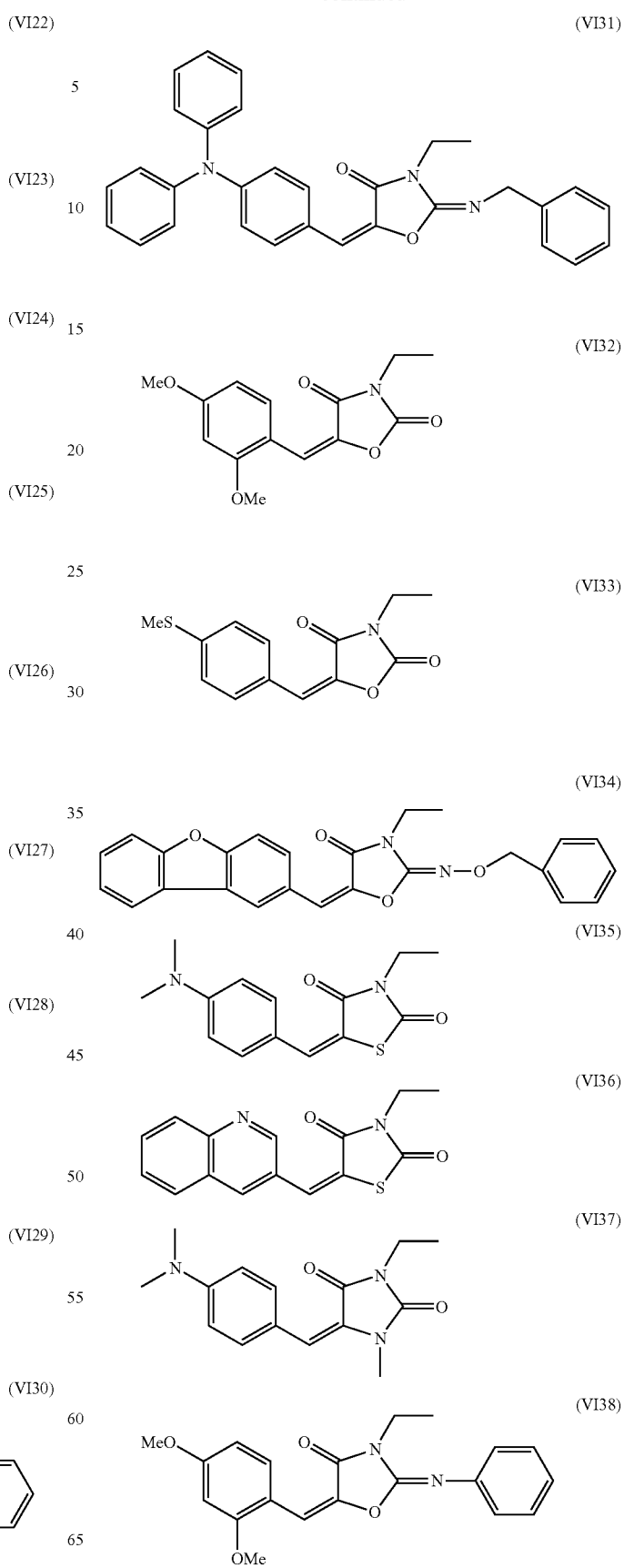

-continued
(VI39)
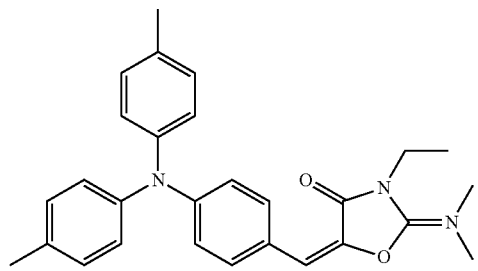
(VI40)
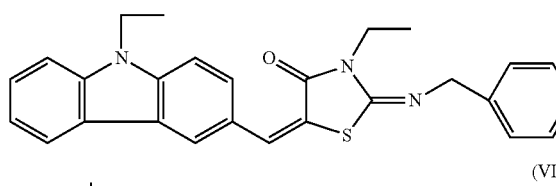
(VI41)
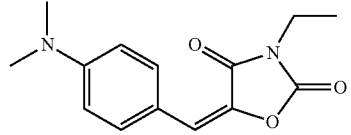
(VI42)
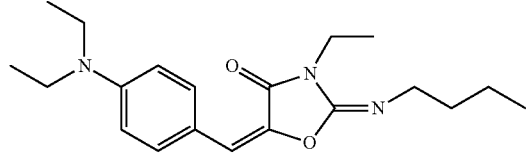
(VI43)
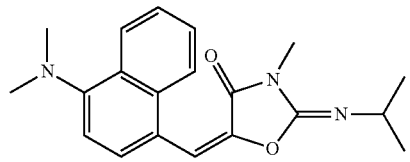
(VI44)
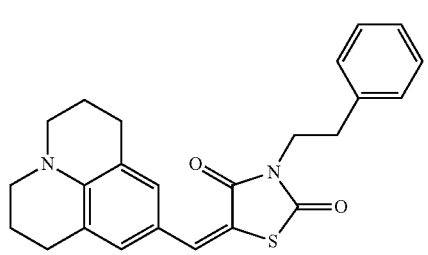
(VI45)
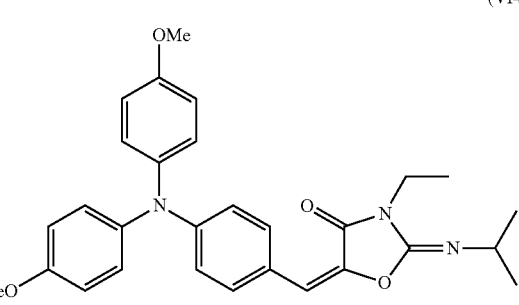
-continued
(VI46)
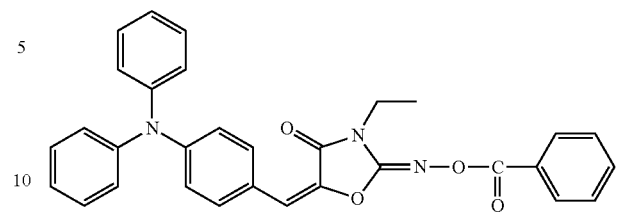
(VI47)
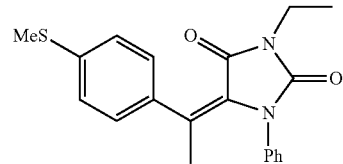
(VI48)
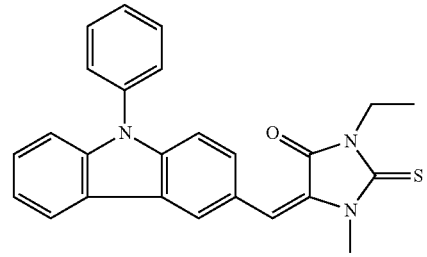
(VI49)
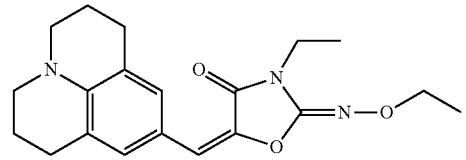
(VI50)
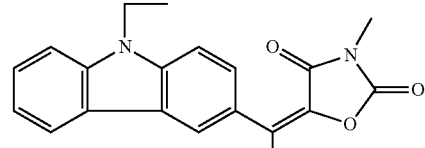
(VI51)
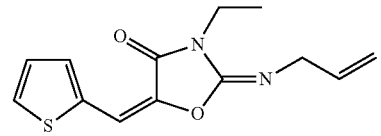
(VI52)
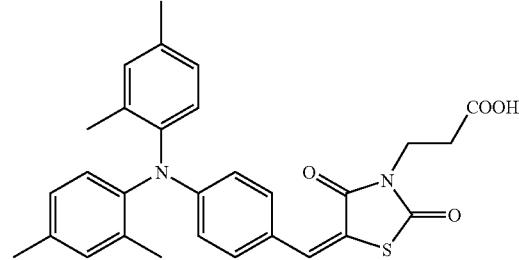

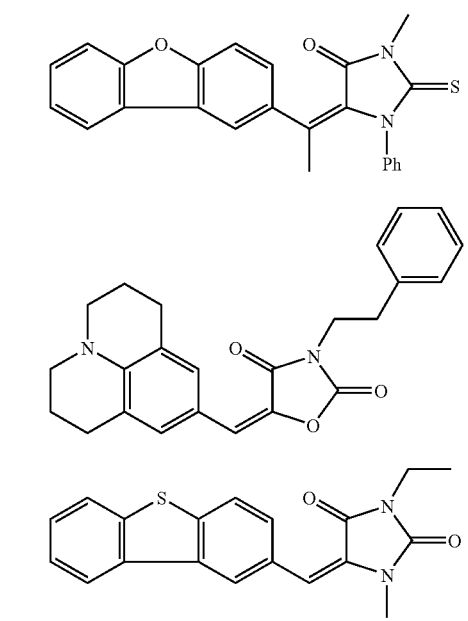
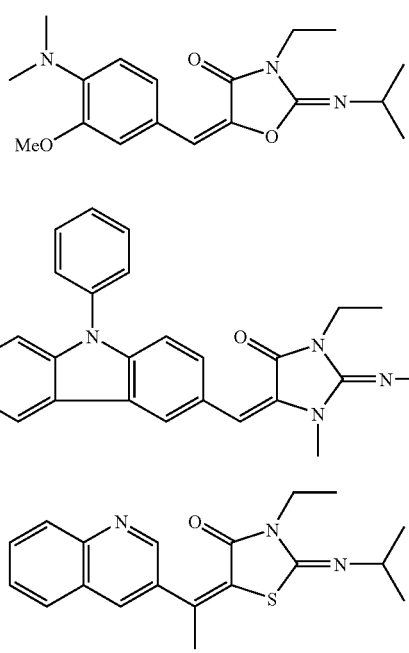
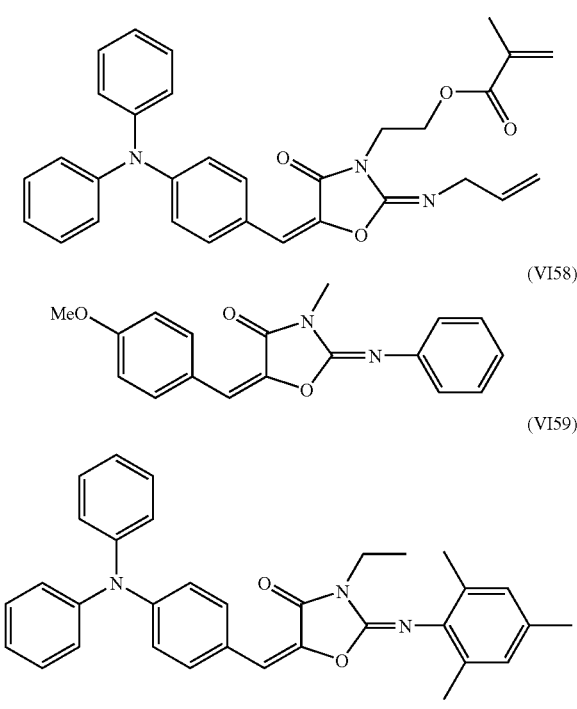
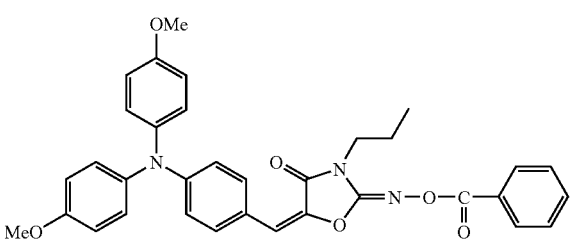

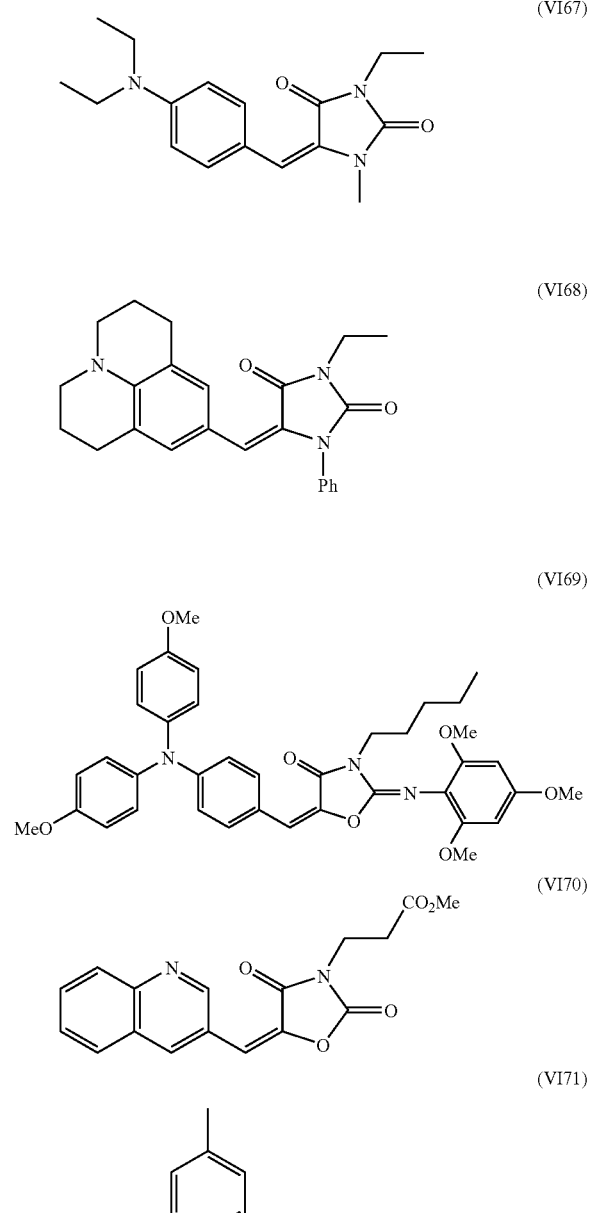
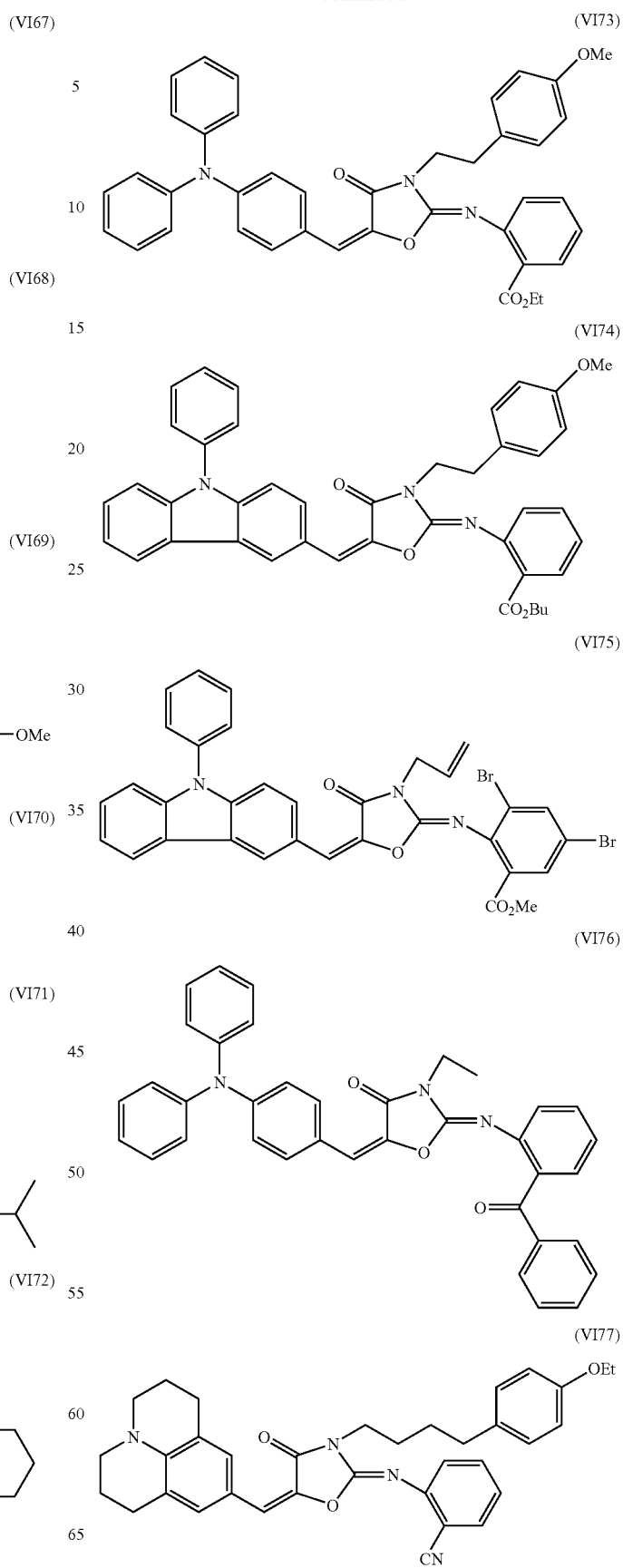

(VI78) 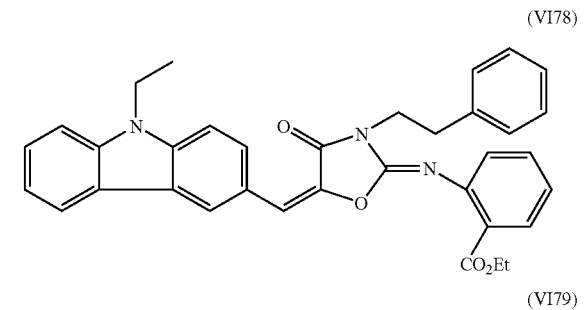
(VI79) 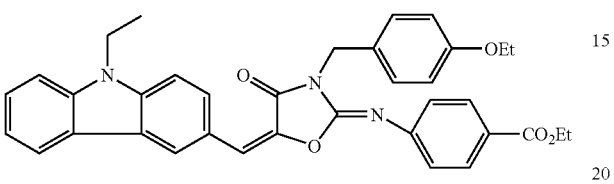
(VI80) 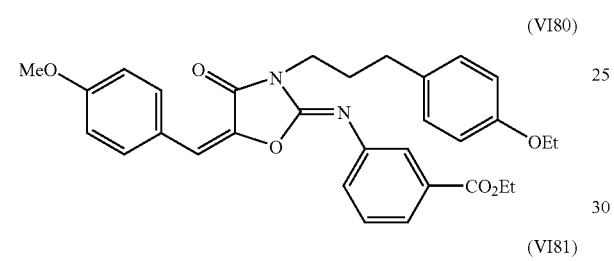
(VI81) 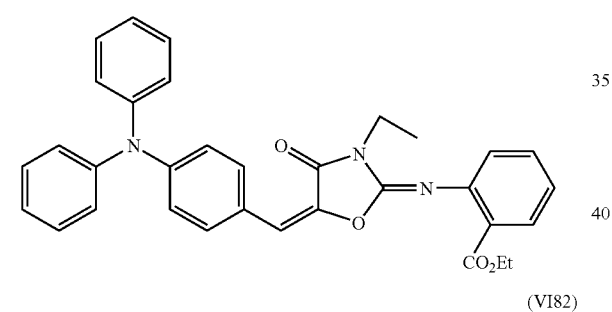
(VI82) 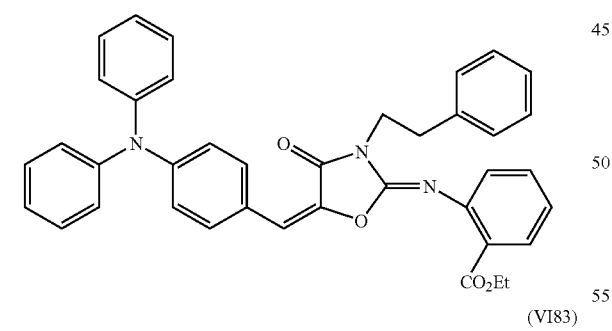
(VI83) 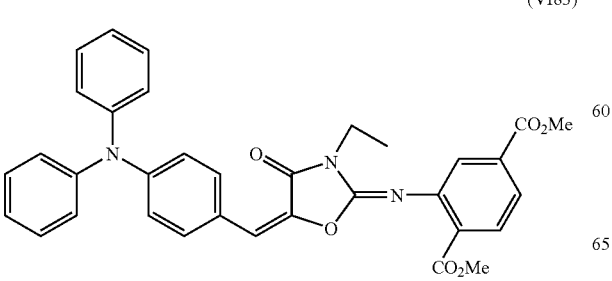
(VI84) 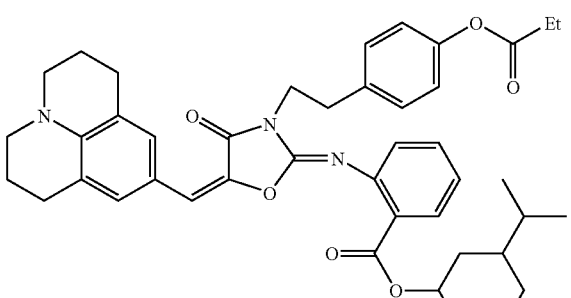
(VI85) 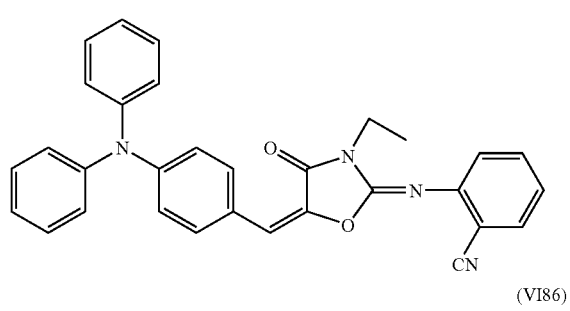
(VI86) 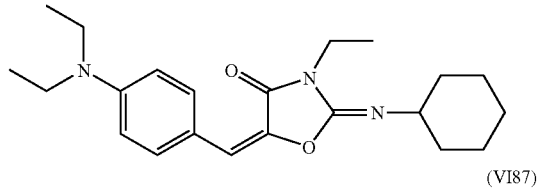
(VI87) 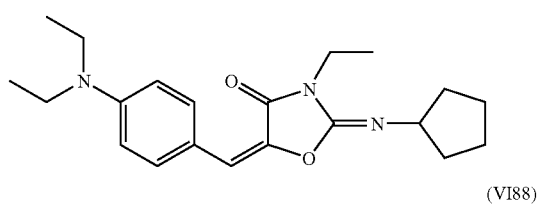
(VI88) 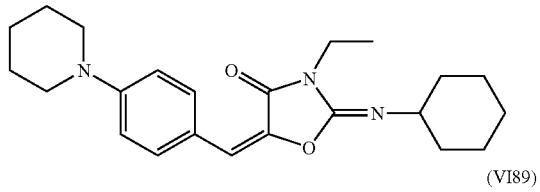
(VI89) 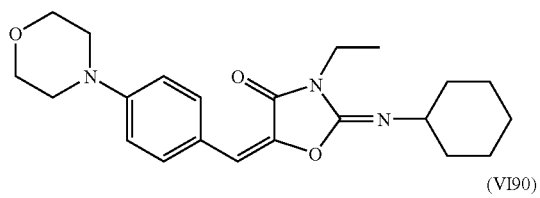
(VI90) 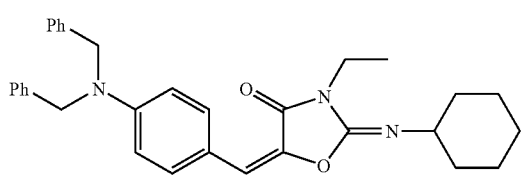

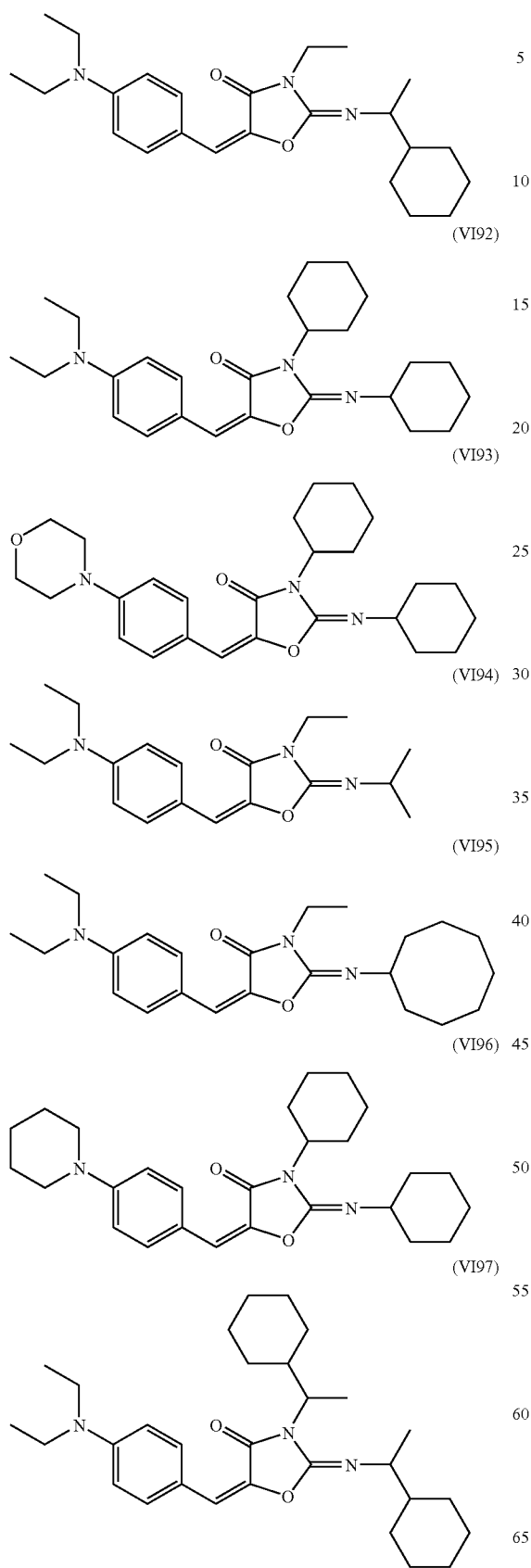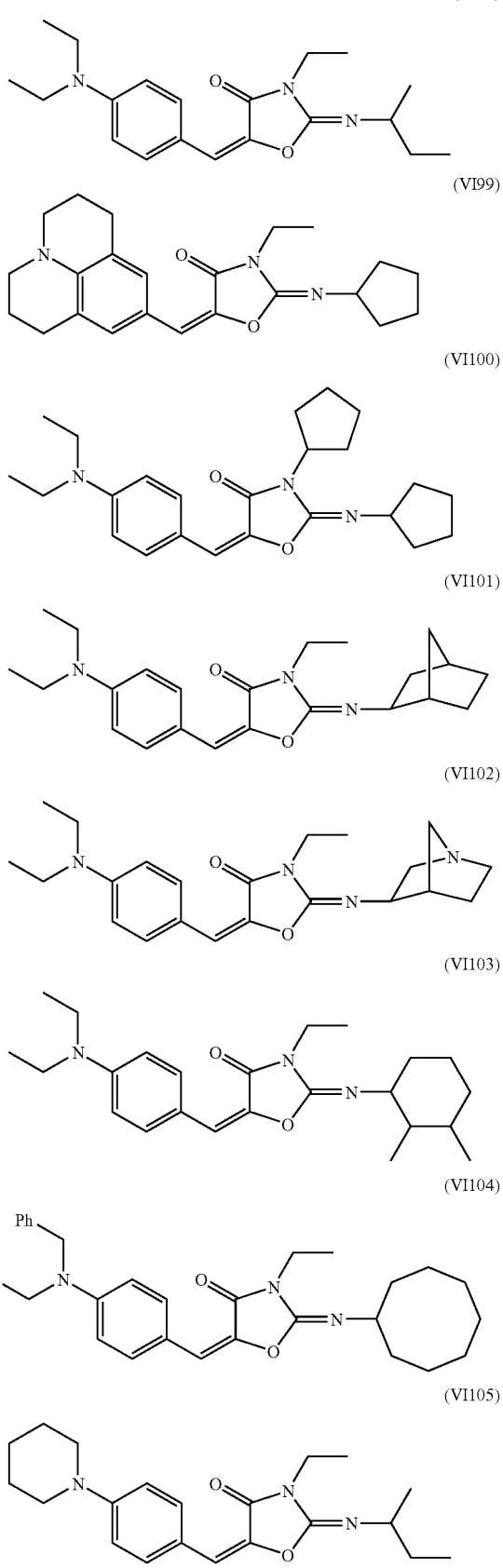

(VI016)
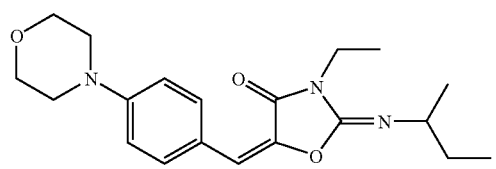
(VI107)
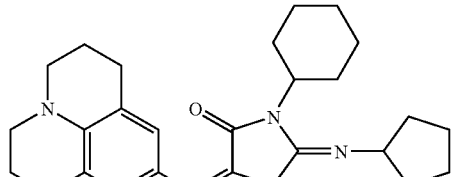
(VI108)
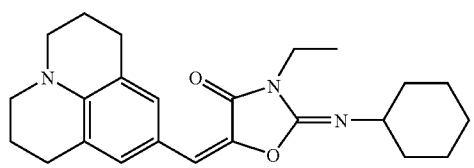
(VI109)
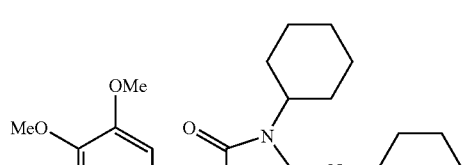
(VI110)
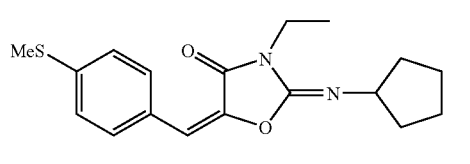
(VI111)
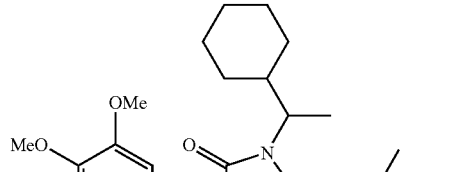
(VI112)
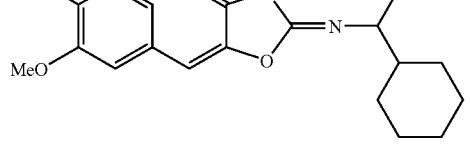
(VI113)
(VI114)
(VI115)
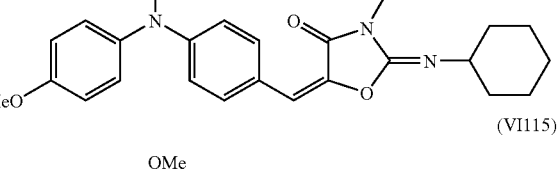
(VI116)
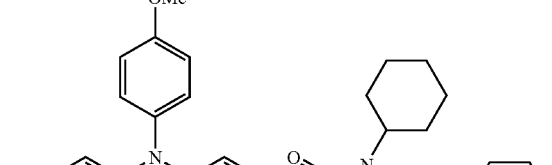
(VI117)
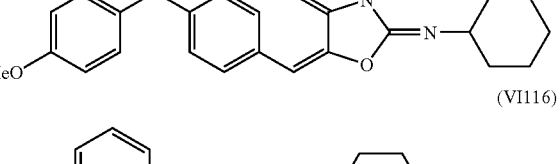
(VI118)
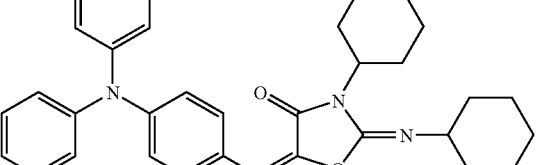

-continued

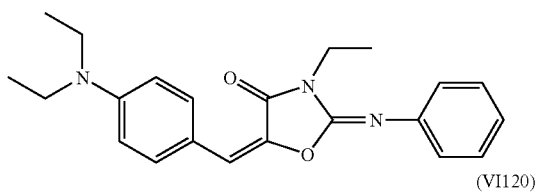
(VI119)

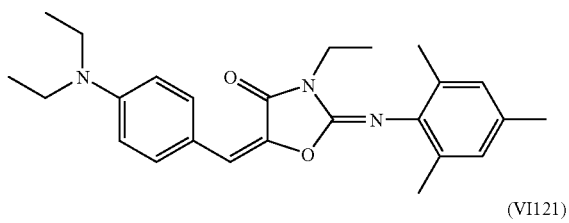
(VI120)

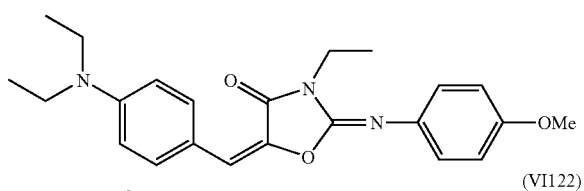
(VI121)

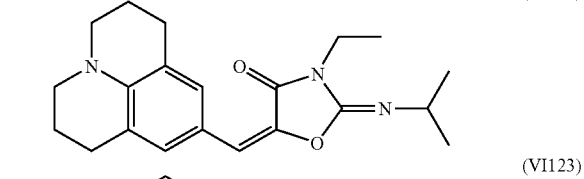
(VI122)

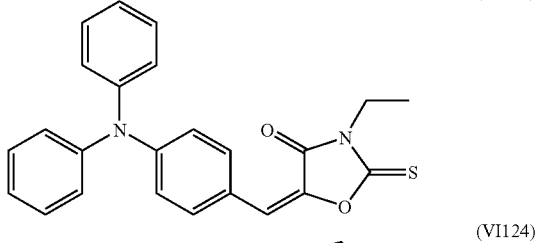
(VI123)

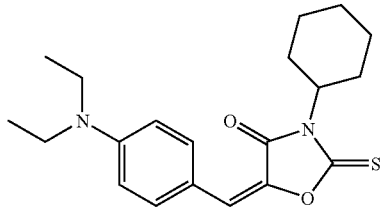
(VI124)

With respect to the compound represented by the Formula (VI) related to the invention, various chemical modifications can be subjected in order to improve the characteristics of the curable composition.

For example, the sensitizing dye and an addition-polymerizable compound structure (for example, acryloyl group or methacryloyl group) may be linked by a covalent bond, an ionic bond, a hydrogen bond, or the like, thereby strengthening the exposed film and preventing unnecessary precipitation of the sensitizing dye from the film after the exposure.

In addition, by linking the sensitizing dye and a part of the structure capable of generating radical in the photopolymerization initiator described above (for example, reduction degradable moiety such as halogenated alkyl, onium, peroxide, or biimidazole, or oxidation cleavable moiety such as borate, amine, trimethylsilylmethyl, carboxymethyl, carbonyl, or imine), the sensitivity particularly in a low-density initiation-system can be significantly increased.

In the curable composition of the invention, the compound represented by any of the Formulas (IV) to (VI) may be either employed alone or in combination of two or more kinds.

The compound represented by any of the above Formulas (IV) to (VI) shows the significant effect when it is added in the case where the pigment density in the curable composition is extremely high and the light transmittance of the colored patterns to be formed (photosensitive layer) is extremely low, specifically in the case where the light transmittance at 365 nm of the photosensitive layer formed without adding the sensitizing dye is 10% or lower. Among the compounds represented by the Formula (IV) to (VI) above, the compound represented by the Formula (VI) is most preferable, and specifically the compounds (VI56) to (VI122) are most preferable.

The sensitizer may be either used alone or in combination of two or more kinds.

The content of the sensitizer in the curable composition of the invention is in the range of preferably 0.1 to 20 mass % and more preferably 0.5 to 15 mass %, relative to a total solid content of the curable composition, from the viewpoints of the light absorbance efficiency in a deep area and the initial decomposition efficiency.

[Cosensitizing Agent]

It is also preferable that the curable composition of the invention includes a cosensitizing agent. In the invention, the cosensitizing agent has an effect on further improving the sensitivity of the sensitizing agent or initiator to active radiation, or preventing the inhibition of polymerization of the polymerizable compound due to oxygen.

Examples of such cosensitizing agent include amines, for example, compounds described in M. R. Sander et al "Journal of Polymer Society" Vol. 10, p. 3173 (1972), JP-B No. 44-20189, JP-A No. 51-82102, JP-A No. 52-134692, JP-A No. 59-138205, JP-A No. 60-84305, JP-A No. 62-18537, JP-A No. 64-33104, and Research Disclosure No. 33825, specifically triethanolamine, p-dimethylaminobenzoic acid ethyl ester, p-formyldimethylaniline, p-methylthiodimethylaniline, and the like.

Other examples of the cosensitizing agent include thiols and sulfides, for example, thiol compounds described in JP-A No. 53-702, JP-B No. 55-500806, and JP-A No. 5-142772, and disulfide compounds described in JP-A No. 56-75643, specifically, 2-mercaptobenzothiazole, 2-mercaptobenzoxazole, 2-mercaptobenzimidazole, 2-mercapto-4(3H)-quinazoline, and β-mercaptonaphthalene.

In addition, other examples of the cosensitizing agent include amino acid compounds (e.g. N-phenylglycine, etc.), organic metal compounds (e.g. tributyltin acetate, etc.) described in JP-B No. 48-42965, hydrogen donating compounds described in JP-B No. 55-34414, and sulfur compounds (e.g. trithiane, etc.) described in JP-A No. 6-308727.

The content of the cosensitizing agent is in the range of preferably 0.1 to 30 mass %, more preferably 0.5 to 25 mass %, and even more preferably 1.0 to 20 mass %, relative to a mass of total solid content of the curable composition, from the viewpoint of improving the curing rate according to the balance between polymerization growing rate and chain transfer.

[Polymerization Inhibitor]

In the invention, a small amount of heat polymerization inhibitor is desirably added to inhibit the undesired heat polymerization of the compound having a polymerizable ethylenically unsaturated double bond upon production or preservation of the curable composition.

As the heat polymerization inhibitor useful in the invention, there are hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxyamine primary cerium, and the like.

An addition amount of the heat polymerization inhibitor is preferably about 0.01% by mass to about 5% by mass relative to a mass of a total composition. If desired, in order to prevent polymerization inhibition with oxygen, a higher fatty acid derivative such as behenic acid and behenic acid amide may be added, to be unevenly distributed on a surface of a photosensitive layer during a drying process after coating. An addition amount of the higher fatty acid derivative is preferably about 0.5% by mass to about 10% by mass of a total composition.

[Other Additives]

Further, in the invention, a plasticizer or an inorganic filler to improve the properties of the cured coated film, well-known additives such as a sensitizing agent for improving the ink receptivity of a surface of the photosensitive layer, or a substrate adhesive agent for improving the substrate adhesion, may be also included.

Examples of the plasticizer include dioctylphthalate, didodecylphthalate, triethylene glycol dicaprylate, dimethyl glycol phthalate, tricresyl phosphate, dioctyl adipate, dibutyl sebacate, triacetylglycerol, and the like. In the case of employing a binder, the plasticizer can be added by 10 mass % or less relative to a total mass of the compound having ethylenically unsaturated double bond and the binder.

In the case of applying the curable composition of the invention to a hard material surface such as a substrate, an additive for improving the adhesiveness to the hard material surface (hereinafter, referred to as 'substrate adhesive agent') may be also added.

As the substrate adhesive agent, well-known materials can be used, particularly a silane-based coupling agent, a titanate-based coupling agent, or an aluminum-based coupling agent is preferably used.

As the silane coupling agent, there are, for example, γ-(2-aminoethyl)aminopropyltrimethoxysilane, γ-(2-aminoethyl)aminopropyldimethoxysilane, β-(3,4-epoxycyclohexyl)ethyltrimethoxysilane, γ-aminopropyltrimethoxysilane, γ-aminopropyltriethoxysilane, γ-methacryloxypropyltrimethoxysilane, γ-methacryloxypropyltriethoxysilane, γ-acryloxypropyltrimethoxysilane, γ-acryloxypropyltriethoxysilane, γ-isocyanatepropyltrimethoxysilane, γ-isocyanatepropyltriethoxysilane, N-β-(N-vinylbenzylaminoethyl)-γ-aminopropyltrimethoxysilane hydrochloride, γ-glycidoxypropyltrimethoxysilane, γ-glycidoxypropyltriethoxysilane, aminosilane, γ-mercaptopropyltrimethoxysilane, γ-mercaptopropyltriethoxysilane, methyltrimethoxysilane, methyltriethoxysilane, vinyltriacetoxysilane, γ-chloropropyltrimethoxysilane, hexamethyldisilazane, γ-anilinopropyltrimethoxysilane, vinyltrimethoxysilane, vinyltriethoxysilane, vinyltris(β-methoxyethoxy)silane, octadecyldimethyl[3-(trimethoxysilyl)propyl]ammonium chloride, γ-chloropropylmethyldimethoxysilane, γ-mercaptopropylmethyldimethoxysilane, methyltrichlorosilane, dimethyldichlorosilane, trimethylchlorosilane, 2-(3,4-epoxycyclohexyl)ethyltrimethoxysilane, bisallyltrimethoxysilane, tetraethoxysilane, bis(trimethoxysilyl)hexane, phenyltrimethoxysilane, N-(3-acryloxy-2-hydroxypropyl)-3-aminopropyltriethoxysilane, N-(3-methacryloxy-2-hydroxypropyl)-3-aminopropyltriethoxysilane, (methacryloxymethyl)methyldiethoxysilane, (acryloxymethyl)methyldimethoxysilane, and the like.

Among these, preferred are γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane, and phenyltrimethoxysilane, and most preferred is γ-methacryloxypropyltrimethoxysilane.

As the titanate coupling agent, there are, for example, isopropyltriisostearoyl titanate, isopropyltridecylbenzenesulfonyl titanate, isopropyltris(dioctylpyrophosphate)titanate, tetraisopropylbis(dioctylphosphite)titanate, tetraoctylbis(ditridecylphosphite)titanate, tetra(2,2-diallyloxymethyl)bis(di-tridecyl)phosphate titanate, bis(dioctylpyrophosphate)oxyacetate titanate, bis(dioctylpyrophosphate)ethylene titanate, isopropyltrioctanoyl titanate, isopropyldimethacrylisostearoyl titanate, isopropylisostearoyldiacryl titanate, triisopropyltri(dioctylphosphate)titanate, isopropyltricumylphenyl titanate, isopropyltri(N-amidoethyl aminoethyl)titanate, dicumylphenyloxyacetate titanate, diisostearoylethylene titanate, and the like.

As the aluminum-based coupling agent, there are, for example, acetoalkoxyaluminum diisopropylate, and the like.

The content of the substrate adhesive agent is in the range of preferably 0.1 to 30 mass %, more preferably 0.5 to 20 mass %, and particularly preferably 1 to 10 mass %, relative to a total solid content of the curable composition of the invention, from the viewpoint of preventing a residue to be remained on an unexposed area of the curable composition.

The curable composition of the invention cures with high sensitivity, as well as is excellent in storage stability. In addition, the curable composition is particularly useful in forming colored patterns of a color filter since high adhesiveness to a surface of the hard material such as a substrate to which the curable composition is applied is exhibited.

<Color Filter and Manufacturing Method of the Same>

Then, the color filter of the invention, and a process for manufacturing the same will be explained.

The color filter of the invention is characterized in that it has a colored pattern using the curable composition of the invention on a support.

Then, the color filter of the invention will be described in detail by referring to a process for manufacturing the same (process for manufacturing the color filter of the invention).

The invention is characterized by comprising steps of forming a colored film formed from the curable composition by applying the curable composition of the invention onto a support; exposing the colored film through a mask; and developing the exposed colored film to form colored patterns.

Hereinbelow, each step in the manufacturing method of the invention will be explained.

<Colored Film Forming Step>

In the step of forming a colored film, the curable composition of the invention is applied onto a support to form a colored film formed from the curable composition.

Examples of the support which can be used in the present step include a soda glass, a Pyrex (registered trademark) glass, a quartz glass and those glasses with a transparent conduction film attached thereto which are used in a liquid crystal display element, a photoelectric conversion element substrate used in an image pickup element, for example, a silicon substrate, and a complementary metal oxide film semiconductor (CMOS). On these substrates, a black stripe, which isolates each pixel, is formed in some cases.

If necessary, on these supports, an undercoating layer may be set for improving adhesion with an upper layer, preventing diffusion of a substance, and flattening a substrate surface.

As the method of applying the curable composition of the invention onto a support, there are various application methods to be employed such as slit coating, inkjet process, turn-over coating, flow casting coating, coating with a roller, screen printing, and the like.

The film thickness just after the application of the curable composition of the invention is in the range of preferably 0.1 to 10 μm, more preferably 0.2 to 5 μm, and even more preferably 0.2 to 3 μm, from the viewpoints of giving a uniform film thickness for the coated film and easily drying a coating solvent.

Drying (pre-baking) of the colored film (curable composition film) coated on a substrate can be carried out in a hot plate, an oven, or the like, at a temperature between 50 and 140° C. for 10 to 300 seconds.

The coated film thickness of the curable composition after being dried (hereinafter, referred to as 'dry film thickness'), in the case of being employed for a color filter for LCD, is in the range of preferably 0.1 to less than 2.0 μm, more preferably 0.2 to 1.8 μm, and particularly preferably 0.3 to 1.75 μm, from the viewpoints of capability to be formed into flat LCD and insuring the color density.

In the case of being employed for a color filter for IS, the thickness is in the range of preferably 0.05 to less than 1.0 μm, more preferably 0.1 to 0.8 μm, and particularly preferably 0.2 to 0.7 μm, from the viewpoints of attaining color density and reducing problems such as diagonal light is not reaching a light-receiving area or concentration difference of light between the end and the center of a device becomes significant.

<Exposing Step>

In the exposing step, the colored film (curable composition film) formed in the above-mentioned colored film-forming step is exposed through a mask having a predetermined mask pattern.

For the exposure in the present step, the pattern exposure of the coated film can be carried out by exposing through a predetermined mask pattern, curing only an irradiated area of the coated film, developing with a developer, and thereby forming a pattern coated film comprising pixels of each color (3 or 4 colors). As the radiation which can be used in exposure, particularly, UV ray radiation such as g-ray, i-ray, or the like, is preferable. The dose of irradiation is in the range of preferably 5 to 1,500 mJ/cm$^2$, more preferably 10 to 1,000 mJ/cm$^2$, and most preferably 10 to 500 mJ/cm$^2$.

When the color filter of the invention is for a liquid crystal display device, the irradiation dose is in the range of preferably 5 to 200 mJ/cm$^2$, more preferably 10 to 150 mJ/cm$^2$, and most preferably 10 to 100 mJ/cm$^2$. When the color filter of the invention is for a solid-state image pickup device, the irradiation dose is in the range of preferably 30 to 1,500 mJ/cm$^2$, more preferably 50 to 1,000 mJ/cm$^2$, and most preferably 80 to 500 mJ/cm$^2$.

<Developing Step>

When an alkali developing treatment (developing step) is subsequently carried out, a light unirradiated part by the exposure is eluted with an aqueous alkali solution to leave only the light cured part. The developer is desirably an organic alkali developer not causing damage on a circuit of the substrate or the like. The developing temperature is usually from 20 to 30° C., and the developing time is usually from 20 to 90 seconds.

Examples of the alkali agent useful in the developer include organic alkali compounds such as aqueous ammonia, ethylamine, diethylamine, dimethylethanolamine, tetramethylammonium hydroxide, tetraethylammonium hydroxide, choline, pyrrole, piperidine, and 1,8-diazabicyclo-[5,4,0]-7-undecene, and these alkali agents diluted with pure water such that the alkali agent concentration is in the range of 0.001 to 10 mass %, preferably 0.01 to 1 mass %, thereby giving an aqueous alkali solution, can be used preferably as a developer. When such aqueous alkali solution is used as a developer, the colored pattern is usually washed with water (rinsed).

Subsequently, a surplus developer is washed out, and the washed film is dried.

In the manufacturing method of the invention, curing step which includes curing by heating (post-baking) and/or exposing the formed colored patterns may be also subjected, if necessary, after carrying out the aforementioned colored-layer forming step, exposing step, and developing step.

Post-baking is heat treatment after development for completing curing, and heat curing treatment at 100° C. to 240° C. is usually performed. When a substrate is a glass substrate or a silicon substrate, 200° C. to 240° C. is preferable in the above temperature range.

This post-baking treatment can be performed continuously or in a batch manner using a heating means such as a hot plate, a convection oven (hot air circulating dryer), and a high frequency heating machine so that the coated film after development is placed under the above condition.

A color filter having desired hues can be prepared by repeating the above-described steps of colored-film forming step, exposing step, and developing process (further, curing step when necessary) only a number of times corresponding to the number of desired hues.

For the application of the curable composition of the invention, only the application to pixels for a color filter is mainly mentioned, but there is no doubt that the curable composition is also applicable to a black matrix provided between pixels of a color filter. The black matrix can be formed in the same manner to the method of preparing pixels, such as by enhancing curing of a film by subjecting pattern exposure, alkali development, and then post baking, except in the case where a black pigment such as carbon black or titanium black added agent is employed in the curable composition of the invention as the coloring agent.

Since the color filter of the invention employs the curable composition of the invention, the formed colored patterns exhibit a high adhesiveness to a support substrate, and since the cured composition is excellent in developability, excellent exposure sensitivity and adhesiveness to a substrate of an exposed part are exhibited, thereby forming a high resolution pattern providing a desired cross-sectional shape. Accordingly, the invention is suitable for liquid crystal displays and solid-state image pickup devices such as CCD, particularly suitable for a high resolution CCD device, CMOS, or the like having 1,000,000 pixels or more. The color filter of the invention may be used as, for example, a color filter disposed between the light-receiving part of pixels constituting the CCD and micro-lenses for converging the light.

EXAMPLES

Hereinbelow, the invention will be described in more detail with reference to Examples, but the invention is not limited by these.

Synthesis Example of Compound Having Specific Functional Group

Synthesis of Compound (i-1)

To a 500 ml three-necked flask charged with 58.6 g of 2-hydroxyethylmethacrylate, 250 ml of acetone was added, and the mixture was stirred. Thereto, 39.2 g of pyridine and 0.1 g of p-methoxyphenol were added, and then cooled in an ice bath filled with ice water. When the mixed solution reached 5° C. or below, 114.9 g of bromide 2-bromoisobutane was added dropwisely through dripping funnel over 3 hours. After the dropwise addition, the ice bath was removed and the mixed solution was further stirred for 3 hours. The reaction mixture was poured into 750 ml of water, and stirred for 1 hour. The water-mixed solution was extracted three times with 500 ml of ethyl acetate using a separating funnel. The organic layer was washed with 500 ml of 1M hydrochloric acid, 500 ml of a saturated aqueous solution of sodium bicarbonate, and 500 ml of saturated brine, in the said order. To the organic layer, 100 g of magnesium sulfate was added for dehydration, and then the dried resultant was filtered. The solvent was distilled off under reduced pressure to obtain 120.3 g of a residue. The obtained residue was Compound (i-1) which was confirmed by $^1$H-NMR, IR, and mass spectrometry spectrum. The purity obtained by HPLC was 95%.

Synthesis of Compound (i-6)

To a 1,000 ml three-necked flask, 174.2 g of diethyleneglycolmethacrylate, 138.0 g of potassium carbonate, 0.1 g of p-methoxyphenol, and 400 ml of acetone were charged, and the mixture was cooled in an ice bath filled with ice water. When the solution temperature reached 5° C. or below, 229.9 g of bromide 2-bromoisobutane was added dropwisely through dripping funnel over 1.5 hours. After the dropwise addition, the ice bath was removed and the mixed solution was further stirred for 3 hours. The reaction mixture was poured into 800 ml of water, and stirred for 1 hour. The under water-mixed solution was extracted three times with 500 ml of ethyl acetate using a separating funnel. The organic layer was washed with 500 ml of 1M hydrochloric acid, 500 ml of a saturated aqueous solution of sodium bicarbonate, and 500 ml of saturated brine, in the said order. To the organic layer, 100 g of magnesium sulfate was added for dehydration, and then the dried resultant was filtered. The solvent was distilled off under reduced pressure to obtain 300.1 g of a residue. The obtained residue was Compound (i-6) which was confirmed by $^1$H-NMR, IR, and mass spectrometry spectrum.

Synthesis Example 1

(1) Synthesis of Resin (I)

Specific Polymerizable Binder

To a 1,000 ml three-necked flask, 86 g of 1-methyl-2-pyrrolidone was charged, and heated to 90° C. under nitrogen flow. 86 g of 1-methyl-2-pyrrolidone solution containing 50 g of Compound (i-1), 35 g of Light Ester HO-MS (manufactured by Kyoeisha Chemical Co., Ltd.), 31 g of benzyl methacrylate, and 3.2 g of V-601 (manufactured by Wako Pure Chemical Industries, Ltd.) was added dropwisely over 2 hours. After the dropwise addition, the mixed solution was further stirred for 2 hours. The reaction solution was cooled to room temperature and then poured into 7 L of water to precipitate a polymer. The precipitated polymer was filtered, washed with water, and dried to obtain 110 g of polymer. The weight-average molecular weight of the obtained polymer was measured by Gel Permeation Chromatography (GPC) using polystyrene as a standard material, and the result obtained was 14,000. The acid value obtained by titration was 1.25 meq/g (calculated value: 1.31 meq/g), confirming that the polymerization was normally performed. To a 1,000 ml three-necked flask, 110 g of the obtained polymer and 0.1 g of p-methoxyphenol were charged, and 170 g of 1-methyl-2-pyrrolidone was cooled in an ice bath filled with ice water. When the mixed solution temperature reached 5° C. or below, 90 g of 1,8-diazabicyclo[5.4.0]-7-undecene (DBU) was added dropwisely through dripping funnel over 1 hour. After the dropwise addition, the ice bath was removed and the mixed solution was further stirred for 8 hours. To the reaction solution, concentrated hydrochloric acid was added to adjust the pH to 7, and then the solution was poured into 7 L of water, and the polymer: Resin (I) which is the specific polymerizable binder related to the invention is precipitated. The precipitated polymer was filtered, washed with water, and dried to obtain 95 g of polymer. When the obtained polymer was subjected to $^1$H-NMR measurement, it was confirmed that 100% of the side chain groups derived from Compound (i-1) was changed to an ethylene methacrylate group. The weight-average molecular weight was measured by Gel Permeation Chromatography (GPC) using polystyrene as a standard material, and the result obtained was 12,500. The acid value obtained by titration was 1.44 meq/g (calculated value: 1.50 meq/g).

Synthesis Example 2

(2) Synthesis of Resin (II)

Control Binder

To a 1,000 ml three-necked flask, 120 g of propylene glycol monomethyl ether was charged, and heated to 90° C. under nitrogen flow. Thereto, 120 g of propylene glycol monomethyl ether solution containing 74 g of benzyl methacrylate, 84 g of methacrylic acid, and V-601 (manufactured by Wako Pure Chemical Industries, Ltd.) was added dropwisely over 2 hours. After the dropwise addition, the mixed solution was further stirred for 2 hours. Thereafter, the reaction solution was cooled to room temperature, and then poured onto 8 L (liter; same applies below) of water to precipitate a polymer. The precipitated polymer was filtered, washed with water, and dried, to obtain 150 g of polymer.

The weight-average molecular weight of the obtained polymer was measured by Gel Permeation Chromatography (GPC) using polystyrene as a standard material, and the result obtained was 12,000. The acid value of this polymer obtained by titration was 202 mg KOH/g (calculated value: 204 mg KOH/g), confirming that the polymerization was normally performed.

As above, to a 1,000 ml three-necked flask charged with 40 g of the obtained polymer, 110 mg of p-methoxyphenol was charged, and further 60 g of propylene glycol monomethyl ether was added to be dissolved. Thereto, 820 mg of tetrabutylammonium bromide was further added, and heated to 80° C. 10 g of glycidyl methacrylate was added and the mixed solution was stirred for 6 hours. Then, it was confirmed by gas chromatography that a peak derived from glycidyl methacrylate was disappeared. This reaction solution was poured onto 7 L of water to precipitate a polymer (Dispersion Resin (I)-1). The precipitated polymer was filtered, washed with water, and dried to obtain 54 g of target Dispersion Resin (II).

The weight-average molecular weight of the obtained polymer (Dispersion Resin (TI)) was measured by Gel Permeation Chromatography (GPC) using polystyrene as a standard material, and the result obtained was 17,800. The acid value of this polymer obtained by titration was 120 mg KOH/g.

Example 1

A1. Preparation of Curable Composition

Here, examples of preparing a curable composition containing a pigment which is for forming a color filter applicable to liquid crystal display devices will be mentioned and explained.

(A1-1. Preparation of Pigment Dispersing Solution)

Preparation of Pigment Dispersing Solution

A mixed solution of 40 parts by mass of a 30/70 (mass ratio) mixture of C.I. Pigment Green 36 and C.I. Pigment Yellow 219 (primary particle diameter of 32 nm) as the pigment, 50 parts by mass (about 22.6 parts by mass in terms of solid content) of BYK 2001 (Disperbyk: manufactured by BYK-Chemie, concentration of solid content of 45.1 mass %) as the dispersing agent, 5 parts by mass of the specific polymerizable binder [Resin (I)] related to the invention, and 110 parts by mass of ethyl 3-ethoxypropionate as a solvent, was blended/dispersed for 15 hours using Bead Mill to prepare Pigment Dispersing Solution (P1).

With respect to the Pigment Dispersing Solution (P1), the average particle diameter of the pigment measured by dynamic light scattering (with the use of Microtrac Nanotrac UPA-EX 150 (manufactured by Nikkiso Co., Ltd) without further diluting P1) was 61 nm.

(A1-2. Preparation of Curable Composition (Coating Liquid))

| | |
|---|---|
| (C) Coloring Agent (aforementioned Pigment Dispersing Solution (P1)) | 600 parts by mass |
| (B) Photopolymerization Initiator (2,2'-bis(2-chlorophenyl)-4,4',5,5'-tetraphenyl-1,2'-biimidazole) | 30 parts by mass |
| (A) Pentaerythritol tetraacrylate | 50 parts by mass |
| Alkali-soluble resin (benzyl methacrylate/methacrylic acid/hydroxyethyl methacrylate copolymer, molar ratio: 80/10/10, Mw: 10,000: Other binder polymer) | 5 parts by mass |
| Solvent: PGMEA | 900 parts by mass |
| Substrate Adhesion Agent (3-methacryloxypropyl trimethoxysilane) | 1 part by mass |
| Sensitizer (Compound α below) | 15 parts by mass |
| Cosensitizing Agent (2-mercaptobenzoimidazole) | 15 parts by mass |

Compound α

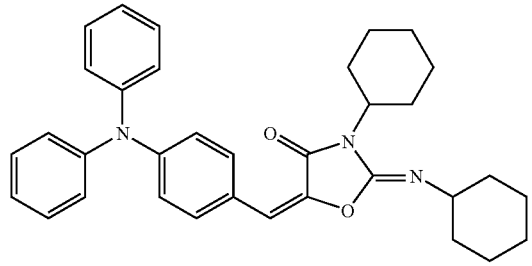

A2. Preparation of Color Filter (A2-1. Formation of Curable Composition Film)

The curable composition containing the above pigment was used as a resist solution to be slit coated on a glass substrate of 550 mm×650 mm under the conditions below, then left still in that state for 10 minutes, and vacuum dried and brought into pre-baking (100° C. for 80 sec), to form a curable composition-coated film (curable composition film).

| (Slit Coating Conditions) | |
|---|---|
| Gap of Opening of Coating head point: | 50 μm |
| Coating Speed: | 100 mm/sec |
| Clearance of Substrate and Coating Head: | 150 μm |
| Dry Film Thickness: | 1.75 μm |
| Coating Temperature: | 23° C. |

(A2-2. Exposure, Development)

Thereafter, the photocurable coated film was pattern exposed using a 2.5 kW extra-high pressure mercury lamp with a photo mask for a test having a line width of 20 μm, and after the exposure, a whole area of the coated film was soaked in a 10% aqueous solution of organic-based developer (trade name: CD, manufactured by Fuji film electronics material Co., Ltd.) and left for 60 seconds.

(A2-3. Heating Treatment)

After being left, the developer was washed off by showering with pure water, and the coated film subjected to photocuring treatment and development treatment was heated in an oven at 220° C. for 1 hour (post baking). Accordingly, a color filter formed from the coated film (colored film) of a curable composition on a glass substrate was obtained.

A3. Performance Evaluation

Storage stability of the coating liquid comprising the curable composition prepared in the above manner, exposure sensitivity of the curable composition coated film (colored film) formed on a glass substrate by applying the curable composition, substrate adhesion, developability, and pattern cross-sectional shape, were evaluated in the following manner. The results are shown in Table 1.

(A3-1. Storage Stability of Curable Composition)

The curable composition (coating liquid) prepared in the above manner was stored at room temperature for 1 month, and then viscosity of the liquid was measured. Evaluation was made in accordance with the following standard.
—Evaluation Standard—
A: no viscosity increase was recognized
B: viscosity increase by 5% to less than 10% was recognized
C: viscosity increase by 10% or more was recognized
(A3-2. Exposure Sensitivity of Curable Composition coated Film (Colored Film))

The curable composition coated film was exposed by varying the dose of irradiation within the range of 10 to 100 mJ/cm$^2$, and the dose of irradiation giving a pattern line width after the post-baking of 20 μm was evaluated as the exposure sensitivity. The smaller the value for exposure sensitivity the higher the sensitivity.
(A3-3. Developability, Pattern Cross-Sectional Shape, Substrate Adhesion)

The substrate surface and cross-sectional face after the post-baking were confirmed by light microscope and SEM photography observation, thereby evaluating the developability, pattern cross-sectional shape, and substrate adhesion. Details of evaluation method/evaluation standard are shown as below.
<Developability>

In the exposure step, presence of a residue on a light-unirradiated part (unexposed part) was observed, and the developability was evaluated.

—Evaluation Standard—
A: no residue was confirmed at all in an unexposed part
B: slight residue was confirmed in an unexposed part only by a degree of causing no practical problem
C: notable residue was confirmed in an unexposed part
<Pattern Cross-Sectional Shape>

A cross-sectional shape of the pattern formed was observed. The pattern cross-sectional shape is most preferably in a forward tapered shape, secondly preferably in a rectangular shape. An inverse tapered shape is not preferable.
<Substrate Adhesion>

Evaluation of the substrate adhesion was carried out by observing whether or not the patterning failure is generated. An evaluation standard is shown as below.
—Evaluation Standard—
A: patterning failure is not at all observed
B: patterning failure is hardly observed, but observed in some parts
C: patterning failure is notably observed Examples 2 to 7

Color filters were prepared in the same manner as in Example 1, except that Resin (I) for the curable composition prepared in Example 1 was replaced by the specific polymerizable binder described in Table 1 below. The same evaluations as in Example 1 were carried out, and the results are shown in Table 1.

Comparative Example 1

A color filter was prepared in the same manner as in Example 1, except that Resin (I) for the curable composition prepared in Example 1 was not used. The same evaluations as in Example 1 were carried out, and the results are shown in Table 1.

Comparative Example 2

A color filter was prepared in the same manner as in Example 1, except that Resin (I) for the curable composition prepared in Example 1 was replaced by Resin (II) obtained in Synthesis Example 2 as the comparative binder polymer. The same evaluations as in Example 1 were carried out, and the results are shown in Table 1.

TABLE 1

|  | Specific polymerizable binder or comparative binder | Storage stability | Exposure sensitivity (mJ/cm$^2$) | Developability | Substrate adhesion | Pattern Cross-sectional shape |
|---|---|---|---|---|---|---|
| Example 1 | Resin (I) | A | 30 | A | A | Forward taper |
| Example 2 | Exemplified compound (1) | A | 30 | A | A | Forward taper |
| Example 3 | Exemplified compound (5) | A | 35 | A | A | Forward taper |
| Example 4 | Exemplified compound (10) | A | 45 | A | B | Forward taper |
| Example 5 | Exemplified compound (11) | A | 60 | A | A | Forward taper |
| Example 6 | Exemplified compound (16) | A | 40 | A | A | Forward taper |
| Example 7 | Exemplified compound (17) | A | 55 | A | A | Forward taper |
| Comparative example 1 | none | B | 75 | C | C | Reverse taper |
| Comparative example 2 | Resin (II) | B | 120 | B | B | Reverse taper |

From the results in Table 1, it is clear that the curable compositions of Examples 1 to 7 each containing the specific polymerizable binder exhibit excellent storage stability in a solution state thereof. In addition, it was realized that when colored patterns were formed on a support using this curable composition, a color filter exhibiting high exposure sensitivity, excellent developability, as well as both the excellent substrate adhesion and pattern cross-sectional shape, can be obtained as compared to cases of Comparative Example 1 where the specific polymerizable binder was not used and Comparative Example 2 where Resin (II) was used as the comparative binder.

Example 8

Hereinbelow, examples of preparing a curable composition containing a coloring agent (pigment) which is for forming a color filter applicable to solid-state image pickup devices will be mentioned and explained.

B1. Preparation of Resist Solution

Following compounds of formulation were mixed and dissolved to prepare a resist solution.

| <Formulation of Resist Solution> | |
|---|---|
| Propylene glycol monomethyl ether acetate (PGMEA: solvent) | 19.20 parts by mass |
| Ethyl lactate | 36.67 parts by mass |
| (E) Resin (40% PGMEA solution of benzyl methacrylate/methacrylic acid/methacrylic acid-2-hydroxyethyl copolymer (molar ratio = 60/22/18)) | 30.51 parts by mass |
| (C) Ethylenically unsaturated double bond-containing Compound (dipentaerythritol hexaacrylate) | 12.20 parts by mass |
| Polymerization Inhibitor (p-methoxyphenol) | 0.0061 parts by mass |
| Fluorine-based Surfactant (F-475, manufactured by Dainippon Ink & Chemicals, Inc.) | 0.83 parts by mass |
| (B) Photopolymerization Initiator (trihalomethyltriazine-based photopolymerization initiator) (TAZ-107, manufactured by Midori Kagaku Co., Ltd.) | 0.586 parts by mass |

B2. Preparation of Silicon Substrate with Undercoat Layer

A silicon wafer of 6 inch was heated in an oven at 200° C. for 30 minutes. Next, the resist solution was applied on this silicon wafer to give a dry film thickness of 1.5 μm, which was then dried by further heating in an oven at 220° C. for 1 hour to form an undercoat layer, accordingly a silicon wafer substrate provided with an undercoat layer was obtained.

B3. Preparation of Pigment Dispersing Solution

A mixed solution of 40 parts by mass of a 30/70 (mass ratio) mixture of C.I. Pigment Green 36 and C.I. Pigment Yellow 219 (primary particle diameter of 32 nm) as the pigment, 50 parts by mass (about 22.6 parts by mass in terms of solid content) of BYK 2001 (Disperbyk: manufactured by BYK-Chemie, concentration of solid content of 45.1 mass %) as the dispersing agent, 5 parts by mass of Resin (I) which is the specific polymerizable binder related to the invention, and 110 parts by mass of ethyl 3-ethoxypropionate as a solvent, was blended/dispersed for 15 hours using Bead Mill to prepare Pigment Dispersing Solution (P1).

With respect to the Pigment Dispersing Solution (P1), the average particle diameter of the pigment measured by dynamic light scattering was 200 nm.

B4. Preparation of Curable Composition (Coating Liquid)

The curable composition liquid was prepared by mixing with stirring to give the following formulation with the use of dispersion-treated Pigment Dispersing Solution P1.

| (Curable Composition Solution) | |
|---|---|
| (C) Coloring Agent (Pigment Dispersing Solution (P1)) | 600 parts by mass |
| (B) Photopolymerization Initiator (oxime-based photopolymerization initiator) (CGI-124, manufactured by CIBA Speciality Chemicals) | 30 parts by mass |
| (A) TO-1382 (manufactured by TOAGOSEI Co., Ltd.) | 25 parts by mass |
| (A) dipentaerythritol hexaacrylate | 30 parts by mass |
| Solvent (PGMEA) | 900 parts by mass |
| Substrate Adhesive Agent (3-methacryloxypropyl trimethoxysilane) | 1 part by mass |

B5. Preparation and Evaluation of Color Filter from Curable Composition

Pattern Formation and Sensitivity Evaluation

The curable composition prepared in the above manner was applied onto the undercoat layer of the silicon wafer provided with an undercoat layer which is obtained in B2, to form a colored film (coated film). The colored film was heated at 100° C. using a hot plate for 120 seconds (pre-baking) to give a dry film thickness of the coated film of 0.7 μm.

Then, the colored film was exposed to a 365 nm-wavelength light through a mask with a 2 μm square island pattern at various exposure doses of 50 to 1,200 mJ/cm$^2$ by an i-ray stepper exposure apparatus FPA-3000i5+ (manufactured by Canon Inc.).

Thereafter, the silicon wafer substrate with the irradiated coated film was placed on a horizontal turntable of a spin shower developer (DW-30, manufactured by Chemitronics Co., Ltd.), and was paddle-developed at 23° C., for 60 seconds by using CD-2000 (manufactured by Fuji film electronics material Co., Ltd.), to form a colored pattern on the silicon wafer substrate.

The silicon wafer having the colored pattern formed thereon was set to the horizontal turntable by vacuum chuck. While the silicon wafer substrate was rotated at 50 r.p.m. by a rotating apparatus, the substrate was rinsed by showering with pure water from a spout nozzle located above the rotation center. The silicon wafer substrate was then spray-dried.

The size of the colored pattern was measured by using a length measuring SEM 'S-9260A' (manufactured by Hitachi High-Technologies Corporation). The dose of irradiation giving a pattern line width of 2 μm was evaluated as the exposure sensitivity. The smaller the value for exposure sensitivity the higher the sensitivity. The measurement results are shown in Table 2 below.

Further, upon forming the colored patterns, developability, pattern formability, substrate adhesion, and storage stability of the curable composition were evaluated in the same manner as in Example 1. The color irregularity of colored patterns formed was also evaluated in accordance with the standard below. The results are shown in Table 2 below.

<Storage Stability of Curable Composition>

The curable composition (coating liquid) prepared in above B4 was stored at room temperature for 1 month, and then viscosity of the liquid was measured. Evaluation was made in accordance with the following standard.

—Evaluation Standard—
A: no viscosity increase was recognized
B: viscosity increase by 5% to less than 10% was recognized
C: viscosity increase by 10% or more was recognized <Color Irregularity>

For evaluating the color irregularity, the luminance distribution after the pattern formation was measured and the proportion of pixels showing less than +5% difference from its average in total pixels was determined. The evaluation standard is shown as below.

—Evaluation Standard—

A: pixel showing less than +5% difference from its average is 99% or more of the number of total pixels B: pixel showing less than +5% difference from its average is 95 to less than 99% of the number of total pixels C: pixel showing less than +5% difference from its average is less than 95% of the number of total pixels Examples 9 to 14

All color filters were prepared in the same manner as in Example 1, except that Resin (I) for the curable composition prepared in Example 8 was replaced by the specific polymerizable binder described in Table 2 below. The same evaluations as in Example 1 were carried out, and the results are shown in Table 2.

Comparative Example 3

A color filter was prepared in the same manner as in Example 7, except that the specific polymerizable binder was not used for the curable composition prepared in Example 8. The same evaluations as in Example 1 were carried out, and the results are shown in Table 2.

Comparative Example 4

A color filter was prepared in the same manner as in Example 7, except that Resin (I) for the curable composition prepared in Example 8 was replaced by Resin (II) obtained in Synthesis Example 2 as the comparative binder polymer. The same evaluations as in Example 1 were carried out, and the results are shown in Table 2.

From these results, it is clearly understood that excellent pattern formability can be also realized in the case of preparing a color filter applicable to solid-state image pickup devices as in the case of preparing a color filter applicable to liquid crystal display devices, by the curable composition of the invention.

Example 15

Hereinbelow, examples of preparing a curable composition containing a dye which is for forming a color filter applicable to solid-state image pickup devices will be mentioned and explained.

C1. Preparation of Resist Solution and Preparation of Silicon Substrate with Undercoat Layer The silicon substrate with an undercoat layer was prepared in the same manner as in [B1. Preparation of Resist Solution] and [B2. Preparation of Silicon Substrate with undercoat layer] sections of Example 11.

C2. Preparation of Curable Composition (Coating Liquid)

Following compounds of formulation were mixed and dissolved to prepare a color sensitive resin composition.

| | |
|---|---|
| Cyclohexanone (Solvent) | 80 parts by mass |
| (C) Valifast Yellow 1101 (Dye) | 6.0 parts by mass |
| (C) Acid Red 57 (Dye) | 6.0 parts by mass |
| (A) dipentaerythritol hexaacrylate | 2.5 parts by mass |
| (B) oxime-based photopolymerization initiator (CGI-124, manufactured by CIBA Speciality Chemicals) | 2.0 parts by mass |

TABLE 2

| | Specific polymerizable binder or comparative binder | Storage stability | Exposure sensitivity (mJ/cm$^2$) | Developability | Substrate adhesion | Pattern Cross-sectional shape | Color Irregularities |
|---|---|---|---|---|---|---|---|
| Example 8 | Resin (I) | A | 200 | A | A | Rectangle | A |
| Example 9 | Exemplified compound (1) | A | 200 | A | A | Rectangle | A |
| Example 10 | Exemplified compound (3) | A | 250 | A | A | Rectangle | A |
| Example 11 | Exemplified compound (6) | A | 250 | A | B | Rectangle | A |
| Example 12 | Exemplified compound (12) | A | 200 | A | A | Rectangle | A |
| Example 13 | Exemplified compound (13) | A | 300 | A | A | Rectangle | A |
| Example 14 | Exemplified compound (14) | A | 350 | A | A | Rectangle | A |
| Comparative example 3 | none | B | 450 | C | C | Reverse taper | C |
| Comparative example 4 | Resin (II) | B | 500 | B | B | Reverse taper | C |

From the results in Table 2, it is clear that the curable compositions (pigment-based) of Examples 8 to 14 each containing the specific polymerizable binder which are used for forming color filters applicable to solid-state image pickup devices exhibit excellent storage stability in a solution state thereof. In addition, it was realized that when colored patterns were formed on a support using this curable composition, a color filter exhibiting high exposure sensitivity, excellent developability, as well as both the excellent substrate adhesion and pattern cross-sectional shape, with no problem in color irregularity, can be obtained as compared to cases of Comparative Example 3 where the specific polymerizable binder was not used and Comparative Example 4 where Resin (II) was used as the comparative binder.

-continued

| | |
|---|---|
| (D) Specific polymerizable binder related to the invention: Resin (I) | 1.5 parts by mass |

C3. Preparation and Evaluation of Color Filter from Curable Composition

Preparation and evaluation of the color filter were carried out in the same manner as in [B5. Preparation and Evaluation of Color Filter from Curable Composition] section above. The results are shown in Table 3.

Examples 16 to 21

All color filters were prepared in the same manner as in Example 8, except that Resin (I) for the curable composition prepared in Example 15 was replaced by the specific polymerizable binder described in Table 2 below. The same evaluations as in Example 1 were carried out, and the results are shown in Table 3.

Comparative Example 5

A color filter was prepared in the same manner as in Example 15, except that Resin (I) for the curable composition prepared in Example 15 was replaced by pentaerythritol triacrylate. The same evaluations as in Example 8 were carried out, and the results are shown in Table 3.

Comparative Example 6

A color filter was prepared in the same manner as in Example 15, except that Resin (I) for the curable composition prepared in Example 15 was replaced by Resin (II) obtained in Synthesis Example 2 as the comparative binder polymer. The same evaluations as in Example 8 were carried out, and the results are shown in Table 3.

TABLE 3

| | Specific polymerizable binder or comparative binder | Storage stability | Exposure sensitivity (mJ/cm$^2$) | Developability | Substrate adhesion | Pattern Cross-sectional shape | Color Irregularities |
|---|---|---|---|---|---|---|---|
| Example 15 | Resin (I) | A | 600 | A | A | Rectangle | A |
| Example 16 | Exemplified compound (1) | A | 550 | A | A | Rectangle | A |
| Example 17 | Exemplified compound (2) | A | 650 | A | A | Rectangle | A |
| Example 18 | Exemplified compound (4) | A | 700 | A | B | Rectangle | A |
| Example 19 | Exemplified compound (7) | A | 600 | A | A | Rectangle | A |
| Example 20 | Exemplified compound (8) | A | 550 | A | A | Rectangle | A |
| Example 21 | Exemplified compound (15) | A | 750 | A | A | Rectangle | A |
| Comparative example 5 | Pentaerythritol acrylate | A | 900 | C | C | Reverse taper | C |
| Comparative example 6 | Resin (II) | B | 800 | B | B | Reverse taper | C |

From the results in Table 3, it is clear that the curable compositions (dye-based) of Examples 15 to 21 each containing the specific polymerizable binder which are used for forming color filters applicable to solid-state image pickup devices exhibit excellent storage stability in a solution state thereof. In addition, it was realized that when colored patterns were formed on a support using this curable composition, a color filter exhibiting high exposure sensitivity, excellent developability, as well as both the excellent substrate adhesion and pattern cross-sectional shape, can be obtained as compared to cases of Comparative Example 5 where pentaerythritol triacrylate was used as the comparative binder instead of the specific polymerizable binder and Comparative Example 6 where Comparative Resin (II) was used.

From these results, it is clearly understood that excellent pattern formability can be also realized in the case of preparing a color filter applicable to solid-state image pickup devices as in the case of preparing a color filter applicable to liquid crystal display devices, by any of the curable compositions of Examples 15 to 21.

Some of the preferred embodiments of the invention will be shown below.

<1> A curable composition for a color filter comprising a polymerizable compound (A), a photopolymerization initiator (B), a coloring agent (C), and a binder resin (D) having an acid group and an unsaturated double bond;

wherein the amount of the coloring agent (C) in the curable composition is in the range of 30 to 85 mass %, and the acid group of the binder resin (D) having an acid group and an unsaturated double bond is linked on a main chain via a linking group with a main backbone of two or more atoms, and the unsaturated double bond of the binder resin is on a side chain.

<2> The curable composition for a color filter according to <1>, wherein the binder resin (D) having an acid group and an unsaturated double bond is a copolymer that includes a monomer comprising an acid group, and a monomer comprising an unsaturated double bond, and wherein the monomer comprising a double bond is represented by Formula (1), (2), or (3):

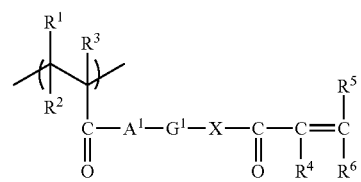

Formula (1)

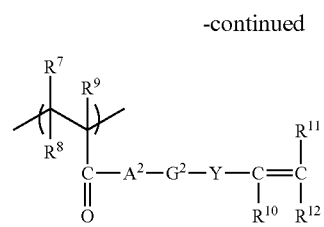

Formula (2)

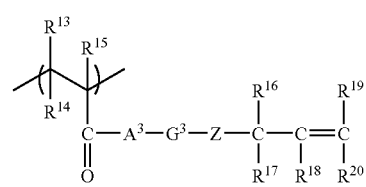

Formula (3)

wherein in Formulas (1)-(3), $A^1$, $A^2$, and $A^3$ are each independently an oxygen atom, a sulfur atom, or —N($R^{21}$)— while $R^{21}$ is an optionally substituted alkyl group; $G^1$, $G^2$, and $G^3$ are each independently a divalent organic group; X and Z are each independently an oxygen atom, a sulfur atom, or —N($R^{22}$)— while $R^{22}$ is an optionally substituted alkyl group; Y is an oxygen atom, a sulfur atom, an optionally substituted phenylene group, or —N($R^{23}$)— while $R^{23}$ is an optionally substituted alkyl group; and $R^1$ to $R^{20}$ are each independently a monovalent organic group.

<3> The curable composition for a color filter according to <1>, wherein the binder resin (D) having an acid group and an unsaturated double bond can be obtained by one of the following synthesis methods (a) or (b):

(a) a method which includes using a base group to remove a proton from a polymer including a compound represented by Formula (4-1) as the copolymer component, thereby eliminating L, so as to obtain a polymer having a structure represented by Formula (1), wherein L in Formula (4-1) is an anionic releasing group; or (b) a method which includes subjecting a polymer including a compound represented by Formula (4-2) as the copolymer component to a base treatment to cause a releasing reaction in a specific functional group, removing $X^1$ and $Z^1$ in the formula, and forming a radically reactable group, so as to obtain a polymer having the structure represented by Formula (1),

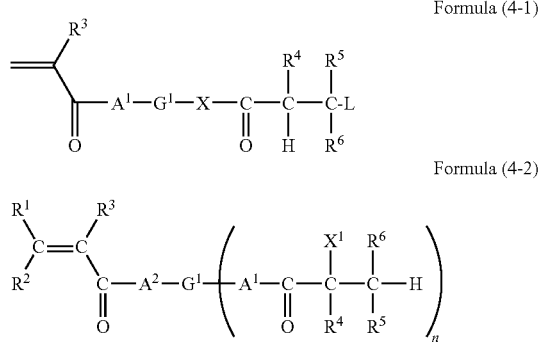

Formula (4-1)

Formula (4-2)

wherein in Formula (4-1), L is an anionic releasing group; and $R^3$ to $R^6$, $A^1$, $G^1$, and X have the same meanings as defined in Formula (1), and wherein in Formula (4-2), $R^1$, $R^2$, and $R^3$ are each hydrogen or a monovalent organic group; $A^2$ is an oxygen atom, a sulfur atom, or —$NR^8$—; $G^1$ is an organic linking group; $R^8$ is hydrogen or a monovalent organic group; n is an integer of 1 to 10; $R^4$ to $R^6$, $A^1$, and $G^1$ have the same meanings as defined in the Formula (1); and $X^1$ is a releasing group which can be removed by the releasing reaction.

<4> The curable composition for a color filter described in <1>, further comprising a sensitizer.

<5> The curable composition for a color filter according to <1>, wherein the amount of coloring material in the curable composition is 40 mass % or more.

<6> A color filter having colored patterns, which is formed from the curable composition for a color filter described in <1>.

<7> The color filter according to <6>, used in an image sensor.

<8> A manufacturing method for a color filter comprising:

forming a colored film formed from the curable composition for a color filter according to <1>, by applying the curable composition onto a support;

exposing the colored film through a mask; and developing the exposed colored film to form colored patterns.

The disclosure of Japanese Patent Application No. 2006-356376 is incorporated herein by reference in its entirety.

The invention claimed is:

1. A curable composition for a color filter comprising a polymerizable compound (A), a photopolymerization initiator (B), a coloring agent (C), and a binder resin (D) having an acid group and an unsaturated double bond, wherein:

the amount of the coloring agent (C) in the curable composition is in the range of from 30 to 85 mass %, and the acid group of the binder resin (D) having an acid group and an unsaturated double bond is linked on a main chain via a linking group with a main backbone of two or more atoms, and the unsaturated double bond of the binder resin is on a side chain, the main chain including at least one recurring unit selected from the group consisting of structures represented by the following (A) and (B):

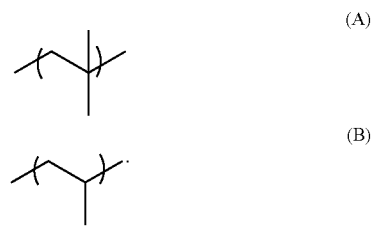

(A)

(B)

2. The curable composition for a color filter according to claim 1, wherein the binder resin (D) having an acid group and an unsaturated double bond is a copolymer that includes a monomer comprising an acid group, and a monomer comprising an unsaturated double bond, and wherein the monomer comprising a double bond is represented by Formula (1), (2), or (3):

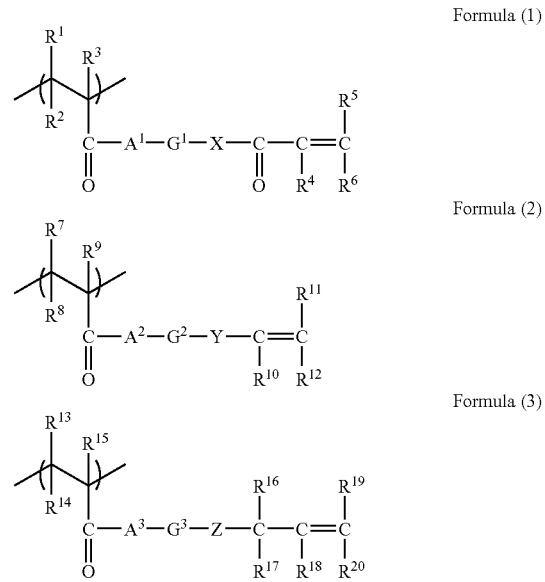

Formula (1)

Formula (2)

Formula (3)

wherein in Formulas (1)-(3), $A^1$, $A^2$, and $A^3$ are each independently an oxygen atom, a sulfur atom, or —$N(R^{21})$— while $R^{21}$ is an optionally substituted alkyl group; $G^1$, $G^2$, and $G^3$ are each independently a divalent organic group; X and Z are each independently an oxygen atom, a sulfur atom, or —$N(R^{22})$— while $R^{22}$ is an optionally substituted alkyl group; Y is an oxygen atom, a sulfur atom, an optionally substituted phenylene group, or —N($R^{23}$)— while $R^{23}$ is an optionally substituted alkyl group; and $R^1$ to $R^{20}$ are each independently a monovalent organic group.

3. The curable composition for a color filter according to claim 2, wherein the binder resin (D) having an acid group and an unsaturated double bond can be obtained by one of the following synthesis methods (a) or (b):

(a) a method which includes using a base group to remove a proton from a polymer including a compound represented by the following Formula (4-1) as the copolymer component, thereby eliminating L, so as to obtain a polymer having a structure represented by Formula (1), wherein L in Formula (4-1) is an anionic releasing group; or (b) a method which includes subjecting a polymer including a compound represented by the following Formula (4-2) as the copolymer component to a base treatment to cause a releasing reaction in a specific functional group, removing $X^1$ in the formula, and forming a radically reactable group, so as to obtain a polymer having the structure represented by Formula (1),

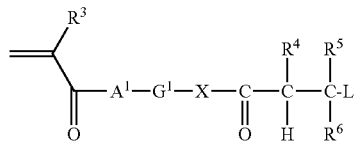

Formula (4-1)

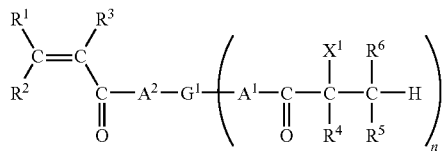

Formula (4-2)

wherein in Formula (4-1), L is an anionic releasing group; and $R^3$ to $R^6$, $A^1$, $G^1$, and X have the same meanings as defined in Formula (1), and wherein in Formula (4-2), $R^1$, $R^2$, and $R^3$ are each hydrogen or a monovalent organic group; $A^2$ is an oxygen atom, a sulfur atom, or —$NR^8$—; $R^8$ is hydrogen or a monovalent organic group; n is an integer of 1 to 10; $R^4$ to $R^6$, $A^1$, and $G^1$ have the same meanings as defined in the Formula (1); and $X^1$ is a releasing group which can be removed by the releasing reaction.

4. The curable composition for a color filter according to claim 1, further comprising a sensitizer.

5. The curable composition for a color filter according to claim 1, wherein the amount of coloring material in the curable composition is 40 mass % or more.

6. A color filter having colored patterns, formed from the curable composition for a color filter according to claim 1.

7. The color filter according to claim 6, used in an image sensor.

8. A manufacturing method for a color filter comprising:
forming a colored film from the curable composition for a color filter according to claim 1, by applying the curable composition onto a support;
exposing the colored film through a mask; and
developing the exposed colored film to form colored patterns.

9. The curable composition for color filter according to claim 1, wherein the photopolymerization initiator (B) is at least one compound selected from the group consisting of a triazine-based compound and an oxime-based compound.

* * * * *